United States Patent
Keisling et al.

(10) Patent No.: US 8,254,124 B2
(45) Date of Patent: Aug. 28, 2012

(54) SPACE-SAVING HIGH-DENSITY MODULAR DATA POD SYSTEMS AND ENERGY-EFFICIENT COOLING SYSTEMS

(75) Inventors: Earl Keisling, Ridgefield, CT (US); John Costakis, Hyde Park, NY (US); Gerald McDonnell, Poughquag, NY (US)

(73) Assignee: IETIP LLC, Danbury, CT (US)

( * ) Notice: Subject to any disclaimer, the term of this patent is extended or adjusted under 35 U.S.C. 154(b) by 0 days.

(21) Appl. No.: 13/338,987

(22) Filed: Dec. 28, 2011

(65) Prior Publication Data
US 2012/0127657 A1 May 24, 2012

Related U.S. Application Data

(63) Continuation-in-part of application No. PCT/US2011/041710, filed on Jun. 23, 2011.

(60) Provisional application No. 61/357,851, filed on Jun. 23, 2010, provisional application No. 61/414,279, filed on Nov. 16, 2010, provisional application No. 61/448,631, filed on Mar. 2, 2011, provisional application No. 61/482,070, filed on May 3, 2011.

(51) Int. Cl.
*H05K 7/20* (2006.01)

(52) U.S. Cl. ........ 361/699; 361/696; 361/700; 361/701; 62/259.1; 62/259.2; 165/104.33

(58) Field of Classification Search .................. None
See application file for complete search history.

(56) References Cited

U.S. PATENT DOCUMENTS

| | | | |
|---|---|---|---|
| 6,819,563 B1 | 11/2004 | Chu et al. | |
| 6,927,980 B2 | 8/2005 | Fukuda et al. | |
| 7,184,267 B2 | 2/2007 | Patel | |
| 7,255,640 B2 | 8/2007 | Aldag et al. | |
| 7,278,273 B1 | 10/2007 | Whitted et al. | |
| 7,430,118 B1 | 9/2008 | Noteboom et al. | |
| 7,511,959 B2 * | 3/2009 | Belady et al. | 361/701 |

(Continued)

FOREIGN PATENT DOCUMENTS

DE     20 2004 003 309     9/2004

(Continued)

OTHER PUBLICATIONS

PCT International Search Report for International Application No. PCT/US/2011/043893 dated Feb. 17, 2012. (3 pages).

(Continued)

*Primary Examiner* — Boris Chervinsky
(74) *Attorney, Agent, or Firm* — Carter, DeLuca, Farrell & Schmdt, LLP

(57) ABSTRACT

A space-saving, high-density modular data center and an energy-efficient cooling system for a modular data center are disclosed. The modular data center includes a first cooling circuit including a primary cooling device and a plurality of modular data pods. Each modular data pod includes a plurality of servers, a heat exchange member coupled to the first cooling circuit and a second cooling circuit coupled to the heat exchange member and configured to cool the plurality of servers, the second cooling circuit including a secondary cooling device configured to cool fluid flowing through the second cooling circuit. Each modular data pod also includes an auxiliary enclosure containing at least a portion of a distributed mechanical cooling system, which is configured to trim the cooling performed by a central free-cooling system.

20 Claims, 33 Drawing Sheets

U.S. PATENT DOCUMENTS

| | | | |
|---|---|---|---|
| 7,660,116 B2 | 2/2010 | Claassen et al. | |
| 7,679,909 B2 | 3/2010 | Spearing et al. | |
| 7,724,516 B2 | 5/2010 | Harder et al. | |
| 7,724,518 B1 | 5/2010 | Carlson et al. | |
| 7,746,634 B2 | 6/2010 | Hom et al. | |
| 7,746,637 B2 | 6/2010 | Donowho et al. | |
| 7,836,597 B2 | 11/2010 | Datta et al. | |
| 7,856,838 B2 | 12/2010 | Hillis et al. | |
| 7,864,527 B1 | 1/2011 | Whitted | |
| 7,872,865 B2 | 1/2011 | Matsushima et al. | |
| 7,957,142 B2 * | 6/2011 | Noteboom et al. | 361/696 |
| 8,004,839 B2 * | 8/2011 | Sato et al. | 361/696 |
| 8,006,496 B2 | 8/2011 | Carter | |
| 8,077,457 B2 * | 12/2011 | Gauthier et al. | 361/690 |
| 8,113,010 B2 * | 2/2012 | Carlson | 62/259.2 |
| 8,120,916 B2 * | 2/2012 | Schmidt et al. | 361/700 |
| 2004/0190270 A1 | 9/2004 | Aldag et al. | |
| 2004/0226686 A1 | 11/2004 | Maeda | |
| 2006/0000596 A1 | 1/2006 | Kranz et al. | |
| 2007/0167125 A1 | 7/2007 | Rasmussen et al. | |
| 2007/0283710 A1* | 12/2007 | Gilbert et al. | 62/259.2 |
| 2008/0024997 A1 | 1/2008 | Ghantiwala | |
| 2008/0055848 A1 | 3/2008 | Hamburgen et al. | |
| 2008/0094797 A1 | 4/2008 | Coglitore et al. | |
| 2008/0123288 A1 | 5/2008 | Hillis | |
| 2008/0291626 A1 | 11/2008 | Nelson et al. | |
| 2009/0133866 A1 | 5/2009 | Campbell et al. | |
| 2009/0207880 A1 | 8/2009 | Ahladas et al. | |
| 2010/0077788 A1 | 4/2010 | Lewis | |
| 2010/0144265 A1 | 6/2010 | Bednarcik et al. | |
| 2011/0154842 A1* | 6/2011 | Heydari et al. | 62/259.2 |

FOREIGN PATENT DOCUMENTS

| | | |
|---|---|---|
| DE | 20 2004 003 310 | 9/2004 |
| GB | 2 444 981 | 6/2008 |
| WO | WO 99/63797 | 12/1999 |
| WO | WO 2009/114103 | 9/2009 |
| WO | WO 2009/156647 | 12/2009 |
| WO | WO 2010/087915 | 8/2010 |
| WO | WO 2010/141205 | 12/2010 |

OTHER PUBLICATIONS

PCT International Search Report for International Application No. PCT/US2011/041710 dated Feb. 24, 2012. (10 pages).

Sylvain Quoilin and Vincent Lemort, "Technological and Economical Survey of Organic Rankine Cycle Systems", symposium paper, Thermodynamics Laboratory, University of Liège—5$^{th}$ European Conference Economics and Management of Energy in Industry—Algarve, Portugal Centro de Energia e Tecnologia; Apr. 14-17, 2009, pp. 1-12.

Coolcentric "Products-Coolcentric Coolant Distribution Units", pp. 1-2, website, http://www.coolcentric.com/products/coolant-distribution_units.php, Feb. 22, 2012.

Coolcentric "Products-Technology Overview", pp. 1-2, website, http://www.coolcentric.com/priducts/technology.php, Feb. 22, 2012.

* cited by examiner

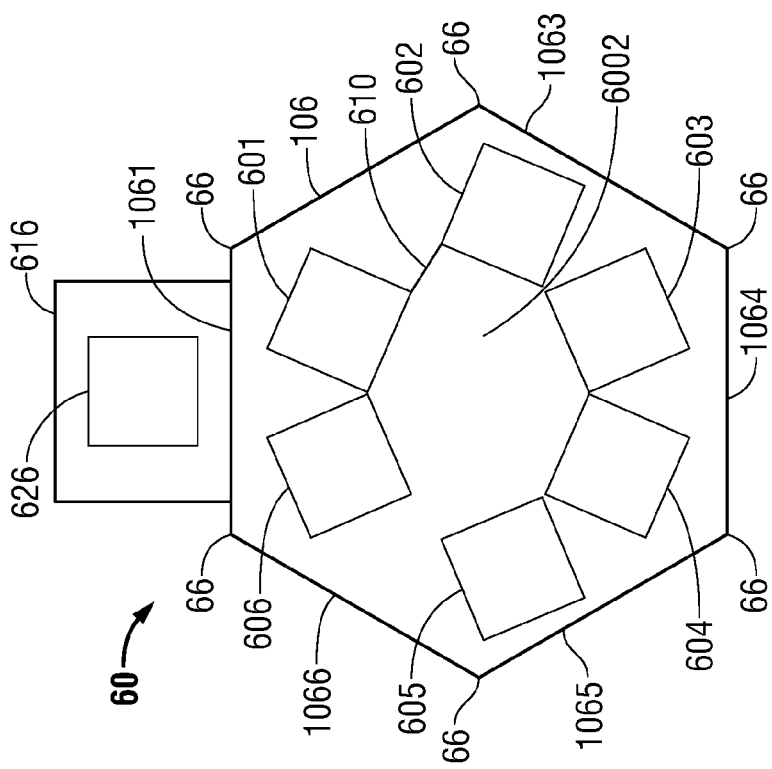
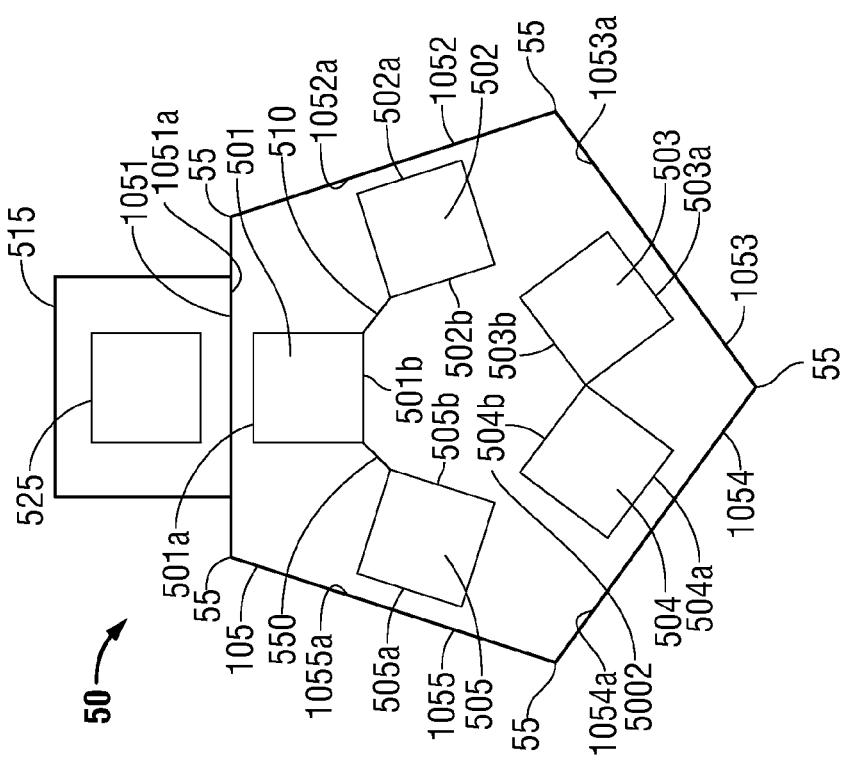
FIG. 2B
FIG. 2A

DETAIL 8A

SPACE-SAVING HIGH-DENSITY MODULAR DATA POD SYSTEMS AND ENERGY-EFFICIENT COOLING SYSTEMS

CROSS-REFERENCE TO RELATED APPLICATIONS

This application is a continuation-in-part of international application no. PCT/US2011/41710, which was filed on Jun. 23, 2011, now WO 2011/163532 A2, published on Dec. 29, 2011, and claims the benefit of, and priority to, U.S. Provisional Application Ser. No. 61/357,851, which was filed on Jun. 23, 2010; U.S. Provisional Application Ser. No. 61/414,279, which was filed on Nov. 16, 2010; U.S. Provisional Application Ser. No. 61/448,631, which was filed on Mar. 2, 2011; and U.S. Provisional Application Ser. No. 61/482,070, which was filed on May 3, 2011, the entire contents of each of which are hereby incorporated by reference herein.

BACKGROUND

1. Technical Field

The present disclosure generally relates to computing data centers. More particularly, the present disclosure relates to space-saving high-density modular data pod systems and energy-efficient cooling systems for modular data pod systems.

2. Background of Related Art

Traditionally, large data centers rely on large, oversized cooling infrastructures, including chilled water systems, chiller plants, and direct expansion cooling systems, to maintain their operating temperatures. There are many problems associated with the large, oversized cooling infrastructures for large data centers, including high initial capital, operation, and maintenance costs. For instance, a traditional chiller plant may require approximately 280 tons of chiller capacity to support a large data center having a power consumption capacity of 1 MW. Further, the traditional chiller plant is typically designed to cool the entire data center, as opposed to a few selected areas within the data center. As a result, the traditional chiller plant spends a considerable amount of energy on areas that do not need to be cooled. Further, one of the design constraints used to implement the traditional chiller plant is the power consumption capacity of the entire data center. For that reason, if the data center does not run at its power consumption capacity due to load fluctuations, the efficiency of the traditional chiller plant drops significantly.

Several cooling systems exist in the market having a more modular design than the traditional large, oversized cooling infrastructures that allow them to cool selected areas of a large data center at a reduced cost. For instance, an air-cooled "free cooling" system (also referred to as a straight air-cooled system) uses ambient air as a medium to cool server racks or containers of server racks in a large data center. However, one of the drawbacks of the air-cooled "free cooling" system is that it operates only in a cool, dry-climate environment thereby restricting its use to limited geographical areas in the world.

An adiabatic-assisted system is another cooling system that rivals the traditional large, oversized cooling electrical infrastructures. The adiabatic-assisted system is a cooling system assisted by adiabatic water having a more expanded geographical reach than the air-cooled "free cooling" system. However, the adiabatic-assisted system has certain cooling tolerance limitations and is incapable of providing sufficient cooling to high density data centers, e.g., data centers having IT rack loads of about 40 kW per IT rack.

SUMMARY

The embodiments of the modular data pod systems and associated cooling systems of the present disclosure provide significant improvements and advantages over traditional data centers and their cooling systems including (1) a lower cost per kilowatt (kW) to build, deploy, and operate a data center, (2) faster deployment than stick-built construction, (3) more easily restacked and redeployed to allow the data center to keep up with new technological advances in server technology, (4) expandability, (5) compatibility with very high efficiency systems to gain the highest power use efficiency (PUE) factor, (6) space saving and efficient in their space requirements allowing for higher density capabilities (i.e., more kilowatts per square foot), (7) scalability, (8) efficiency in mechanical cooling, (9) multi-use characteristics for single deployment, large indoor warehousing, or large outdoor applications, such as data center farms, (10) energy efficiency in the containment of hot and cold aisles, (11) flexibility in their use of different types of cooling systems, and (12) capability of being modified to meet data center tier requirements for redundancy.

In one aspect, the present disclosure features a modular data center. The modular data center includes a first cooling circuit including a primary cooling device. The modular data center includes a plurality of modular data pods. Each modular data pod includes a plurality of servers, a heat exchange member coupled to the first cooling circuit, and a second cooling circuit coupled to the heat exchange member and configured to cool the plurality of servers. The second cooling circuit includes a secondary cooling device configured to cool fluid flowing through the second cooling circuit.

In another aspect, the present disclosure relates to a cooling system for a modular data center. The modular data center includes a first cooling circuit including a primary cooling device; a plurality of modular data pods, each modular data pod including an enclosure that includes a plurality of server racks, a heat exchange member coupled to the first cooling circuit, and a second cooling circuit coupled to the heat exchange member and configured to cool the enclosure. The second cooling circuit includes a secondary cooling device configured to cool fluid flowing through the second cooling circuit.

In yet another aspect, the present disclosure features a modular data center. The modular data center includes a central cooling system. The modular data center includes a plurality of modular data pods. Each modular data pod includes a plurality of servers, a heat exchange assembly coupled to the central cooling system in which the heat exchange assembly configured to cool the plurality of servers, and a distributed cooling system coupled to the heat exchange assembly.

BRIEF DESCRIPTION OF THE DRAWINGS

Various embodiments of the present disclosure are described with reference to the accompanying drawings wherein:

FIG. 2A is an illustration of a modular data pod having a pentagonal wall configuration according to one embodiment of the present disclosure;

FIG. 2B is an illustration of a modular data pod having a hexagonal wall configuration according to another embodiment of the present disclosure;

DETAILED DESCRIPTION

Figure 1:
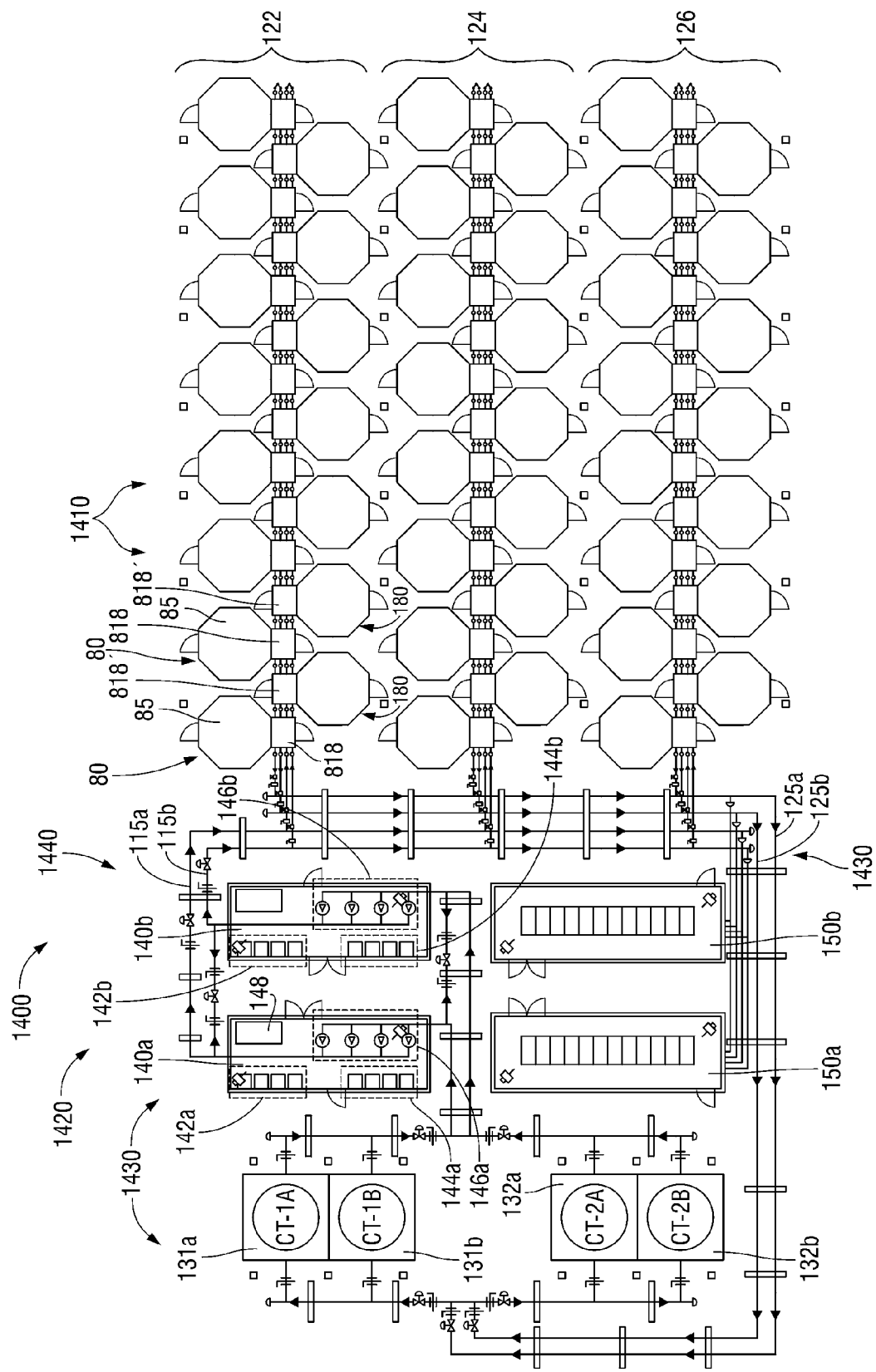
FIG. 1 is a schematic diagram of a modular data center according to embodiments of the present disclosure.

Embodiments of the presently disclosed close-coupled cooling systems and methods will now be described in detail with reference to the drawings, in which like reference numerals designate identical or corresponding elements in each of the several views.

The present disclosure relates to modular data pods and related support systems for providing energy-efficient, space-saving, and high-density server rack configurations. This modular approach allows for highly efficient use of geometric shapes such as octagonal, hexagonal, and pentagonal shapes for creating a hot aisle and a cold aisle through which air circulates for cooling the server racks. These polygonal shapes allow for maximum energy-efficiency and space-savings using the benefits of both the interior and the exterior angles and sides. The interior pod shape provides a natural circular configuration for positioning server racks. As compared to the prior art, this configuration provides a more efficient way to create and contain a hot aisle and a cold aisle.

The cooling air, which is used to efficiently cool computer systems, such as data servers, follows a natural path which allows for natural convection. The natural convection is assisted by mechanical cooling systems and components, e.g., fans, which are deployed in an efficient manner. The exterior shape of the modular data pods allows for the most efficient use of the space-saving characteristics of the multi-sided and angular geometric shapes of the modular data pods. The modular data pods can be deployed in tight groups similar to the patterns seen in bee hives. Bee hives are considered to be the most efficient use of space known to man. The space-saving, efficient design of the modular data pods accommodates the tremendous growth of the IT data storage industry. The completely modularized data pods also feature energy-efficient cooling systems and electrical, control, and IT systems for "just in time" deployment.

The close-coupled cooling systems and methods according to some embodiments of the present disclosure are "chillerless" and require significantly less mechanical refrigeration capacity than cooling systems using chillers to handle the cooling of fluctuating IT loads. In some embodiments, the system uses approximately 39-40 tons of subcooling to accomplish the cooling of 1 megawatt of IT loading. This is based on providing cooling in areas of relatively high wet-bulb conditions such as the north east or southern hemispheres where wet-bulb conditions can be extreme (e.g., wet-bulb temperatures of 78° F. and above). The system can be deployed in relatively high wet-bulb environmental areas where chillers or direct expansion (DX) systems would have been normally been mandatory.

An individual subcooling system can operate with close-coupled cooling at the individual point of loading to enable sufficient cooling to support IT rack inlet cooling temperatures (at the cold aisle) that would have normally required either DX or chiller assistance. The system according to some embodiments of the present disclosure is used in close-coupled applications such as modular data center applications. In other embodiments, the cooling system can be used as a packaged system to support modular cooling within a typical data center white space. The system can significantly reduce the up front as well as the operational costs (e.g., energy costs) of data centers.

In some embodiments, the system can cool IT server racks using 72° F. refrigerant or higher as dictated by a particular project. This provides cold aisle air temperatures or rack inlet temperatures of 75° F. or higher as dictated by a particular project.

FIG. 1 is a schematic diagram of a data pod farm or modular data center 1400. The data pod farm 1400 includes a data pod hive 1410. The term "hive" refers to a plurality of modular data pods coupled together and the associated cooling infrastructure. The data pod hive 1410 includes a plurality of modular data pods 80 and 180 arranged in data pod chains 122, 124, 126. The modular data pods 80 and 180 include a data enclosure 85, which contains server racks, and an auxiliary enclosure 818, which contains cooling, power, and control circuitry.

The data pods 80 and 180 are coupled to a central cooling system 1420 that includes central cooling, power, and control systems. The central cooling system 1420 may form part of a Building Management System (BMS). The central cooling system 1420 includes a central cooling fluid circuit 1430. The central cooling fluid circuit 1430 includes a first pair of cooling towers 131a, 131b (also designated as CT-1A, CT-1B, respectively), a second pair of cooling towers 132a, 132b (also designated as CT-2A, CT-2B, respectively), two banks of fluid pumps 146a, 146b, a pair of supply lines 115a, 115b, and a pair of return lines 125a, 125b.

The central cooling system 1420 also includes two banks of variable frequency drives 144a, 144b, which drive respective banks of fluid pumps 146a, 146b. The central cooling system 1420 also includes two banks of variable frequency drives 142a, 142b, which drive fans and/or fluid pumps within the two pairs of cooling towers 131a, 131b, 132a, 132b. The data pod farm 1400 also includes a pair of central battery backup units 150a, 150b that provide battery backup power to the modular data pods 80.

The data pod farm or modular data center 1400 and modular data pod hive 1410 of FIG. 1 may be designed and deployed to support a large amount of server rack capacity (e.g., approximately 12-15 MW of server rack capacity). FIG. 1 shows the space-saving attributes of the modular data pods' geometric shape. A typical data center, which is non-modular, requires three to four times as much space to handle this level of server rack capacity and density.

The system infrastructure (the central cooling system 1420 and central cooling fluid circuit 1430) is located at one end 1440 of the data pod hive 1410 of the data pod farm 1400. FIG. 1 depicts an example of a full-hive deployment. Initially, however, a sufficient number of data pods 80 and 180 can be installed for early deployment. The number of cooling towers, pumps, and electrical switch equipment can be deployed as needed on a just-in-time basis. Additional modular data pods 80 and 180, including their auxiliary enclosures 818 and 818', respectively, housing associated pipe and electrical chases, can also be deployed as needed on a just-in-time basis. The installation of additional modular data pods 80 and 180 and associated auxiliary enclosures 818 and 818', respectively, at an earlier stage of deployment of the data pod farm 1400 is described below with respect to FIGS. 17, 17A, and 17B

FIGS. 2A-2G depict modular data pods having different polygonal shapes according to embodiments of the present disclosure. The polygonal shapes of the modular data pods offer several benefits. The exterior of the polygonal shapes is conducive to space-efficient packing or grouping. And the interior of the polygonal shapes allows for tight arrangement of square or rectangular server racks corner to corner in a circular pattern within the polygonal shape of the modular data pod.

This arrangement defines an efficient partition between the hot and cold aisles. For example, in those embodiments where the computer racks are arranged so that they radiate or blow heat towards the walls of the data pod, the hot aisle is defined by the air space between the walls of the modular data pod and the computer racks and the cold aisle is defined by the air space created by the sides of the computer racks that face towards the center of the modular data pod. In other embodiments, the computer racks may be arranged so that the cold aisle is defined by the air space between the walls of the modular data pod and the computer racks and the hot aisle is defined by the air space created in the middle of the modular data pod by the sides of the computer racks that face towards the center of the modular data pod.

The tight grouping of the computer racks also allows for efficient use of the close distance between related equipment that is mounted in the computer racks. The result is efficient partitioning of hot and cold aisles, close grouping (i.e., space savings), and close distances between computer systems for electrical, mechanical, and IT interconnections and treatments.

Figure 2D:
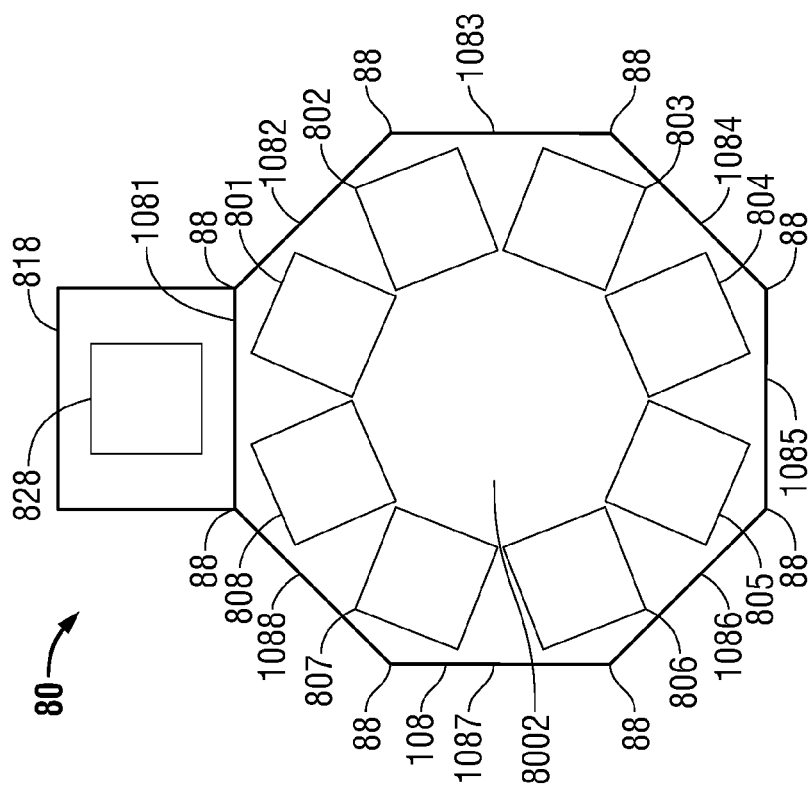
FIG. 2D is an illustration of a modular data pod having an octagonal wall configuration according to yet another embodiment of the present disclosure.
Figure 2C:
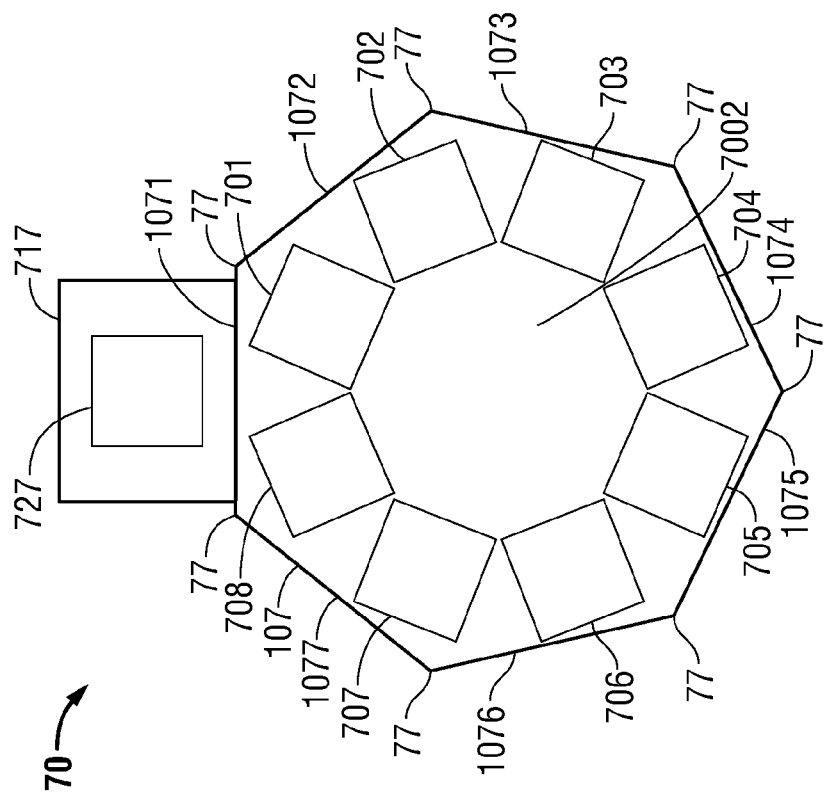
FIG. 2C is an illustration of a modular data pod having a heptagonal wall configuration according to yet another embodiment of the present disclosure.
Figure 2F:
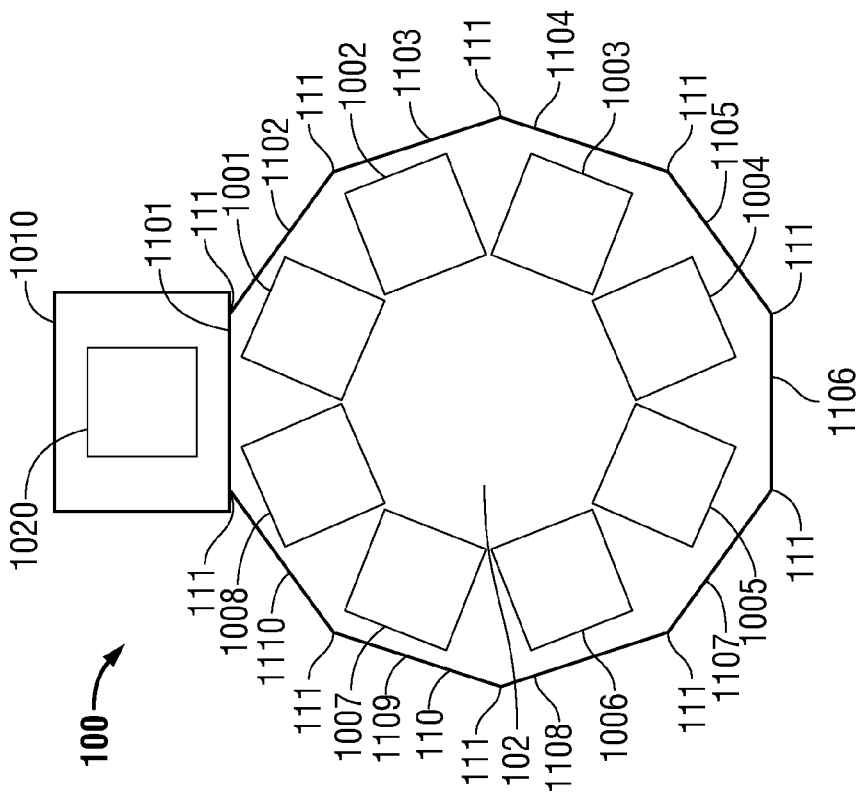
FIG. 2F is an illustration of a modular data pod having a decagonal wall configuration according to yet another embodiment of the present disclosure.

As shown in FIGS. 2A-2G, the walls of the modular data pod may be arranged in a variety of different polygonal shapes including a pentagon (e.g., the modular data pod 50 of FIG. 2A), hexagon (e.g., the modular data pod 60 of FIG. 2B), heptagon (e.g., the modular data pod 70 of FIG. 2C), octagon (e.g., the modular data pod 80 of FIG. 2D), nonagon (e.g., the modular data pod 90 of FIG. 2E), and decagon (e.g., the modular data pod 100 of FIG. 2F). These shapes can also be modified. For example, the octagonal-shaped modular data pod 80 of FIG. 2D can be stretched in one direction to increase the length of two walls of the modular data pod to form the modular data pod 80' of FIG. 2G.

In one embodiment of the present disclosure illustrated in FIG. 2A, modular pentagonal data pod 50 includes a data enclosure 105 including five external wall members 1051, 1052, 1053, 1054, and 1055 that are contiguously joined to one another along at least one edge. For example, edges 55 contiguously join external wall member 1051 to wall member 1052, external wall member 1052 to external wall member 1053, external wall member 1053 to external wall member 1054, external wall member 1054 to external wall member 1055, and external wall member 1055 to external wall member 1051, in the shape of a polygon.

The pentagonal modular data pod 50 includes server rack 501 positioned internally in the modular data pod 50 in proximity to external wall member 1051, server rack 502 positioned internally in the modular data pod 50 in proximity to external wall member 1052, server rack 503 positioned internally in the modular data pod 50 in proximity to external wall member 1053, server rack 504 positioned internally in the modular data pod 50 in proximity to external wall member 1054, and server rack 505 positioned internally in the modular data pod 50 in proximity to external wall member 1055.

To define a heat exchange volume 5002 substantially within a central region of the modular data pod 50, server racks 501 and 505, which are illustrated as being spaced apart from one another, may be contiguously joined together via internal wall member 550. Similarly, server racks 501 and 502, which are illustrated as being spaced apart from one another, may be contiguously joined together via internal wall member 510. (As defined herein, an internal wall member is a wall member disposed within the confines of each individual modular data pod defined by the external wall members).

Although server racks 502 and 503 and server racks 504 and 505 are also illustrated as being spaced apart from one another, those skilled in the art will recognize that internal wall members similar to internal wall members 510 and 550 may be disposed to contiguously join server racks 502 and 503 or server racks 504 and 505. Additionally, those skilled in the art will also recognize that the first heat exchange volume 5001 need not be tightly confined at each and every position between adjacent server racks to create suitable heat transfer conditions within the modular data pod 50.

The modular data pod 50 also includes an auxiliary enclosure 515 adjacent to external wall member 1051. In other embodiments, the auxiliary enclosure 515 may be adjacent to one of the external wall members 1051 to 1055. The auxiliary enclosure 515 includes a close-coupled dedicated cooling system 525 for chiller-less operation in high wet-bulb temperature applications, which is further described in detail below with respect to FIGS. 3, 4, and 5.

In one embodiment of the present disclosure as illustrated in FIG. 2B, a modular hexagonal data pod 60 includes an enclosure 106 having six external wall members 1061, 1062, 1063, 1064, 1065, and 1066 that are contiguously joined to one another along at least one edge in the shape of a polygon.

The hexagonal modular data pod 60 includes server rack 601 positioned internally in the modular data pod 60 in proximity to both external wall member 1061 and external wall member 1062, server rack 602 positioned internally in the modular data pod 60 in proximity to external wall member 1063, server rack 603 positioned internally in the modular data pod 60 in proximity to both external wall member 1063 and external wall member 1064, server rack 604 positioned internally in the modular data pod 60 in proximity to both external wall member 1064 and external wall member 1065, server rack 605 positioned internally in the modular data pod 60 in proximity to external wall member 1065, and server rack 606 positioned internally in the modular data pod 60 in proximity to both external wall member 1066 and external wall member 1061.

In a similar manner as described above with respect to modular data pod 50, to define a heat exchange volume 6002 substantially within a central region of the modular data pod 60, in one embodiment, the server racks 601 and 602, which are illustrated as being spaced apart from one another, may be contiguously joined together via an internal wall member 610 between the server racks 601 and 602. Again, although the server racks 605 and 606 are illustrated as being spaced apart from one another, those skilled in the art will recognize that internal wall members similar to internal wall member 610 may be disposed to contiguously join the corresponding server racks 605 and 606. Again, those skilled in the art will also recognize that the first heat exchange volume 6001 need not be tightly confined at each and every position between adjacent server racks in order for proper intended heat transfer conditions to occur within the modular data pod 60.

The modular data pod 60 also includes an auxiliary enclosure or compartment 616 adjacent to one of the external wall members 1061 to 1066, with the auxiliary enclosure 616 illustrated as being adjacent to external wall member 1061. Again, the auxiliary enclosure 616 includes a close-coupled dedicated cooling system 626 for operation in high wet-bulb temperature applications, which is described in detail below with respect to FIGS. 3, 4 and 5. In some embodiments, the close-coupled dedicated cooling system 626 may allow for chillerless operation in high wet-bulb temperature applications.

In another embodiment of the present disclosure as illustrated in FIG. 2C, a modular heptagonal data pod 70 includes an enclosure 107 including seven external wall members 1071, 1072, 1073, 1074, 1075, 1076, and 1077 that are contiguously joined to one another along at least one edge in the shape of a polygon.

The heptagonal modular data pod 70 includes server rack 701 positioned internally in the modular data pod 70 in proximity to both external wall member 1071 and external wall member 1072, server rack 702 positioned internally in the modular data pod 70 in proximity to external wall member 1072 and also in proximity to external wall member 1073, server rack 703 positioned internally in the modular data pod 70 in proximity to external wall member 1073, server rack 704 positioned internally in the modular data pod 70 in proximity to external wall member 1074, server rack 705 positioned internally in the modular data pod 70 in proximity to external wall member 1075, server rack 706 positioned internally in the modular data pod 70 in proximity to external wall member 1076, server rack 707 positioned internally in the modular data pod 70 in proximity to both external wall member 1076 and external wall member 1077, and server rack 708 positioned internally in the modular data pod 70 in proximity to both external wall member 1077 and external wall member 1071.

In a similar manner as described above with respect to modular data pods 50 and 60, the server racks 701 to 708 are contiguously or substantially contiguously disposed to define heat exchange volume 7002 substantially within a central region of the modular data pod 70.

Similarly, the modular data pod 70 also includes an auxiliary enclosure 717 adjacent to one of the external wall members 1071 to 1077, with the auxiliary enclosure 717 illustrated as being adjacent to external wall member 1071. Similarly, the auxiliary enclosure 717 includes a close-coupled dedicated cooling system 727 for operation in high wet-bulb temperature applications which is further described in detail below with respect to FIGS. 3, 4 and 5.

In one embodiment of the present disclosure as illustrated in FIG. 2D, modular octagonal data pod 80 includes an enclosure 108 including eight external wall members 1081, 1082, 1083, 1084, 1085, 1086, 1087 and 1088 that are contiguously joined to one another along at least one edge in the shape of a polygon. The octagonal modular data pod 80 includes server racks 801, 802, 803, 804, 805, 806, 807 and 808, each of which is positioned internally in the modular data pod 80 in proximity to, and in a position in angular relationship with two of the external wall members 1081-1088.

Again, in a similar manner as described above with respect to modular data pods 50, 60 and 70, the server racks 801 to 808 are contiguously or substantially contiguously disposed to define heat exchange volume 8002 substantially within a central region of the modular data pod 80.

Similarly, the modular data pod 80 also includes an auxiliary enclosure 818 adjacent to one of the external wall members 1081 to 1088, with the auxiliary enclosure 818 illustrated as being adjacent to external wall member 1081. As described previously, the auxiliary enclosure 818 includes a close-coupled dedicated cooling system 828 for operation in high wet-bulb temperature applications which is further described in detail below with respect to FIGS. 3, 4 and 5.

Figure 2E:
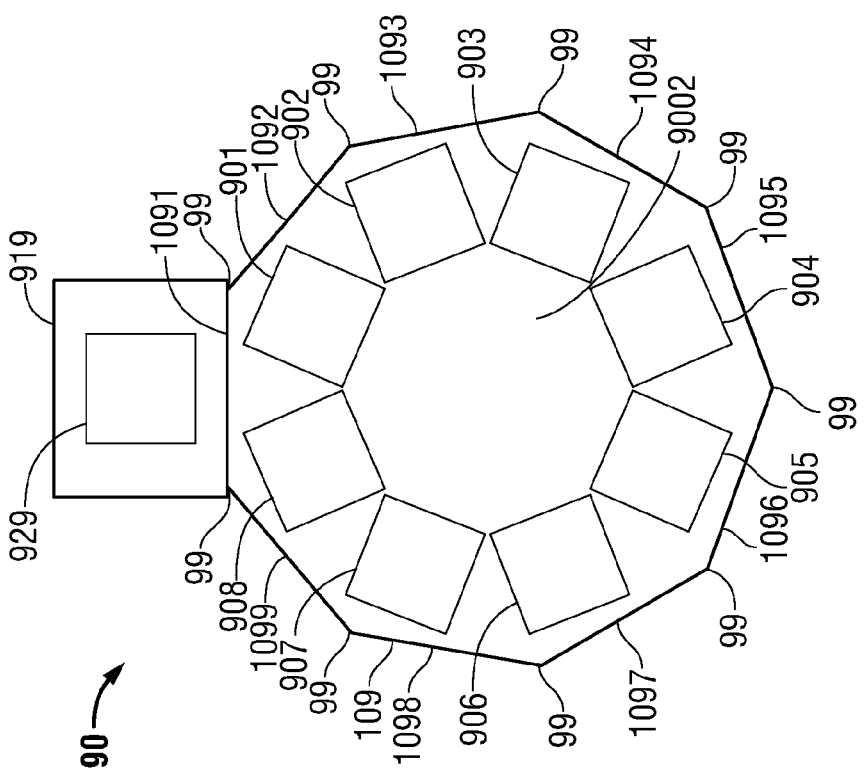
FIG. 2E is an illustration of a modular data pod having a nonagonal wall configuration according to yet another embodiment of the present disclosure.

In one embodiment of the present disclosure as illustrated in FIG. 2E, modular nonagonal data pod 90 includes an enclosure 109 including nine external wall members 1091, 1092, 1093, 1094, 1095, 1096, 1097, 1098, and 1099 that are contiguously joined to one another along at least one edge, e.g., edges 99, to form the shape of a polygon. The nonagonal modular data pod 90 includes eight server racks 901, 902, 903, 904, 905, 906, 907, and 908 positioned internally in the modular data pod 90 in proximity to, and in a position in angular relationship with, at least one of the external wall members 1091 to 1099.

In a similar manner as described above with respect to modular data pods 50, 60, 70, and 80, the server racks 901 to 808 are contiguously or substantially contiguously disposed to define heat exchange volume 9002 substantially within a central region of the modular data pod 90.

The modular data pod 90 also includes an auxiliary enclosure 919 adjacent to one of the external wall members 1091 to 1099, with the auxiliary enclosure 919 illustrated as being adjacent to external wall member 1091. As described above, the auxiliary enclosure 919 includes a close-coupled dedicated cooling system 928 for operation in high wet-bulb temperature applications, which is further described in detail below with respect to FIGS. 2, 3, and 4.

In another embodiment of the present disclosure as illustrated in FIG. 2F, a modular decagonal data pod 100 includes an enclosure 110 having ten external wall members 1101, 1102, 1103, 1104, 1105, 1106, 1107, 1108, 1109, and 1110 that are contiguously joined to one another along at least one edge, e.g., edges 111, in the shape of a polygon. The decagonal modular data pod 100 includes eight server racks 1001, 1002, 1003, 1004, 1005, 1006, 1007, and 1008 positioned internally in the decagonal modular data pod 100 in proximity to, and in a position in angular relationship with, at least one of the ten external wall members 1101 to 1110.

Again, in a similar manner as described above with respect to modular data pods 50, 60, 70, 80, and 90, the server racks 1001 to 1008 are contiguously or substantially contiguously disposed to define a heat exchange volume 102 substantially within a central region of the modular data pod 100.

Again, the modular data pod 100 also includes an auxiliary enclosure 1010 adjacent to one of the external wall members 1101 to 1110, with the auxiliary enclosure 1010 illustrated as being adjacent to external wall member 1101. Again, the auxiliary enclosure 1010 includes a close-coupled dedicated cooling system 1020 for operation in high wet-bulb temperature applications which is further described in detail below with respect to FIGS. 3, 4, and 5.

Figure 2G:
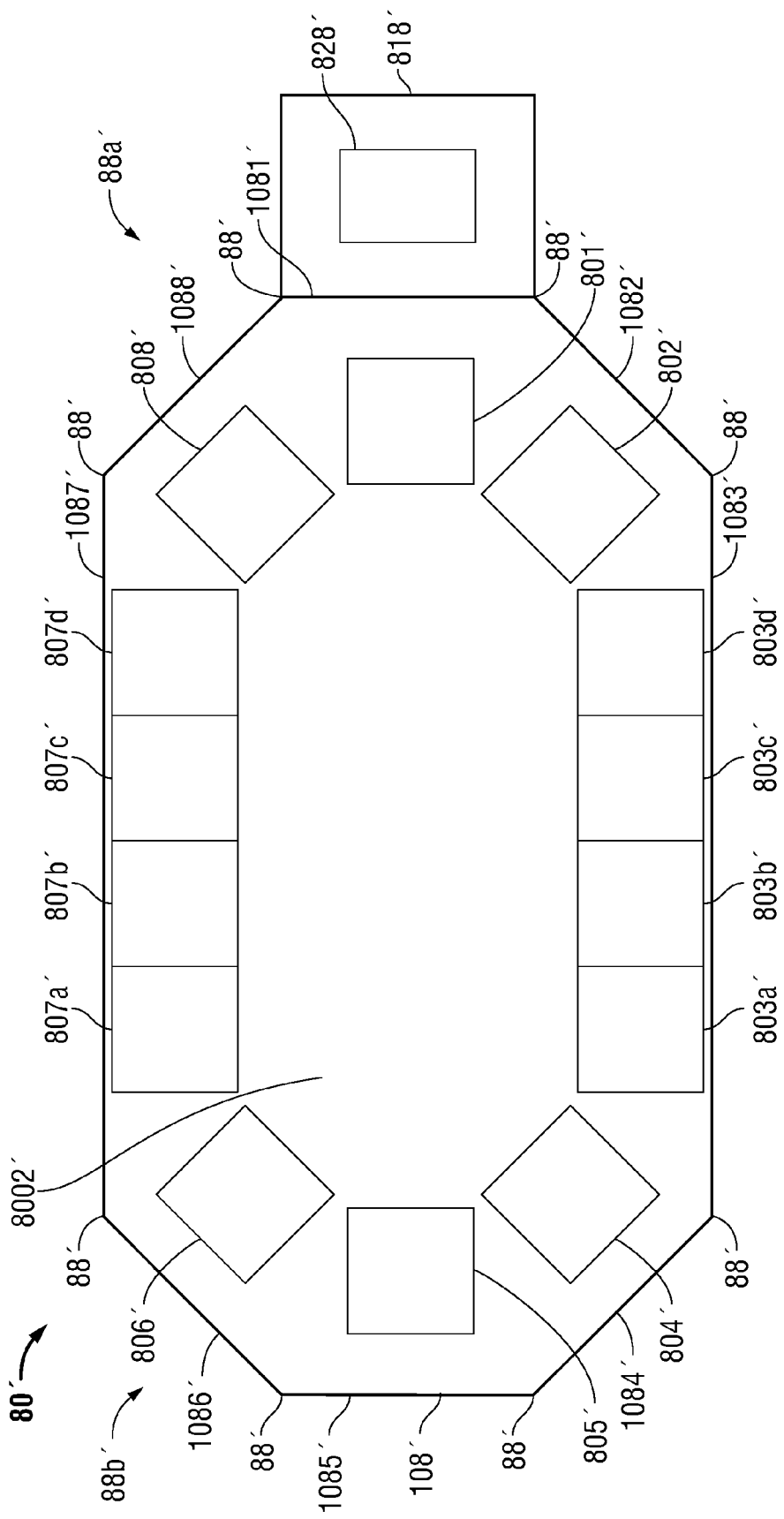
FIG. 2G is an illustration of the octagonal-shaped modular data pod of FIG. 2D having two elongated walls forming a modular data pod according to another embodiment of the present disclosure.

In another embodiment of the present disclosure as illustrated in FIG. 2G, the octagonal-shaped modular data pod 80 of FIG. 2D can be stretched in one direction to increase the length of two walls of the modular data pod 80 to form an elongated octagonal modular data pod 80'. More particularly, the octagonal modular data pod 80' includes an enclosure 108' having external wall members 1081', 1082', 1083', 1084', 1085', 1086', 1087', and 1088' that are contiguously joined to one another along at least one edge, e.g., edges 88', in the shape of a polygon.

The octagonal modular data pod 80' includes server racks 801' and 802' that are positioned internally in the modular data pod 80' in proximity to external wall member 1081' and external wall member 1082', respectively. Adjacent server racks 803a', 803b', 803c', and 803d' are also positioned internally in the octagonal modular data pod 80', each in proximity to elongated external wall member 1083'. Server racks 804', 805', and 806' are positioned internally within the modular data pod 80' in proximity to external wall members 1084', 1085', and 1085', respectively. Adjacent server racks 807a', 807b', 807c', and 807d' are also positioned internally in the octagonal modular data pod 80', each in proximity to elongated external wall member 1087'. Server rack 808' is also positioned internally in the octagonal modular data pod 80' in proximity to external wall member 1088'.

Contiguous external wall members 1088', 1081', and 1082' form a first end 88a' of the modular data pod 80' while correspondingly contiguous external wall members 1084', 1085', and 1086' form a second end 88b' of the modular data pod 80'. Similarly, as described above with respect to modular data pods 50, 60, 70, 80, 90, and 100, the server racks 801' to 808' are contiguously or substantially contiguously disposed to define heat exchange volume 8002' substantially within a central region of the modular data pod 80.

Again, the modular data pod 80' also includes an auxiliary enclosure 818' adjacent to one of the external wall members 1081' to 1088', with the auxiliary enclosure 818' illustrated as being adjacent to external wall member 1081'. Similarly, the auxiliary enclosure 818' includes a close-coupled dedicated cooling system 828' for operation in high wet-bulb temperature applications which is further described in detail below with respect to FIGS. 3, 4, and 5.

Figure 3:
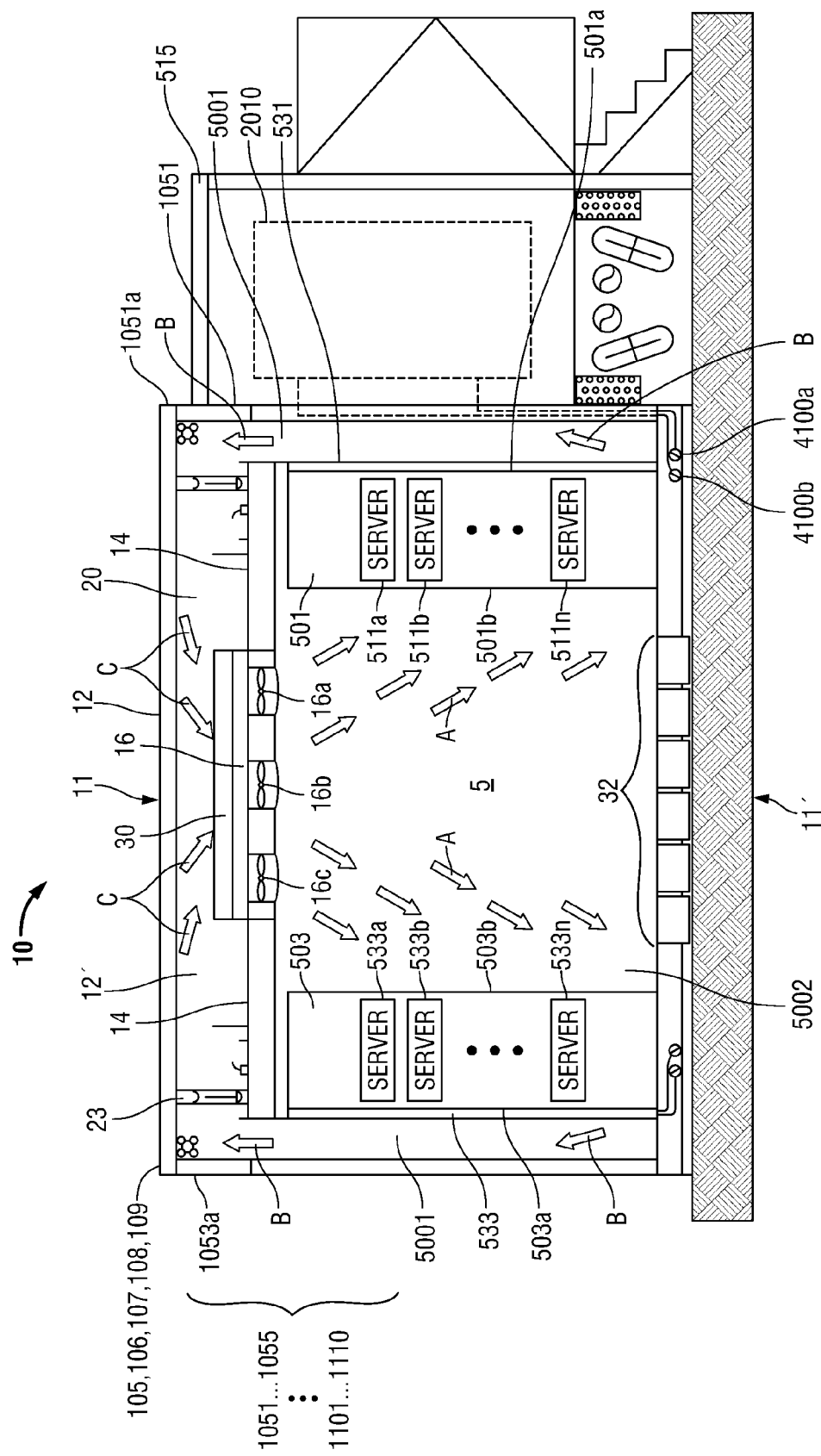
FIG. 3 is an elevation view (i.e., sectional side view) of a generic modular data pod including a hot aisle and a cold aisle according to embodiments of the present disclosure.

FIG. 3 is a sectional side view (i.e., elevation view) of a generic modular data pod generically designated as modular data pod 10. FIG. 3 illustrates an airflow pattern within the airflow circuit of the cooling system for a modular data pod. The modular data pods may use a variety of airflow patterns and hot and cold aisle configurations. For example, as shown in FIG. 3, the hot aisle can be at the rear or sides of the server rack and the cold aisle can be at the center of the modular data pod. This airflow pattern provides a natural chimney or upward convection of hot air within the hot aisle while the cold aisle is a natural downward airflow pattern of cold air that can be assisted by the fans.

As another example, the hot aisle could be in the center and the cold aisle would be at the rear of the server racks. The top of the racks could also be modified to allow hot air to flow within the rack or shelf itself and exit at either the top or the bottom of the racks. With respect to airflow patterns, the hot air may flow in an upward, downward, or other direction.

The modular data pods may also be designed to maintain neutralization temperatures at various locations in the airflow circuit. In the embodiment of FIG. 3, the primary cooling occurs at the rear of the server racks or shelving.

The fans may be arranged in other ways to create other airflow patterns known to those skilled in the art. The fans may also be positioned anywhere within the modular data pod. For example, the fans may be positioned in the upper or lower portion of the modular data and they may be oriented horizontally or vertically. The position and type of fan may depend on the latest advances in fan technology, including improvements in fan efficiency.

The cooling coil configuration shown in FIG. 3 provides redundancy by providing three ways (N+3) of cooling the air within the modular data pod. The one or more batteries may be mounted within the floor chamber as shown in FIG. 3 or somewhere within the cold aisle.

More particularly, modular data pod 10 generically represents, for example, modular data pods 50, 60, 70, 80, 90, 100, and 80' described above with respect to FIGS. 2A to 2G, respectively. Modular data pod 10 includes a data pod covering member 12 that substantially forms a roof of the modular data pod 10. The data pod covering member 12 may be in contact with, and supported by, for example, upper edges 1051a and 1053a of the external wall members 1051 and 1053, respectively, of data pod 50 (see FIG. 2A). The external wall members 1051 to 1055 define an aperture 12' at an upper end 11 of the enclosure 105 and also define inner surfaces 1051a, 1052a, 1053a, 1054a, and 1055a of the external wall members 1051 to 1055, respectively (see FIG. 2A). Thus, the data pod covering member 12 is configured and disposed to substantially cover the aperture 12'.

The computer racks 501 to 505 each define first sides 501a, 502a, 503a, 504a, 505a in relationship with the inner surfaces 1051a to 1055a of the external wall members 1051 to 1055, respectively, to define a first volume or hot aisle 5001 between the inner surfaces 1051a, 1052a, 1053a, 1054a, and 1055a and the first sides 501a, 502a, 503a, 504a, 505a defined by the computer racks 501 to 505, respectively. First cooling coils 531 and 533 are illustrated disposed on the first sides 501a and 503a of server racks 501 and 503, respectively.

The computer racks 501 to 505 each define second sides 501b, 502b, 503b, 504b, 505b, respectively, that are substantially oriented to interface with at least another second side to define a second volume therebetween, e.g., the heat exchange volume or cold aisle 5002 described above with respect to FIG. 2A. Those skilled in the art will recognize that heat exchange volumes 6002, 7002, 8002, 9002, 102, and 8002' illustrated in FIGS. 2B, 2C, 2D, 2E, 2F, and 2G, respectively, similarly form second volumes defined by the respective second sides of the computer racks.

The modular data pod 10 also includes a computer rack covering member 14 that is configured and disposed generally above the server racks 501 to 505 to substantially enclose the second volume or heat exchange volume 5002. The data pod covering member 12 and the computer rack covering member 14 form a third volume 20 that couples the first volume 5001 to the second volume 5002.

An air circulator support structure 16 is also configured and disposed generally above the server racks 501 to 505 and forms part of the computer rack covering member 14. The air circulator support structure 16 is generally disposed above the second volume 5002 to define a central upper boundary of the second volume 5002. The air circulator support structure 16 includes at least one air circulator, of which three air circulators 16a, 16b, and 16c are illustrated for circulating air downwardly, as shown by arrows A. The second volume 5002 forms a cold aisle. The downwardly circulating air circulates through the servers 511a, 511b, . . . , 511n disposed on server rack 501 and through the servers 533a, 533b, . . . , 533n to remove heat therefrom, and through the first cooling coils 531 and 533, where the air heated by the servers is then cooled. (Similar cooling coils, not shown, are disposed on first sides 502a, 504a, and 505a of server racks 502, 504, and 505, respectively).

The cooled air moves upwardly through the first volume 5001 as shown by the arrows B and further moves upwardly to the third volume 20. In one embodiment, second cooling coils 21 and 23 are disposed in the path of the circulating air between the computer rack covering member 14 and the data pod covering member 12, and in a position generally directly overhead corresponding first cooling coils 531 and 533 of server racks 501 and 503, respectively, to define the boundaries of the third volume 20. The second cooling coils 21 and 23 further cool the air, which then moves into the third volume 20 as shown by the arrows C where the air is drawn through the suction sides of the air circulators 16a, 16b, and 16c.

In one embodiment, the air circulator support structure 16 further includes a third cooling coil 30 that is disposed on the suction sides of the air circulators 16a, 16b, 16c for further cooling of the air circulating through the air circulators 16a, 16b, 16c.

Thus, the one or more air circulators 16a, 16b and 16c are configured to continuously circulate air through the first volume 5001, the second volume 5002, and third volume 5003.

In one embodiment, the cooling coils 531, 533, 21, 22, and 30 include a refrigerant, non-aqueous solution, gas, or liquid as the cooling medium. As defined herein, the cooling coils 531, 533, 21, 22, and 30 are heat exchange members.

In one embodiment, the modular data pod 10 includes a dedicated electrical power supply, illustrated as one or more batteries 32 at a lower end 11' of the data pod enclosure 105. The one or more batteries may be in electrical communication with a direct current to alternating current (DC/AC) inverter (not shown), which, in turn, is in electrical communication with an offsite electrical power grid (not shown).

Consequently, in the exemplary embodiment of FIG. 3, a hot aisle is formed between a back side of the IT cabinets or computer server racks and the walls of the modular data pod and a cold aisle is formed by a front side of the computer racks. In other words, the computer racks or shelving are positioned to create a hot aisle and a cold aisle. In other embodiments, the computer racks are positioned in other ways to create other hot and cold aisle configurations. In yet other embodiments, the hot and cold aisles are strictly contained.

The fans, coils, computer racks, one or more batteries, hot aisle, cold aisle, and piping tunnels are all positioned within the modular data pod envelop or container. Additional compartments are attached to a side of the modular data pod. These compartments include an exchanger module, pipes for the cooling system, a pump for pumping cooling fluid (e.g., refrigerant or deionized water) through the pipes, cable buses, and electrical compartments. These compartments may be waterproof. A user may access these compartments, e.g., to perform deployment or maintenance tasks, via an access door.

The fans may be arranged in other ways to create other airflow patterns known to those skilled in the art. The fans may be positioned anywhere within the modular data pod. For example, the fans may be positioned in the upper or lower portion of the modular data pod and they may be oriented horizontally or vertically. The position and type of fan may depend on the latest advances in fan technology, including improvements in fan efficiency.

The modular data pods are designed to include significant ramp up (or modularity) capabilities in power, data collection, and HVAC cooling capacity. Each pod may be designed to handle a spectrum of server rack loads from the low end, i.e., about 1-2 kW per server rack, to the high end, i.e., about 40 kW per server rack.

The modular data pods may use both natural convection and air movement devices (e.g., fans or other devices that can move air or create air patterns) to move air through the hot aisle/cold aisle circuit. The air movement devices may be coupled to energy efficient VFDs that can control the air movement devices using state of the art control strategies that monitor both cold aisle temperature and server and rack loading according to cloud computing technology.

The cooling coils in the modular data pods may employ micro-channel coil technology. These cooling coils require far less depth and surface area than typical cooling coils. The modular data pods may be built with removable coil sections that are adapted to accept replacement coils, such as coils that provide higher output or that incorporate future advances in coil technology. The modular data pod main coil circuit may include a hybrid dual coil systems consisting of a standard refrigerant evaporation coil, a receiver, and a tandem micro-channel coil. This pairing of coil technology enables greater heat transfer capabilities by using the benefits of refrigerant "change of state." Alternatively, the system can include a straight liquid-pumped system without change of state.

The modular data pods may be built to various seal classifications. For example, the membrane sealants, wall construction, gasketing, and door treatments may be adjusted to meet various seal requirements including the seal requirements promulgated by Sheet Metal and Cooling Contractors' National Association (SMACNA). The modular data pods may also include non-conductive fire suppression systems.

The modular data pods may be designed to receive either manufactured server racks or custom designed rack and shelving components. Custom racks or shelving components can be included as part of the overall physical structure of the modular data pod to provide a strong "skeletal" system that can be easily removed, adapted, and modified, to conform to the various types of server supports.

The modular data pod structure may be a durable but light structure. For example, it may be made of a composite of light steel square tubing or I-beams and heavy gauge aluminum structural members. The walls and roof of the modular data pods can include either double or single-wall insulated panels. They can be constructed of metal, plastic, glass, or other composite materials. The modular data pods can have structural skeletal framing, or receive skin treatments that have structural capabilities. The type and extent of insulation used in the modular data pod may vary based on the environment in which the pod is deployed or any other requirements of an operator.

The exterior of the modular data pods may be treated with energy-saving reflective paints, surface coatings, or solar membranes (e.g., photovoltaic) or coatings. The roof structure may include supports and hold downs for solar panels in farm-type applications.

The modular data pod structure can be fitted with lifting lug and support structures than will enable it to be lifted from above or below using forklifts, gantry, cranes, helicopters, or other rigging equipment. The server racks or shelving may include restraints to secure the server racks and other equipment in the modular data pod for transport.

The modular data pods can be fitted with packaged humidity controls and systems. For example, the modular data pods can be fitted with membrane, vapor barriers, sealants, and other humidity control features to limit migration of humidity from external spaces or the environment into the modular data pod envelop.

The modular data pods may or may not include access doors. The doors may include double marine insulated vision glass for external inspection of the modular data pod. The modular data pods may be fitted with lighting and service receptacles, both internally and externally as needed. All electrical circuits may be protected with ground fault protection. Modular data pods intended for outdoor use may include structure for lightning protection.

The modular data pods may be pre-stacked with computer racks at a centrally-controlled location before they are deployed on site. This saves the time and expense required to stack a modular data pod with computer racks on site, especially in remote areas.

Figure 4:
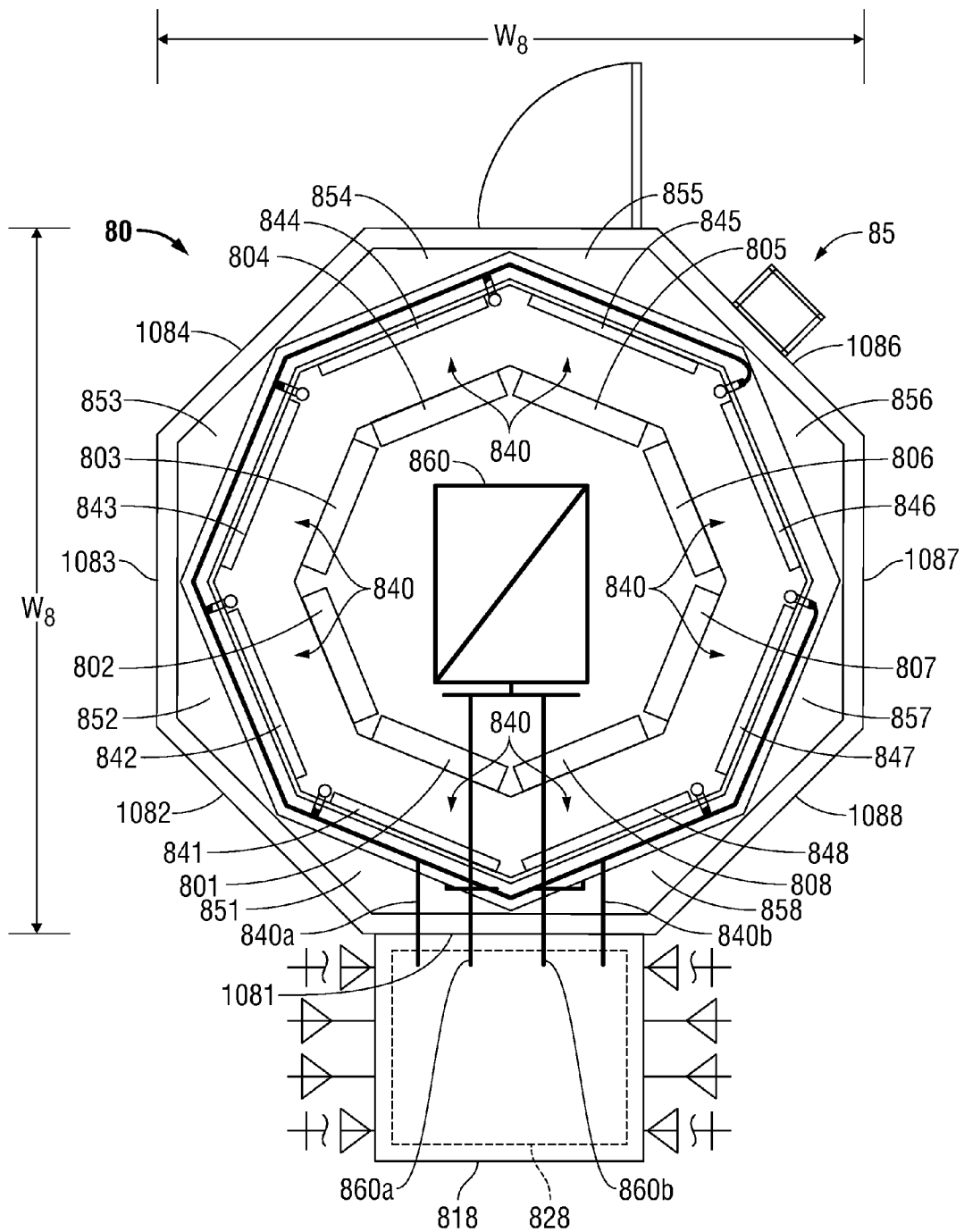
FIG. 4 is a plan view (i.e., sectional top view) of a modular data pod showing an upper coil deck according to embodiments of the present disclosure.

FIG. 4 is a plan view (i.e., sectional top view) of the octagonal modular data pod 80 of FIG. 2D showing an octagonal upper coil deck 838a that vertically supports an array 840 of vertically disposed upper cooling coils 841, 842, 843, 844, 845, 846, 847, and 848 disposed above respective server racks 801, 802, 803, 804, 805, 805, 806, 807, and 808. Each of the vertically disposed upper cooling coils 841, 842, 843, 844, 845, 846, 847, and 848 forms a boundary in an analogous manner to second cooling coils 21 and 22 that are disposed in the path of the circulating air between the computer rack covering member 14 and the data pod covering member 12 to define the boundaries of the third volume 20 as described with respect to modular data pod 10 in FIG. 3.

Lower rear coils on the back side (not shown) of each of the computer racks 801 to 808 are analogous to refrigerant coils 531 and 533 in FIG. 3. The lower rear coils are the first stage or the primary way of cooling the air flowing in hot aisles 851, 852, 853, 854, 855, 856, 857, and 858. Hot aisle 851 is formed between the rear side of server rack 801 and external wall members 1081 and 1082. Hot aisle 852 is formed between the rear side of server rack 802 and external wall members 1082 and 1083. Similarly, hot aisle 853 is formed between the rear side of server rack 803 and external wall members 1083 and 1084. Hot aisle 854 is formed between the rear side of server rack 804 and external wall members 1084 and 1085. Those skilled in the art will recognize how hot aisles 855 to 858 are similarly formed.

The upper vertical coil array 840, which is in an octagonal shape, is the secondary way of cooling (n+2) the air flowing in the hot aisles 851 to 858. Piping connections 840a and 840b provide fluidic communication with a refrigerant gas fluid supply path 4100a, which is in fluid communication with the environment 5 of the electronic equipment, and fluid return path 4100b, which is also in fluid communication with the environment 5 of the electronic equipment, described below with respect to FIG. 6.

An overhead flat-plate coil 860, analogous to third cooling coil 30 that is disposed on the suction sides of the air circulators 16a, 16b, 16c may be positioned at the center (as shown) of the modular data pod 80 as the third way of cooling (n+3) the air flowing from the hot aisles 851 to 858. This third coil 860 can also be used as a "trim" coil if the heat load at any server rack coil requires supplemental cooling. The third coil 860 handles the occasional overloading at specific server racks. The third coil 860 can also be used as an energy-saving coil for extremely low-load heat output conditions. The control strategies for cooling server racks within the modular data pod 80 may include shutting down the primary or main coils (not shown) and activating the third coil 860 to handle low system loads. Piping connections 860a and 860b provide fluidic communication with the refrigerant gas fluid supply path 4100a, which is in fluid communication with the environment 5 of the electronic equipment, and fluid return path 4100b, which is also in fluid communication with the environment 5 of the electronic equipment, described below with respect to FIG. 6.

Figure 5:
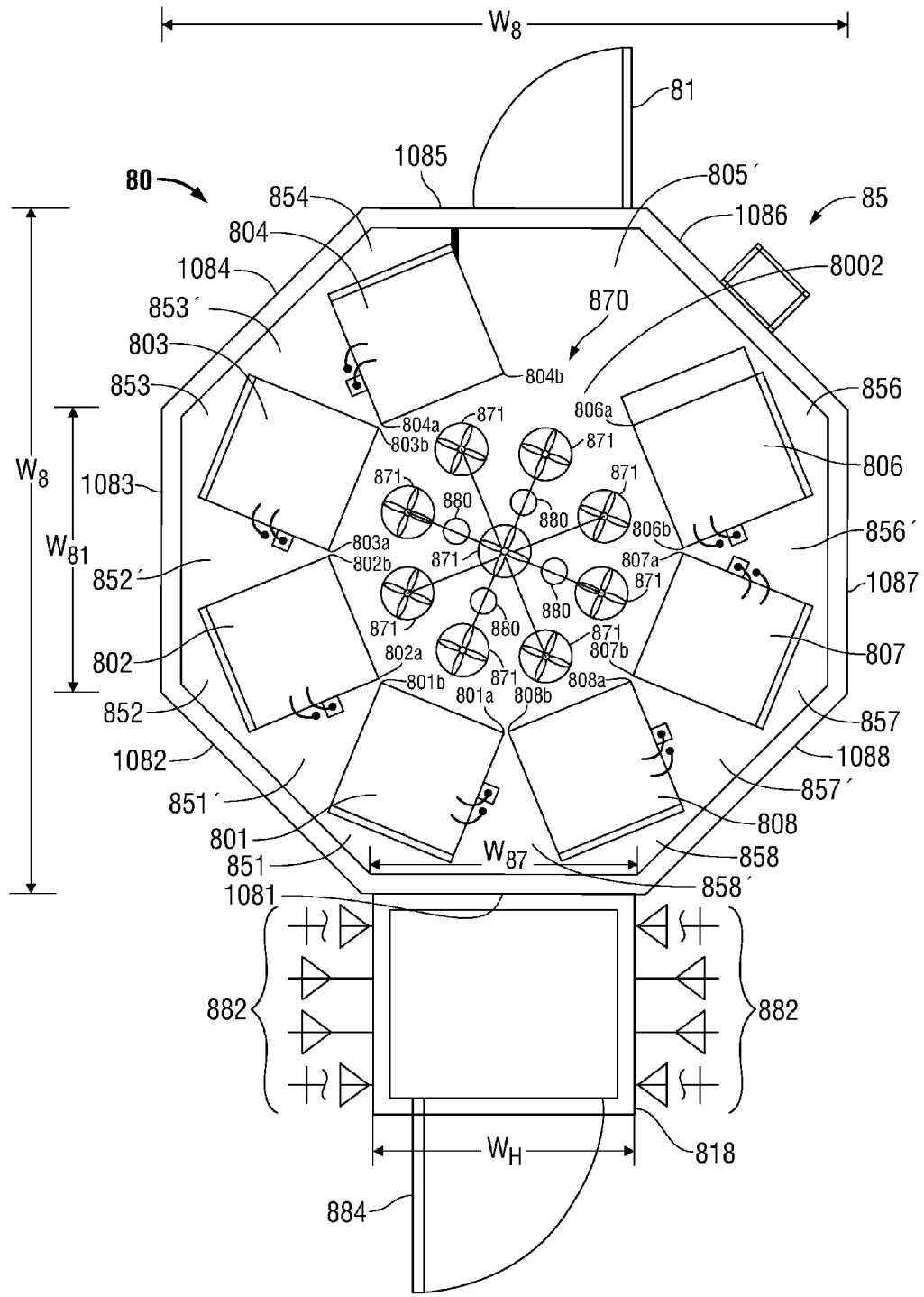
FIG. 5 is a plan view (i.e., sectional top view) of a modular data pod showing a ceiling fan assembly according to embodiments of the present disclosure.

FIG. 5 is a plan view (i.e., sectional top view) at the ceiling level of modular data pod 80 showing a ceiling fan assembly 870. The computer racks 801 to 804 and 806 to 806 each include corners 801a, 801b for server rack 801, corners 802a, 802b for server rack 802, corners 803a, 803b for server rack 803, corners 804a, 804b for server rack 804, corners 806a, 806b for server rack 806, corners 807a, 807b for server rack 807, and corners 808a, 808b for server rack 808. The server racks 801 to 804 and 806 to 808 are shown disposed in a circular pattern with corners 801a and 801b of rack 801 in contact with the corners 808b and 802a of adjacent computer racks 808 and 802, respectively.

Those skilled in the art will understand the arrangement of the corners of the remaining server racks 802, 803, 804, 806, and 807. This arrangement of the server racks 801 to 804 and 806 to 808 in a circular pattern provides a partition between the hot aisles 851 to 854 and 856 to 858 and the cold aisle formed by volume 8002. In some embodiments, the pie-shaped air spaces 851', 852', 853', 856', 857', and 858' between the computer racks 801 and 802, 802 and 803, 803 and 804, 806 and 807, 807 and 808, and 808 and 801, respectively, may be partitioned off from the cold aisle 8002 and form part of the hot aisles 851, 852, 853, 854, 856, 857, and 858. As shown in FIG. 5, the modular data pod may fit seven server racks (e.g., 40 kW server racks). There is a space 805' between two server racks, e.g., server racks 804 and 806, to give a human operator access to the server racks 801-804 and 806-808 via access door 81. In some embodiments, the modular data pod does not include an access door. In these embodiments, the modular data pod may fit eight server racks.

Fans 871 of fan assembly 870 and lighting 880 are positioned at the ceiling level of the modular data pod 80. The fans are driven by variable-frequency drives (VFDs) (not shown), which may be controlled by the central cooling system 1420 of a Building Management System (BMS). The central cooling system 1420 can increase or decrease the fan speed based on temperature and/or the loading of the computer racks. For example, the central cooling system 1420 can increase the fan speed as the temperature within the hot aisles increases.

FIG. 5 also shows the cooling pipes 882 that enter and exit a lower pipe chase (not shown). The lower pipe chase may be removable and may be located below auxiliary enclosure 818 that includes the heat exchangers (the complete close-coupled cooling system 4000, which includes condensers 1200a, 1200b, and 1300, is described below with respect to FIG. 6) and electrical equipment of the modular data pod assembly. The cooling pipes 882 include six pipes: two supply pipes for supplying cooling fluid to the coils of the modular data pod, two return pipes for returning cooling fluid to the cooling system, and two reverse return pipes. The modular data pod assembly may include waterproof partitions between the various compartments.

The exemplary modular data pods 10, 50, 60, 70, 80, 90, 100, and 80' are designed to be universal in their use for computer data storage. They can be used for singular pod deployment. They can be trailerized for temporary or semi-permanent use. They can be used indoors in warehouse or suite-type applications. They can be deployed in outdoor or "farm"-type environments. The benefit of their space-saving shape, size, and relative weight allows them to be implemented where it is not practical logistically or otherwise to use other large and heavy "containerized" modular products.

Figure 6:
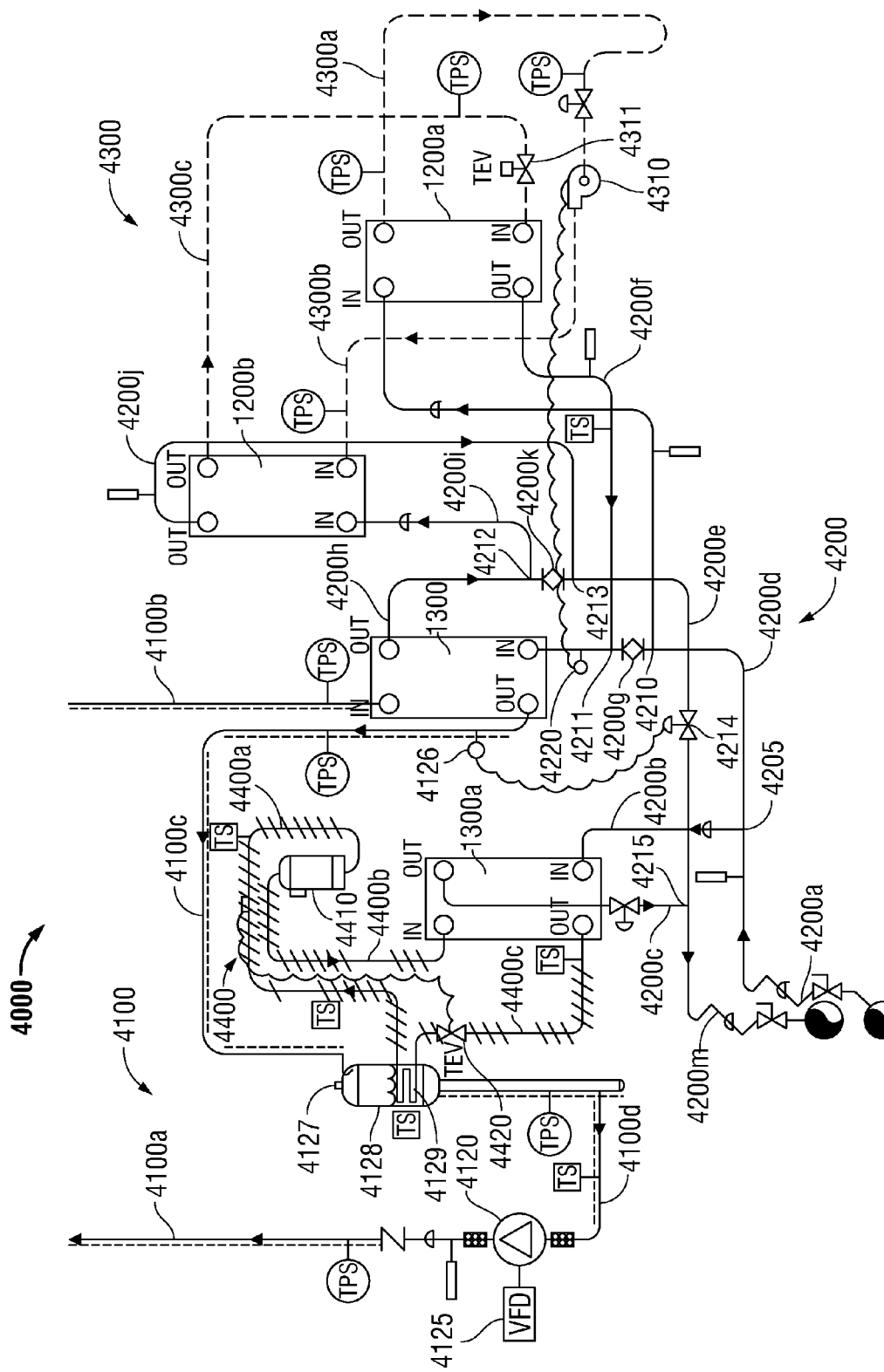
FIG. 6 is a flow diagram for a close-coupled cooling system for operation in high wet-bulb temperature applications according to embodiments of the present disclosure.

FIG. 6 depicts a close-coupled cooling system 4000 designed to cool electronic equipment of an IT data center. The system 4000 includes four independent, yet cooperating, fluid circuits designated as 4100, 4200, 4300, and 4400, respectively.

The first circuit 4100 interfaces with the electronic equipment of the IT data center, and provides cooling to the electronic equipment via a first fluid. The first fluid may contain a liquid refrigerant R134a or similar refrigerants. The first circuit 4100 includes at least one evaporator coil (not shown in FIG. 6, but see, e.g., the evaporator coils of FIG. 12) that is in thermal communication with the electronic equipment and extracts heat from the electronic equipment to the first fluid. As the first fluid flows from an inlet of the at least one evaporator coil to an outlet of the evaporator coil, heat is transferred from the electronic equipment to the first fluid. In one embodiment, the first fluid enters the at least one evaporator coil at a temperature of approximately 23° C. During heat transfer or exchange, the first fluid transforms from a liquid state to an at least partially vapor state.

The first circuit 4100 includes a fluid supply path 4100a and a fluid return path 4100b coupled to the inlet and outlet of the at least one evaporator coil, respectively. The fluid supply path 4100a delivers the first fluid in a liquid state to the inlet of the at least one evaporator coil, and the fluid return path 4100b receives the first fluid in an at least partially vapor state from the outlet of the at least one evaporator coil. The first circuit 4100 includes a liquid refrigerant pump 4120 that pumps the first fluid through the fluid supply path 4100a. The first circuit 4100 also includes a variable frequency drive 4125 that regulates capacity and motor speed of the liquid refrigerant pump 4120.

The first circuit 4100 further includes a main condenser 1300 that receives the first fluid from the fluid return path 4100b. The main condenser 1300 is a refrigerant-to-water heat exchanger that cools the first fluid that passes through the main condenser 1300 and condenses the first fluid from the at least partially vapor state to the liquid state. In one embodiment, to fully condense and cool the first fluid, the main condenser 1300 is maintained at a predetermined condensing temperature of approximately 23.3° C. or lower.

Further, the first circuit 4100 may include (1) a fluid path 4100c that carries the first fluid from the main condenser 1300 to a refrigerant liquid receiver 4128, and (2) a fluid path 4100d that carries the first fluid from the refrigerant liquid receiver 4128 to a suction side of the liquid refrigerant pump 4120.

The refrigerant liquid receiver 4128 is configured to detect and regulate the temperature of the first fluid. Specifically, the refrigerant liquid receiver 4128 is configured to reduce the temperature of the first fluid by thermally coupling the first circuit 4100 to the fourth circuit 4400. In some embodiments, the refrigerant liquid receiver 4128 maintains the first fluid at a predetermined temperature between approximately 22.2° C. and approximately 23.3° C.

The refrigerant liquid receiver 4128 may also include components (e.g., a detector and a controller) configured to detect and regulate the liquid level of the first fluid contained in the refrigerant liquid receiver 4128. A low liquid level in the refrigerant liquid receiver 4128 may cause cavitation problems at the liquid refrigerant pump 4120. To avoid this problem, the refrigerant liquid receiver 4128 includes a liquid level controller 4127 that detects the liquid level in the receiver 4128 and triggers an alarm if a low liquid level is detected. Also, the refrigerant liquid receiver 4128 may collect the first fluid in the first circuit 4100 when the cooling system 4000 is in an idle or standby mode.

The first circuit 4100 also includes a temperature sensor 4126 that is located on the fluid path 4100c at the exit of the main condenser 1300. The temperature sensor 4126 detects the temperature of the first fluid when it exits from the main condenser 1300. The readings of the temperature sensor 4126 reflect the temperature of the main condenser 1300.

The second circuit 4200 interfaces with the first circuit 4100 at the main condenser 1300a, where the second circuit 4200 performs heat exchange with the first circuit 4100. Specifically, the second circuit 4200 has a second fluid flowing through it. The second fluid removes heat from the first fluid of the first circuit 4100 at the main condenser 1300a. In one embodiment, upon exiting the main condenser 1300a, the second fluid has a temperature of approximately 22.8° C.

The second circuit 4200 includes a fluid path 4200a that carries the second fluid from a cooling tower, fluid cooler, or dry cooler (not shown in FIG. 6, but see, e.g., cooling tower CT-1A of FIG. 14) to the second circuit 4200. The fluid path 4200a is fluidly coupled to a fluid path 4200d which delivers the second fluid to the main condenser 1300. The second circuit further includes a fluid path 4200h that receives the second fluid from the main condenser 1300. The fluid path 4200h is fluidly coupled to a fluid path 4200e which carries the second fluid to a fluid path 4200m that delivers the second fluid back to the cooling tower, fluid cooler, or dry cooler.

In some embodiments, the second circuit 4200 includes a pump to facilitate the flow of the second fluid through the second circuit 4200. In one embodiment, the second fluid is regulated at a flow rate of approximately 1192 liters/minute. The pump may be in any of the following forms: a central pumping and cooling tower, dry cooler, fluid cooler, well water circuit, or other chilled water circuit.

Further, the second circuit 4200 may include a mixed water temperature sensor 4220 that monitors the temperature of the second fluid before it enters the main condenser 1300. The second circuit 4200 may also include a water regulating valve 4214, which operatively communicates with the temperature sensor 4126 of the first circuit 4100. The water regulating valve 4214 is configured to regulate the flow rate of the second fluid in proportion to the readings of the temperature sensor 4126.

For instance, to maintain the main condenser 1300 at or below a predetermined condensing temperature (e.g., 23.3° C.), the water regulating valve 4214 adjusts the flow rate of the second fluid based on the temperature of the main condenser 1300 as measured by the temperature sensor 4126. For example, if the temperature sensor 4126 has a reading significantly higher than the predetermined condensing temperature (e.g., 23.3° C.) of the main condenser 1300, the water regulating valve 4214 then significantly increases the flow rate of the second fluid flowing through the second circuit 4200 to thereby rapidly reduce the temperature of the main condenser 1300. However, if the temperature sensor 4126 has a reading slightly higher than the predetermined condensing temperature (e.g., 23.3° C.), the water regulating valve 4214 then slightly increases the flow rate of the second fluid flowing through the second circuit 4200.

In some embodiments, to maintain the temperature of the main condenser 1300 at or below the predetermined condensing temperature (e.g., 23.3° C.), the second fluid is maintained at a threshold temperature of approximately 18.9° C. or lower.

To maintain the second fluid at or below the threshold temperature (e.g., 18.9° C.), the second circuit 4200 may include at least one cooling mode to cool the second fluid. For example, the second circuit 4200 may include a simple free-cooling mode in which the second circuit 4200 relies on the atmosphere to cool the second fluid via a cooling tower, fluid cooler, or dry cooler. In operation, after heat is transferred from the first fluid to the second fluid at the main condenser 1300, the second fluid follows the fluid paths 4200h, 4200e and proceeds to a cooling tower, fluid cooler, or dry cooler (not shown in FIG. 6) to reject its heat into the atmosphere.

The cooled second fluid then follows the fluid paths 4200a and 4200d back to the main condenser 1300 to cool the first fluid. It is envisioned that the second fluid may continuously repeat the above cycle.

In one embodiment, the simple free-cooling mode maintains the second fluid at or below the threshold temperature (e.g. 18.9° C.) only when the wet-bulb temperature of the IT data center is below 17.2° C. If the wet-bulb temperature is above 17.2° C., the second fluid may exceed its threshold temperature.

Further, the second circuit 4200 may include a mechanical compressed cooling mode, in which the third circuit 4300 cools the second circuit 4200 through mechanical compression cycles. A third fluid flows through the third circuit 4300. The third fluid may contain a liquid refrigerant, such as R134a, or any other suitable refrigerant.

The third circuit 4300 includes an atmospheric sub-cooler exchanger 1200a to sub-cool the second fluid 4200 before the second fluid arrives at the main condenser 1300. The atmospheric sub-cooler exchanger 1200a is a refrigerant-to-water heat exchanger that trims or cools at least a portion of the second fluid. The third circuit 4300 may also include a trim condenser 1200b, which is a refrigerant-to-water heat exchanger that transfers heat in the third fluid, which is the heat that the third fluid has absorbed from the second fluid at the atmospheric sub-cooler exchanger 1200a, back to the second fluid. The third circuit 4300 may further include a sub-cooler compressor 4310 that compresses the third fluid.

The third circuit 4300 includes a fluid path 4300a that carries the third fluid from the atmospheric sub-cooler exchanger 1200a to the sub-cooler compressor 4310 for compression, and a fluid path 4300b that carries the compressed third fluid to the trim condenser 1200b. Additionally, the third circuit 4300 includes a fluid path 4300c that carries the third fluid from the trim condenser 1200b to a metering device, or a thermal expansion valve 4311, which expands the third fluid back to the atmospheric sub-cooler exchanger 1200a. It is envisioned that the third fluid may continuously flow through the third circuit 4300 as long as the third circuit 4300 is activated.

In some embodiments, the third circuit 4300 is activated only when the second fluid exceeds its threshold temperature (e.g., 18.9° C.), which may occur when the wet-bulb temperature is over 17.2° C. The cooling capacity of the third circuit 4300 may be regulated in direct proportion to the wet-bulb temperature that is in excess of 17.2° C., as illustrated in Table 1 below.

TABLE 1

| WET-BULB TEMPERATURE | COOLING CAPACITY OF THE THIRD CIRCUIT 4300 |
| --- | --- |
| 63 wb (17.2° C.) | 0 tons |
| 64 wb (17.8° C.) | 13 tons |
| 65 wb (18.3° C.) | 26 tons |
| 66 wb (18.9° C.) | 39 tons |
| 67 wb (19.4° C.) | 52 tons |
| 68 wb (20° C.) | 65 tons |
| 69 wb (20.6° C.) | 78 tons |
| 70 wb (21.1° C.) | 91 tons |

The third circuit 4300 closely controls the temperature of the second fluid by trimming and cooling the temperature of the second fluid one degree at a time. For instance, if the second fluid temperature rises above its threshold temperature by one degree, the third circuit 4300 then reduces the temperature of the second fluid by one degree.

In one embodiment, for efficiency reasons, the second circuit 4200 directs a small portion of the second fluid to perform heat exchange with the third fluid, before the second fluid enters the main condenser 1300. Specifically, the second circuit 4200 includes a splitter tee 4210 on the fluid path 4200*d* before an inlet of the main condenser 1300. The splitter tee 4210 diverts a portion of the second fluid, e.g., approximately one third of the second fluid, to an inlet of the atmospheric sub-cooler exchanger 1200*a*. In some embodiments, the portion of the second fluid has a temperature of 22.2° C. at the inlet of the atmospheric sub-cooler exchanger 1200*a*.

The second circuit 4200 may include another splitter tee 4211 on the fluid path 4200*d* upstream from the splitter tee 4210. In conjunction with a flow balancing or flow control valve 4200*g* positioned in fluid path 4200*d* between splitter tee 4210 and splitter tee 4211, the splitter tee 4211 allows the portion of the second fluid to flow from an outlet of the atmospheric sub-cooler exchanger 1200*a* back to the fluid path 4200*d*. At the splitter tee 4211, the portion of the second fluid, e.g., approximately one third of the second fluid, rejoins the remaining portion of the second fluid, e.g., approximately two thirds of the second fluid.

The blended second fluid then proceeds to the main condenser 1300. In some embodiments, the blended second fluid has a temperature of approximately 18.9° C. before entering the main condenser 1300. Alternatively, depending upon the degree or percentage opening of the flow control or flow balancing valve 4200*g*, flow control or flow balancing valve 4200*g* can allow either complete or partial divergence of flow from the main condenser 1300 to the atmospheric sub-cooler exchanger 1200*a* or force flow in fluid path 4200*d* entirely through main condenser 1300.

Additionally, for efficiency reasons, the second circuit 4200 may direct only a small portion of the second fluid to perform heat exchange with the third fluid, after the second fluid exits from the main condenser 1300. Specifically, the second circuit 4200 includes a splitter tee 4212 on the fluid path 4200*h* at the exit of the main condenser 1300. The splitter tee 4212 diverts a portion of the second fluid, e.g., approximately one third of the second fluid, via a fluid path 4200*i* to the trim condenser 1200*b* to reclaim heat from the third fluid. In some embodiments, the approximately one third of the second fluid has a temperature of approximately 27.4° C. at an outlet of the trim condenser 1200*b*.

The second circuit 4200 may include an additional splitter tee 4213 on the fluid path 4200*h* downstream from the splitter tee 4212. In conjunction with a flow balancing or flow control valve 4200*k* positioned in fluid path 4200*e* between splitter tee 4212 and splitter tee 4213, the splitter tee 4213 allows the portion of the second fluid, e.g., approximately one third of the second fluid, exiting from the trim condenser 1200*b* to join the rest of the second fluid. At the splitter tee 4213, the portion of the second fluid, e.g., approximately one third of the second fluid, rejoins the remaining portion of the second fluid, e.g., approximately two thirds of the second fluid. In some embodiments, the blended second fluid has a temperature of approximately 26.4° C. at the splitter tee 4213. The blended second fluid then together follows the fluid paths 4200*e*, 4200*m* towards the exit of the second circuit 4200.

Alternatively, depending upon the degree or percentage opening of the flow balancing or flow control valve 4200*k*, flow balancing or flow control valve 4200*k* can allow either partial or complete divergence of flow from the main condenser 1300 to the trim condenser 1200*b* or force flow in fluid paths 4200*h* and 4200*e* entirely through main condenser 1300.

In some embodiments, the third circuit 4300 does not include the atmospheric sub-cooler exchanger 1200*a* or the trim condenser 1200*b*. Rather, the third circuit 4300 includes a trim chiller which is configured to cool the entire IT data center.

In one embodiment, the second circuit 4200 may exclusively have only one cooling mode, either the simple free-cooling mode or the mechanical compressed cooling mode described above.

In another embodiment, the second circuit 4200 may have both of the cooling modes that alternate with each other. For instance, the second circuit 4200 switches to the simple free-cooling mode when the wet-bulb temperature is at or below a threshold temperature, e.g., 17.2° C., and switches to the mechanical compressed cooling mode once the wet-bulb temperature exceeds the threshold temperature.

In other embodiments, the two cooling modes cooperate with other, and the second circuit 4200 may operate in both cooling modes concurrently. In these embodiments, the simple free-cooling mode is always on such that the simple free-cooling mode remains active regardless of the wet-bulb temperature. On the other hand, the mechanical compressed cooling mode, e.g., the third circuit 4300, is activated only when the simple free-cooling mode alone cannot maintain the second fluid at or below the threshold temperature, e.g., 18.9° C., such as when the wet-bulb temperature is above the threshold temperature, e.g., 17.2° C. In these embodiments, when the wet-bulb temperature is at or below its threshold temperature, the second circuit 4200 relies solely on the atmosphere for cooling. Once the wet-bulb temperature reaches beyond its threshold temperature, the third circuit 4300 is activated and is controlled to generate cooling capacity in proportion to the wet-bulb temperature that is in excess of the threshold temperature. It is envisioned that the third circuit 4300 can be turned on and off automatically without user intervention. For instance, the atmospheric sub-cooler exchanger 1200*a* automatically becomes active or inactive as the wet-bulb temperature crosses its threshold temperature.

Statistically, the cooling system 4000 operates exclusively in the simple free-cooling mode for approximately 95% of the operating time. The mechanical compressed cooling mode is turned on for approximately 5% of the operating time. In a geographical area where the wet-bulb temperature is about 18.3° C., the cooling system 4000 may run exclusively in the simple free-cooling mode virtually all year round and turns on the mechanical compressed cooling mode for less than 0.04% of the operating time. If the area has a wet-bulb temperature of about 20.6° C., the mechanical compressed cooling mode is active for about 3% of the operating time. In all these scenarios, a traditional, large, oversized cooling electrical infrastructure as in the prior art would rely on mechanical compression cycles for about 40-60% of its operating time, thus inducing a much higher operation cost than that of the cooling system 4000.

In addition to the second circuit 4200, the fourth circuit 4400 may also perform heat exchange with the first circuit 4100. Specifically, the fourth circuit 4400 interfaces with the first circuit 4100 at the refrigerant liquid receiver 4128 where the fourth circuit 4400 condenses and cools the first fluid via a fourth fluid that flows through the fourth circuit 4400. The refrigerant liquid receiver 4128 has a sub-cooler coil 4129, which is an evaporator thermally coupled to both the first circuit 4100 and the fourth circuit 4400.

The fourth circuit 4400 includes a sub-cooler compressor 4410 configured to compress the fourth fluid and a sub-cooler condenser 1300*a*, which transfers heat from the fourth circuit 4400 to the second circuit 4200. Both the sub-cooler compressor 4410 and the sub-cooler condenser 1300*a* are fluidly coupled to the sub-cooler coil 4129 of the refrigerant liquid receiver 4128.

The fourth circuit 4400 includes a fluid path 4400*a* that carries the fourth fluid from the receiver sub-cooler coil 4129 to a suction side of the sub-cooler compressor 4410 for compression, a fluid path 4400*b* that carries the compressed fourth fluid from the sub-cooler compressor 4410 to the sub-cooler condenser 1300*a*, and a fluid path 4400*c* that carries the fourth fluid from the sub-cooler condenser 1300*a* to a thermal expansion valve 4420, which expands the fourth fluid and provides the expanded fourth fluid to the sub-cooler coil 4129.

In some embodiments, the fourth circuit 4400 is automatically turned on and off based on the conditions detected by the refrigerant liquid receiver 4128. For instance, the fourth circuit 4400 becomes active when the liquid level detected by the refrigerant liquid receiver 4128 drops below a predetermined threshold. Specifically, the fourth circuit 4400 may be activated in response to an alarm signal generated by the liquid level controller 4127 when a low liquid level is detected, and may become inactive when the liquid level reaches the predetermined threshold. Further, the fourth circuit 4400 may also be controlled based on the temperature of the first fluid as detected by the refrigerant liquid receiver 4128. For instance, the fourth circuit 4400 may become active when the temperature of the first fluid exceeds a predetermined threshold, and become inactive when the temperature drops to or below the predetermined threshold.

The second circuit 4200 removes heat from the fourth circuit 4400 at the sub-cooler condenser 1300*a*. In some embodiments, the second circuit 4200 includes a splitter tee 4205 on the fluid path 4200*d*. The splitter tee 4205 includes a split path 4200*b* that diverts a small portion of the second fluid, e.g., approximately 19 liters/minute, to an inlet of the sub-cooler condenser 1300*a* where the small portion of the second fluid extracts heat from the fourth circuit 4400. The remaining, undiverted portion of the second fluid follows the fluid path 4200*d* to the main condenser 1300 to remove heat from the first circuit 4100.

The second circuit 4200 may also include another splitter tee 4215 on the fluid path 4200*e*. The splitter tee 4215 has a split branch 4200*c* that carries the small portion of the second fluid returned from an outlet of the sub-cooler condenser 1300*a* to the fluid path 4200*e* to join the rest of the second fluid proceeding towards the exit of the second circuit 4200. In one embodiment, the temperature of the second fluid at the splitter tee 4215 is approximately 26.4° C. when the fourth circuit 4400 is active, i.e., when the sub-cooler condenser 1300*a* is turned on, and approximately 26.7° C. when the fourth circuit 4400 is inactive, i.e., when the sub-cooler condenser 1300*a* is turned off.

The close-coupled cooling system 4000 may be installed in an auxiliary enclosure of a modular data pod and may provide chillerless cooling within a data enclosure of the modular data pod in high wet-bulb temperature applications. For example, the dedicated close-coupled cooling systems 525, 626, 727, 828, 1020, and 828' of FIGS. 2A-2D and 2F-2G, respectively, may include the close-coupled cooling system 4000 of FIG. 6.

The operation of the close-coupled cooling system 4000 may be summarized as follows. In the free-cooling mode of operation, the first cooling circuit 4100, which includes the liquid receiver 4128 and the liquid refrigerant pump 4120, and the second cooling circuit 4200, which includes the main condenser 1300, are in operation to transfer heat from the modular data pods 50, 60, 70, 80, 80', 90, or 100 described above via the fluid supply path 4100*a* and fluid return path 4100*b* and to reject heat to the environment via the low temperature supply path 4200*a* and via primary cooling coil cooling water return connection 4200*m*.

When the environmental conditions preclude exclusive reliance on the free-cooling mode of operation, e.g., if the wet-bulb temperature is at or exceeds a predetermined wet-bulb temperature limit, or if there is an increase in the heat load generated within the modular data pods 50, 60, 70, 80, 90, 100, or 80', the close-coupled cooling system 4000 is placed into an incremental, mechanical-assist cooling mode of operation. In the incremental, mechanical-assist cooling mode of operation, first cooling circuit 4100 and the second cooling circuit 4200 as described above with respect to the free-cooling mode of operation continue to remain in operation while the third cooling circuit 4300, which includes the trim condenser 1200*b*, the sub-cooler exchanger 1200*a*, and the sub-cooler compressor 4310, is placed into operation to permit incremental, additional cooling of the modular data pods 50, 60, 70, 80, 90, 100, or 80' such that the cooling capacities of the first, second, and third cooling circuits 4100, 4200, and 4300, respectively, are adjusted incrementally depending on the change in heat load from the modular data pods 50, 60, 70, 80, 90, 100, or 80' and/or any change in environmental conditions based on the wet-bulb temperature.

In an alternative incremental, mechanical-assist cooling mode of operation, the first cooling circuit 4100 and the second cooling circuit 4200 as described above with respect to the free-cooling mode of operation continue to remain in operation while the fourth cooling circuit 4400, which includes the sub-cooler condenser 1300*a* and the sub-cooler compressor 4410, is placed into operation to permit incremental, additional cooling of the modular data pods 50, 60, 70, 80, 90, 100, or 80' such that the cooling capacities of the first, second, and fourth cooling circuits 4100, 4200 and 4400, respectively, are adjusted incrementally depending on the increase or decrease in heat load from the modular data pods 50, 60, 70, 80, 90, 100, or 80' and/or any change in environmental conditions based on the wet-bulb temperature.

When the environmental conditions and/or the heat load from the modular data pods 50, 60, 70, 80, 90, 100, or 80' preclude exclusive reliance on the free-cooling mode of operation together with either one of the incremental mechanical-assist modes of operation, the close-coupled cooling system 4000 is placed into a supplemental, incremental, mechanical-assist mode of operation. In the supplemental, incremental, mechanical-assist mode of operation, the first cooling circuit 4100, the second cooling circuit 4200, and the third cooling circuit 4300 as described above with respect to the incremental, mechanical-assist mode of operation continue to remain in operation while the fourth cooling circuit 4400 is placed into operation to permit incremental, additional cooling of the modular data pods 50, 60, 70, 80, 90, 100, or 80' such that the cooling capacities of the first, second, third, and fourth cooling circuits 4100, 4200, 4300, and 4400, respectively, are adjusted incrementally depending on the increase or decrease in heat load from the modular data pods 50, 60, 70, 80, 90, 100, or 80' and/or any increase in environmental conditions based on the wet-bulb temperature.

The cooling system 4000 has many significant advantages over traditional cooling systems, such as chilled water systems, chiller plants, or direct expansion cooling systems. First, the cooling system 4000 requires far less mechanical-assisted cooling infrastructure than traditional cooling systems. The cooling system 4000 increases its use of mechanical-assisted cooling infrastructure only when necessary. Specifically, the cooling system 4000 has two basic circuits, i.e., the first circuit 4100 and the second circuit 4200, which run constantly, and two backup circuits, i.e., the third circuit 4300 and the fourth circuit 4400, which run only when necessary. Specifically, the third circuit 4300 is active only when the wet-bulb temperature is above the threshold temperature, and the fourth circuit 4400 is active only when the first fluid liquid level is low or the first fluid temperature is above a certain threshold. Since the two backup circuits operate only when necessary, e.g., approximately 10-20% of the operating time, the cooling system 4000 overall relies on less mechanical-assisted cooling infrastructure than the traditional cooling system.

Second, the cooling system 4000 is less prone to failures than the traditional cooling system. Specifically, the cooling system 4000 completely avoids a full system swing over process that is common in the traditional cooling system. A full system swing over process switches between two systems by shutting down one system and starting up another, which typically happens when the traditional cooling system switches between a free cooling system and a mechanical cooling system. The full system swing over process is dangerous and prone to failures. The cooling system 4000, on the other hand, avoids the full system over process. In the cooling system 4000, the basic circuits and the backup circuits run independently, yet cooperating with each other. The basic circuits 4100 and 4200 run continuously regardless of the state of the backup circuits 4300 and 4400. The backup circuits 4300 and 4400 are turned on only when necessary. Accordingly, the cooling system 4000 avoids the failures in the full system swing over process, and is a safer approach than the traditional cooling system.

Third, the cooling system 4000 has a higher tolerance for high wet-bulb temperatures than the traditional cooling system. The traditional cooling system generally has a very high operation cost when the wet-bulb temperature is above 10° C. For instance, the maximum wet-bulb temperature that the traditional cooling system can survive in a free-cooling mode is approximately 10° C. When the wet-bulb temperature exceeds 10° C., the traditional cooling system must switch from a free cooling system to a mechanical cooling system to provide sufficient cooling to an IT data center. For about every half degree above 10° C., the mechanical cooling system has to generate an additional cooling capacity of 91 tons, which demands the traditional cooling system to acquire sufficient power to generate the additional cooling capacity.

On the other hand, the cooling system 4000 of the present disclosure has a better tolerance for high wet-bulb temperatures. In some embodiments, the maximum wet-bulb temperature that the cooling system 4000 can survive in a free-cooling mode is approximately 17.2° C., much higher than that of the traditional cooling system. Once the wet-bulb temperature exceeds 17.2° C., the cooling system 4000 switches to the mechanical compressed cooling mode. For every half degree above 17.2° C., the mechanical compressed cooling mode generates an additional cooling capacity of 13 tons, which, in turn, consumes significantly less power than the traditional cooling system. Because of its high tolerance for high wet-bulb temperature, the cooling system 4000 is better suited for a high density IT data center, e.g., 40 kW per rack, than the traditional cooling system.

Fourth, the cooling system 4000 is more energy efficient than the traditional cooling system. The cooling system 4000 maximizes energy savings by having the simple free-cooling mode which relies on atmosphere to assist cooling the IT data center. In the simple free-cooling mode, the cooling system 4000 consumes a limited of power, which, for instance, is 15% less than what is required to power the traditional cooling system. Further, the cooling system 4000 adjusts its power consumption dynamically as a function of the load in the IT data center. As the load increases, the cooling system 4000 increases its power consumption level to cause an increase in the flow rates in the two basic circuits and/or activate one or both of the backup circuits, which, in turn, generate more cooling capacity to compensate for the load increase. By contrast, as the load decreases, the cooling system 4000 decreases its power consumption level which, in turn, reduces its output of cooling capacity.

Fifth, the cooling system 4000 is more scalable to the size of the IT data center and easier deployable than the typical cooling system. For instance, the cooling system 4000 can be deployed modularly at specific, targeted locations in an IT data center, in contrast to the typical cooling system which has to be deployed as a whole covering the full extent of the IT data center. Due to its modularity, the cooling system 4000 targets specific locations in the IT data center and avoids locations that do not need cooling. Also due to its modularity, the cooling system 4000 can be deployed on existing and retrofit cooling systems which the typical cooling system fails to do. Further, the number of cooling systems 4000 deployed in an IT data center may be scaled according to the dynamic change, e.g., shrink or growth, of the IT data center.

Lastly, the cooling system 4000 has a lower overall cost than that of the traditional cooling system. For instance, the cooling system 4000 requires relatively low initial capital and maintenance. Further, due to its energy efficiency, the cooling system 4000 has a low operation cost. As a result, the cooling system 4000 is more cost effective than the traditional cooling system. Because of its overall low cost, in addition to its high tolerance for high wet-bulb temperature, the cooling system 4000 is an optimal cooling choice for the high density IT data center, e.g., 40 kW per rack.

Thus, a control strategy is employed to enable close system pressure and flow tolerances utilizing bypass control valves, temperature and pressure sensors, and receiver safeties and pressure regulators. This control strategy may be executed in real time and is relational with dynamic control of all components. The control strategy incorporates feed back from the IT servers to better facilitate close-coupled cooling based on real-time individual loading of the rack servers and computer loads.

One of the benefits of the dedicated close-coupled cooling systems (e.g., 525) is that they can adapt to the different heat loads that are generated by different servers contained in the modular data pods. As a result, the dedicated close-coupled cooling systems can operate efficiently. In contrast, traditional cooling systems for data centers and data pod modules are typically designed for and operate at the worst case conditions for a particular computer design. Also, traditional cooling systems cool all data pod modules according to the data module with the greatest heat load.

Figure 7:
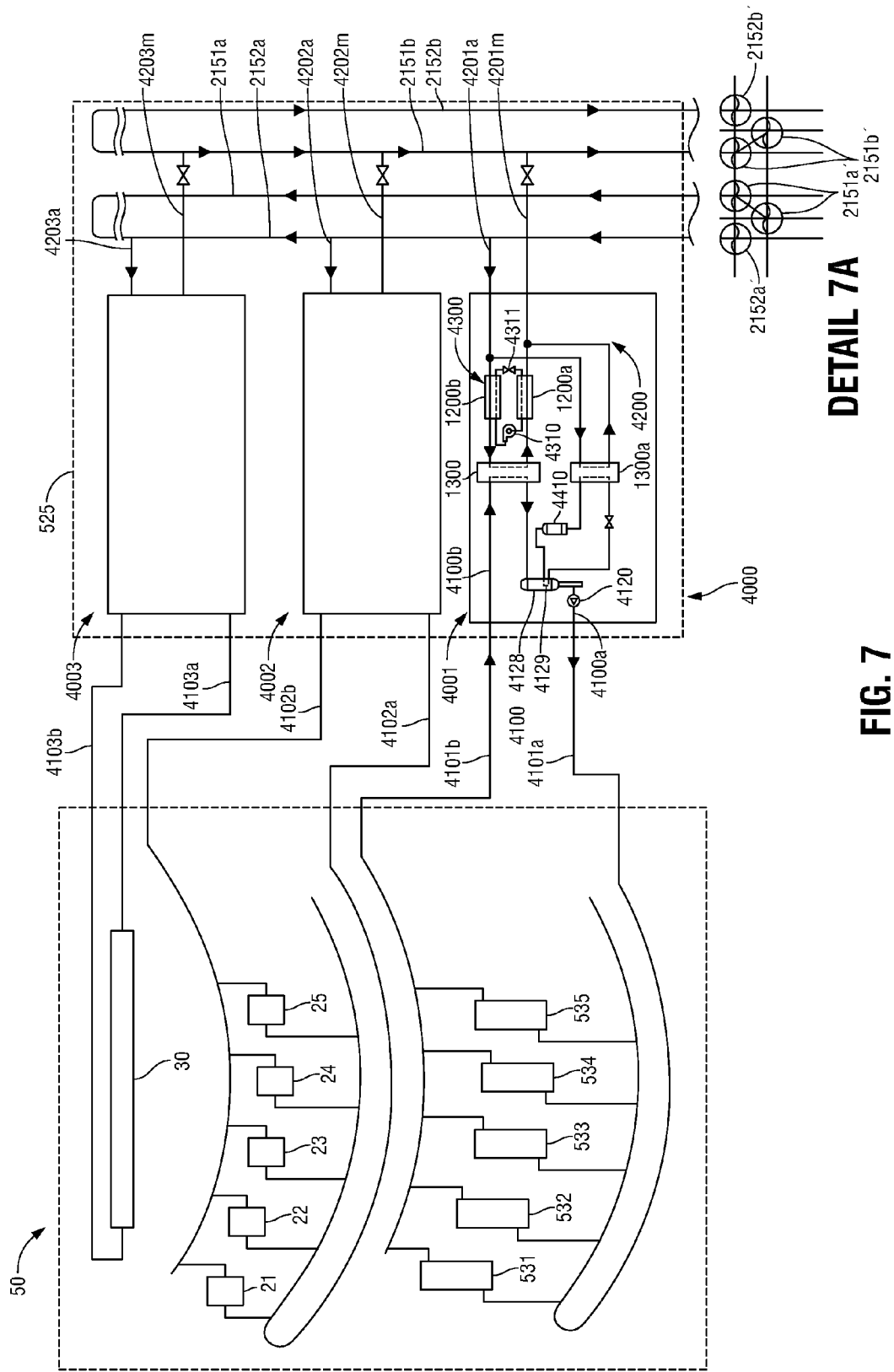
FIG. 7 is a schematic diagram of a refrigerant-cooled cooling system that includes the close-coupled cooling system of FIG. 6 for modular data pods according to embodiments of the present disclosure.

FIG. 7 is a schematic diagram of a dedicated close-coupled hybrid refrigerant-cooled and water-cooled cooling system for modular data pods. In the exemplary embodiment of FIG. 7, dedicated close-coupled hybrid refrigerant-cooled and water-cooled cooling system 525 of FIG. 2A incorporates cooling system 4000 of FIG. 6, which is illustrated as being applied to modular data pod 50 of FIG. 2A in the form of three independent and individually-pumped refrigerant cooling coil circuits 4001, 4002, and 4003.

The dedicated close-coupled cooling system 525, which may allow for chillerless operation, is housed within an auxiliary enclosure or compartment 515, as described above with respect to FIG. 2A. The dedicated close-coupled cooling system 525 includes the three independent and individually-pumped refrigerant cooling coil circuits 4001, 4002 and 4003 that are each similar to the cooling system 4000 of FIG. 6. For the purposes of clarity, the refrigerant cooling coil circuits 4001 are illustrated as simplified versions of the cooling system 4000 of FIG. 6, but may include each of the features of cooling system 4000 of FIG. 6. Those skilled in the art will recognize that cooling circuits 4002 and 4003 also may include each of the features of cooling system 4000 of FIG. 6.

Thus, the cooling circuits 4001, 4002, and 4003 may each include the first cooling circuit 4100, the second cooling circuit 4200, the third cooling circuit 4300, and the fourth cooling circuit 4400 respectively. As described above with respect to FIG. 6, if the wet-bulb temperature is at or exceeds a predetermined wet-bulb temperature limit, the second fluid circuit 4200 is placed into operation to sub-cool the first fluid flowing through the first cooling circuit 4100. Operation of the second fluid circuit 4200 includes operation of the compressor 4310, the sub-cooler exchanger 1200a and trim condenser 1200b, and the refrigerant fluid receiver 4128 that is designed to provide stable liquid levels at the inlet to liquid refrigerant pump 4120.

The first circuit 4001 includes fluid supply path 4100a and fluid return path 4100b that are fluidly coupled to primary cooling vertical coils 531 to 535, adjacent to rear sides 501a to 505a of server racks 501 to 505, respectively. Primary vertical coils 531 to 535 are in fluidic communication with refrigerant gas fluid supply path 4100a via first refrigerant cooling gas supply connection header 4101a. The refrigerant gas passes through the primary vertical coils 531 to 535 to cool the server racks 501 to 505, respectively. The refrigerant gas is then discharged to refrigerant cooling gas return connection header 4101b that is in fluidic communication with the electronic equipment and fluid return path 4100b described above with respect to FIG. 6.

The second circuit 4002 includes (N+1) secondary cooling vertical coils 21 and 22 as described above with respect to modular data pod 10 in FIG. 3 plus additional (N+1) vertical cooling coils 23, 24, and 25 that are not explicitly illustrated in FIG. 3. Secondary vertical coils 21 to 25 are in fluidic communication with refrigerant gas fluid supply path 4100a via first refrigerant cooling gas supply connection header 4102a. The refrigerant gas passes through the secondary vertical coils 21 to 25, which are generally positioned in proximity to server racks 501 to 505 to cool the server racks 501 to 505, respectively. The refrigerant gas is then discharged to refrigerant cooling gas return connection header 4102b that is in fluidic communication with the electronic equipment and fluid return path 4100b described above with respect to FIG. 6.

Similarly, the third circuit 4003 includes one or more (N+2) cooling coils, such as third cooling coil 30 that is disposed on the suction sides of the air circulators 16a, 16b, 16c for further cooling of the air circulating through the air circulators 16a, 16b, 16c, as described above with respect to FIG. 3. In a similar manner, third cooling coil 30 is in fluidic communication with refrigerant gas fluid supply path 4100a via first refrigerant cooling gas supply connection header 4103a. The refrigerant gas passes through the third cooling coil 30 that is generally positioned above server racks 501 to 505 to cool the server racks 501 to 505, respectively. The refrigerant gas is then discharged to refrigerant cooling gas return connection header 4103b that is in fluidic communication with the electronic equipment and fluid return path 4100b described above with respect to FIG. 6.

In general, in conjunction with FIG. 6, in the initial configuration, the first cooling circuit 4001 is in fluidic communication with the primary vertical cooling coils 531 to 535 and with the cooling water supply header 2152a via the primary cooling coil cooling water supply connection 4201a, which is in fluidic communication with the first low temperature supply path 4200a and via the primary cooling coil cooling water return connection 4200m, which is in fluidic communication with the first high temperature return path 4200m. The primary cooling coil cooling water return connection 4200m is in fluidic communication with a cooling water return header 2151b. The cooling water supply header 2152a may also be in fluidic communication with a second cooling water supply header 2151a. Similarly, the cooling water return header 2151b may also be in fluidic communication with a second cooling water return header 2152b.

As the heat load within the modular data pod 50 increases, the secondary (N+1) vertical cooling coils 21 to 25 can be installed and the second cooling circuit 4002 is connected to the secondary vertical cooling coils 21 to 25 and to the cooling water supply header 2152a via the second cooling coil cooling water supply connection 4202a, which is in fluidic communication with the first low temperature supply path 4200a, and via the second cooling coil cooling water return connection 4202m, which is in fluidic communication with the first high temperature return path 4200m. The second cooling coil cooling water return connection 4202m is in fluidic communication with the cooling water return header 2151b.

As the heat load within the modular data pod 50 further increases, the one or more third (N+2) cooling coils 30 can be installed and the third cooling circuit 4003 is connected to the one or more third cooling coils 30 and to cooling water supply header 2152a via third cooling coil cooling water supply connection 4203a, which is in fluidic communication with the first low temperature supply path 4200a, and via third cooling coil cooling water return connection 4203m which is in fluidic communication with first high temperature return path 4200m. Third cooling coil cooling water return connection 2313b is in fluidic communication with cooling water return header 2151b.

Detail 7A in FIG. 7 illustrates that supply header 2151a can be physically installed with a loop or pipe bend 2151'a to provide a longer total length as compared to the alternate supply header 2152a for the purposes of providing reverse return capability.

Similarly, return header 2151b can be physically installed with a loop or pipe bend 2151b' to provide a longer total length as compared to the alternate return header 2152b for the purposes of providing reverse return capability.

Thus, the first, second, and third cooling circuits 4001, 4002, 4003, respectively, can be installed and operated in a staged or as-needed manner, in a single modular data pod, depending upon the heat load. When the second and third cooling systems 4002 and 4003 are not used, all or a portion of the fourth fluid in the fluid receiver 4128 may change to the vapor state. To counter this occurrence, the fourth circuit 4400, which includes the subcooler condenser 1300a, can be operated to maintain a liquid level in the refrigerant liquid receiver 4128.

The three refrigerant cooling coil circuits 4001, 4002, and 4003 may use R-134a (i.e., 1,1,1,2-Tetrafluoroethane) refrigerant. In other embodiments, one or more of the circuits may use other refrigerants known to those skilled in the art. Each circuit 4001, 4002, and 4003 has its own liquid refrigerant pump 4120. Each circuit may also include a secondary or redundant pump (not shown).

FIG. 7 also shows water-cooled condensers 1300. In other embodiments, the cooling system can use air-cooled condensers or other types of condensers. Each condenser circuit includes energy-efficient controls to maintain, optimize, and manage the refrigerant and cooling water circuits. The cold-water side of the cooling system can use any medium for rejecting heat, e.g., air-cooled systems, cooling towers, fluid coolers, glycol water-cooled system, and geothermal systems.

The control and regulation of the refrigerant temperature is managed by water-regulating valves that regulate the temperature of the liquid refrigerant based on a given set point. The cooling system includes control logic that monitors the interior conditions of the modular data pods and regulates the cooling system output based on the internal temperature and specific rack-loading requirements. The deionized water or refrigerant circuits may each include redundant pumps. The pumps are driven VFDs and are controlled according to various control strategies. The control strategies may incorporate demand loading at the server and rack locations according to cloud-computing technology.

Figure 8:
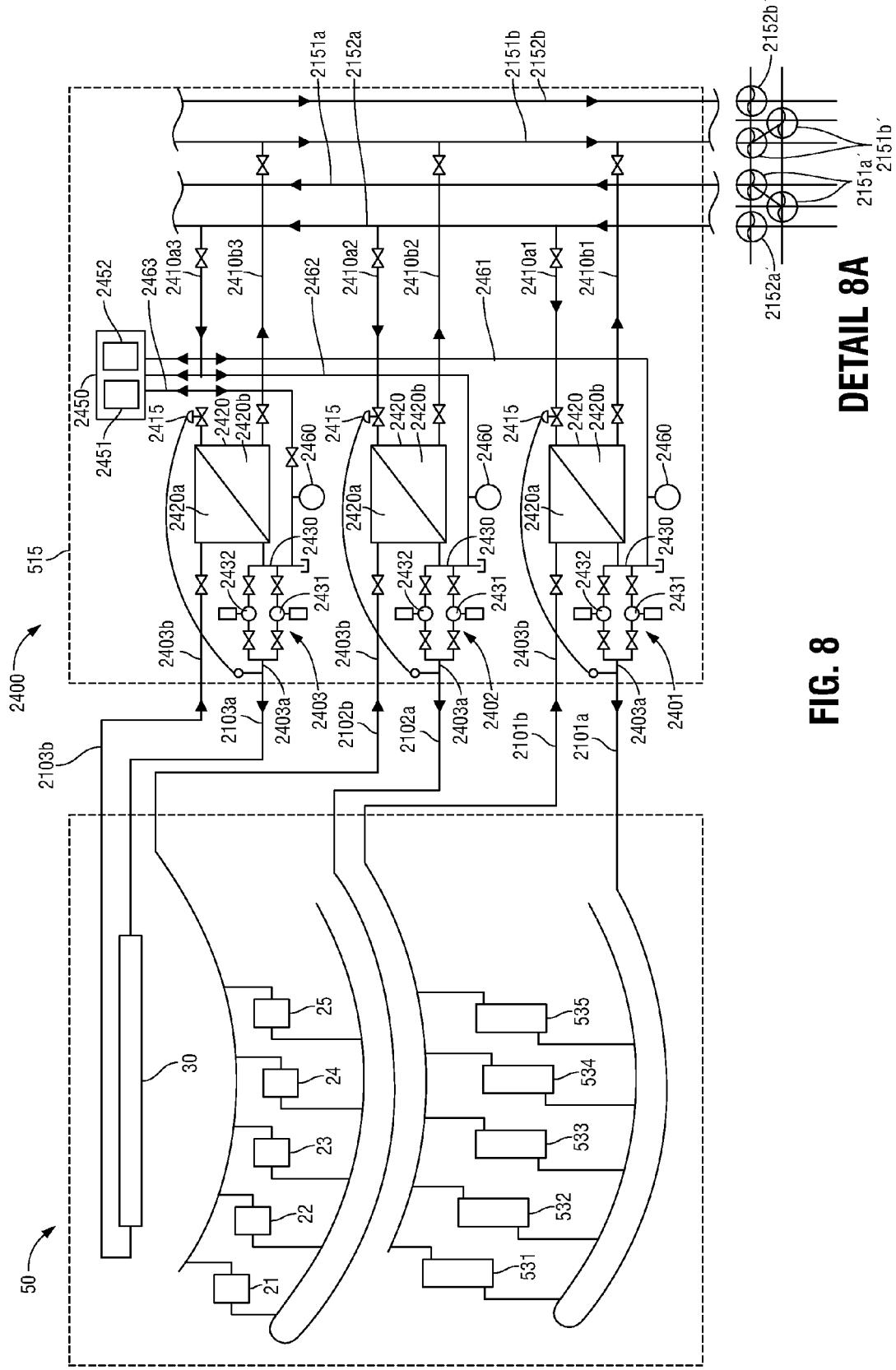
FIG. 8 is a schematic diagram of a water-cooled air-conditioning system that includes an external chiller according to embodiments of the present disclosure.

FIG. 8 is a schematic diagram of an exemplary embodiment of a dedicated close-coupled water-cooled cooling system 2400 as applied to modular data pod 50 showing the flow of cooling water, e.g., deionized (nonconductive) water. Water-cooled cooling system 2400 includes three independent and individually pumped deionized water cooling coil circuits 2401, 2402, and 2403 installed within auxiliary enclosure 515 of modular data pod 50. The circuits of FIG. 8 are similar to the circuits of FIG. 6 except that the dedicated close-coupled cooling water system 2000 of FIG. 7 is now replaced in FIG. 8 by a dedicated close-coupled cooling water system 2400, which includes heat exchangers, and the cooling system 2400 of FIG. 8 further includes a deionized water source (not shown) in fluidic communication with a dedicated external chiller skid 2450 housed within the auxiliary enclosure 515.

The dedicated external chiller skid 2450 is illustrated as including a first mechanical assist chiller 2451 and a redundant second mechanical assist chiller 2452. Each of the cooling coil circuits 2401, 2401, and 2403 includes a heat exchanger 2420 having a deionized water side 2420a and a cooling water side 2420b. On the deionized water side 2420a, deionized water is discharged from the heat exchanger 2420 via a deionized cooling water supply line 2403a located within the auxiliary enclosure 515. The deionized cooling water supply line 2403a includes redundant pumps 2431 and 2432 having a common pump suction header 2430. Heated water returning from the modular data pod 50 is returned to the heat exchanger 2420 via deionized cooling water return line 2403b where heat is exchanged between the deionized water side 2420a of the heat exchanger 2420 and the cooling water side 2420b of the heat exchanger 2420.

The cooling water side 2420b of heat exchanger 2420 is in fluidic communication with the cooling water supply header 2152a via a first cooling water supply line 2410a1. The cooling water side 2420b of heat exchanger 2420 is also in fluidic communication with the cooling water return header 2151b via a first cooling water return line 2410b1. In a similar manner as described above with respect to Detail 7A of FIG. 7 Detail 8A shows that the cooling water supply header 2152a may be in fluidic communication with a second cooling water supply header 2151a. Similarly, cooling water return header 2151b may be in fluidic communication with a second cooling water return header 2152b.

The mechanical assist chillers 2451 and 2452 are in fluidic communication with the common pump suction header 2430 via a first deionized chilled water supply and a return line 2461 that is in fluidic communication with an expansion tank 2460. The mechanical assist chillers 2451 and 2452 alternately draw deionized water from the expansion tank 2460 to remove heat during the cooling phase of operation of the mechanical assist chillers 2451 and 2452 and discharge the cooled deionized water back to the expansion tank 2460 and pump suction header 2430.

Those skilled in the art will recognize that although the deionized chilled water supply and return are illustrated as occurring in an alternating sequence via first chilled water supply and return line 2461, the deionized chilled water supply and return can also be effected via separate supply and return lines between the mechanical assist chillers 2451 and 2452 and the common pump suction header 2430. In that case, the mechanical assist chiller skid 2450 includes separate pumping capability (not shown) and separate supply and return lines (not shown) to and from the pump suction header 2430 for a continuous cooling mode of operation.

As described above with respect to the close-coupled cooling system 2000 of FIG. 5, the deionized cooling water supply line 2403a of the first cooling circuit 2401 is in fluidic communication with the first supply connection header 2101a that generally extends into the modular data pod 50 and is in fluidic communication with primary cooling coils 531 to 535. Instead of transporting refrigerant gas, the first supply connection header 2101a transports deionized water through the primary cooling coils 531 to 535, which, in turn, discharge heated deionized water to the first return connection header 2101b that is in fluidic communication with the deionized cooling water return line 2403b.

As described above, the deionized cooling water return line 2403b transports heat to the deionized water side 2420a of the heat exchanger 2420. The flow of cooling water on the cooling water side 2420b of the heat exchanger 2420 is controlled by a temperature or flow control valve that is actuated dependent upon the temperature in the deionized cooling water supply line 2403a of the first cooling circuit 2401.

Similarly, the deionized cooling water supply line 2403a of the second cooling circuit 2402 is in fluidic communication with the second supply connection header 2102a that generally extends into the modular data pod 50 and is in fluidic communication with secondary cooling coils 21 to 25. Again, instead of transporting refrigerant gas, the second supply connection header 2102a now transports deionized water through the second cooling coils 21 to 25, which, in turn, discharge heated deionized water to the second return connection header 2102b that is in fluidic communication with the deionized cooling water return line 2403b. Again, the deionized cooling water return line 2403b transports heat to the deionized water side 2420a of the heat exchanger 2420.

Also, the deionized cooling water supply line 2403a of the third cooling circuit 2403 is in fluidic communication with the third supply connection header 2103a that generally extends into the modular data pod 50 and is in fluidic communication with one or more third cooling coils 30. Again, instead of transporting refrigerant gas, the third supply connection header 2103a transports deionized water through the one or more third cooling coils 30, which, in turn discharges heated deionized water to third return connection header 2103b that is in fluidic communication with deionized cooling water return line 2403b. Again, deionized cooling water return line 2403b transports heat to the deionized water side 2420a of the heat exchanger 2420.

In a similar manner as described above with respect to FIG. 6, if the wet-bulb temperature is at or exceeds a predetermined limit, one or both of the mechanical assist chillers 2451 and 2452 are placed into operation to sub-cool the deionized water flowing through one or more of the cooling circuit 2401, 2402, and 2403.

Thus, the first, second, and third cooling circuits 2401, 2401, and 2403, respectively, can be installed and operated in a staged or as-required manner in an individual modular data pod depending upon the heat load requirements at a particular time after initial installation of the one or more modular data pods.

The heat rejection can also be accomplished using air-cooled condensers or other types of condensers. The cold water side 2420b of the system can include any medium for rejecting heat, e.g., air cooled, cooling towers, fluid coolers, glycol water, and geo thermal. The circuits can have redundant pumps. The control and regulation of the deionized water loop temperature is managed by the control of regulating valves located on the cold side of the heat exchangers. The regulating valves 2415 are opened and closed based on a predetermined set point. The system includes control logic that monitors the interior conditions of the modular data pods and regulates the cooling system output based on internal temperature and specific rack-loading requirements. Portable deionized water and expansion tanks are used to provide water to the cooling system as needed.

Thus, the data pods can use either deionized water or refrigerant cooling coils. Each set of coils have individual circuits that can be used in tandem (to meet high demands) or as redundant back-up circuits. For example, the data pods can use a primary set of coils for typical conditions and one or more supplemental sets of coils for other conditions.

Figure 9:
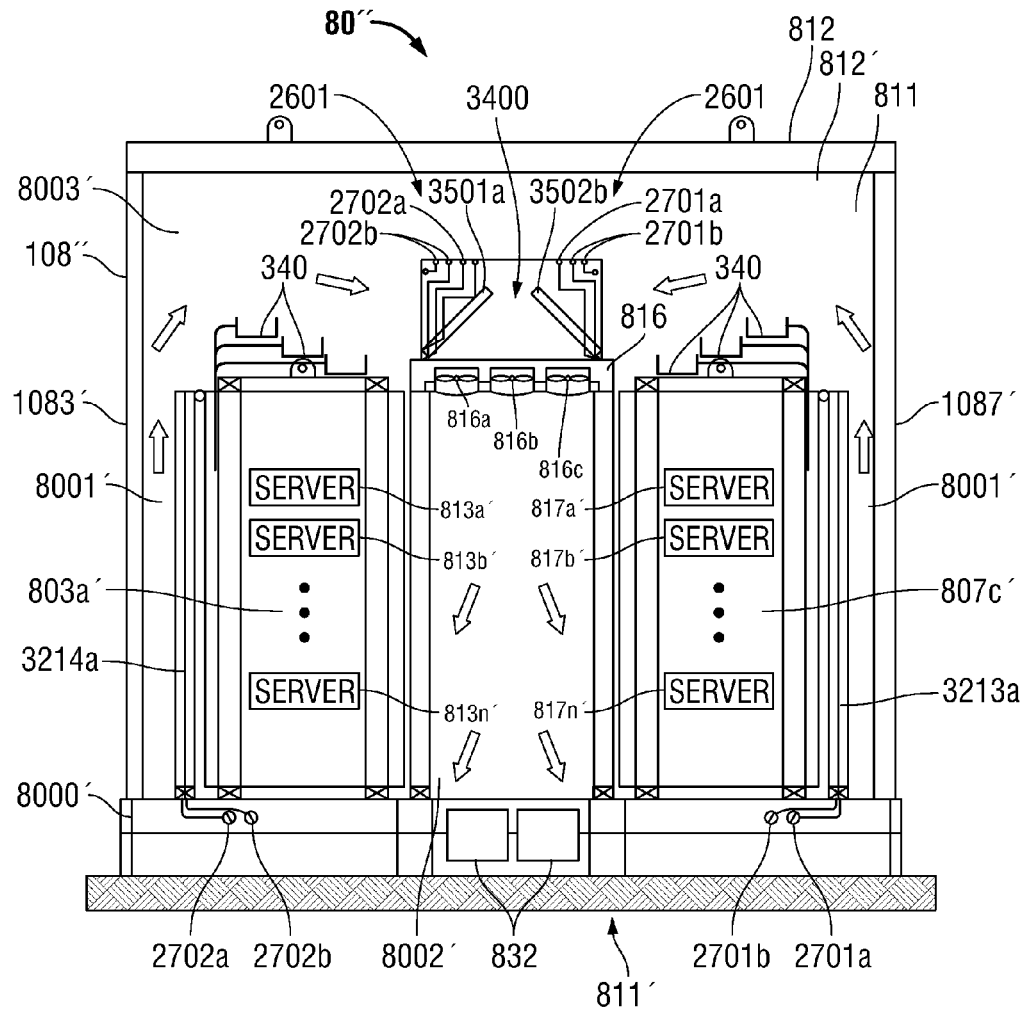
FIG. 9 illustrates a modular data pod that includes a separate cooling circuit that forms an "A-Frame" heat exchanger assembly according to one embodiment of the present disclosure.
Figure 10:
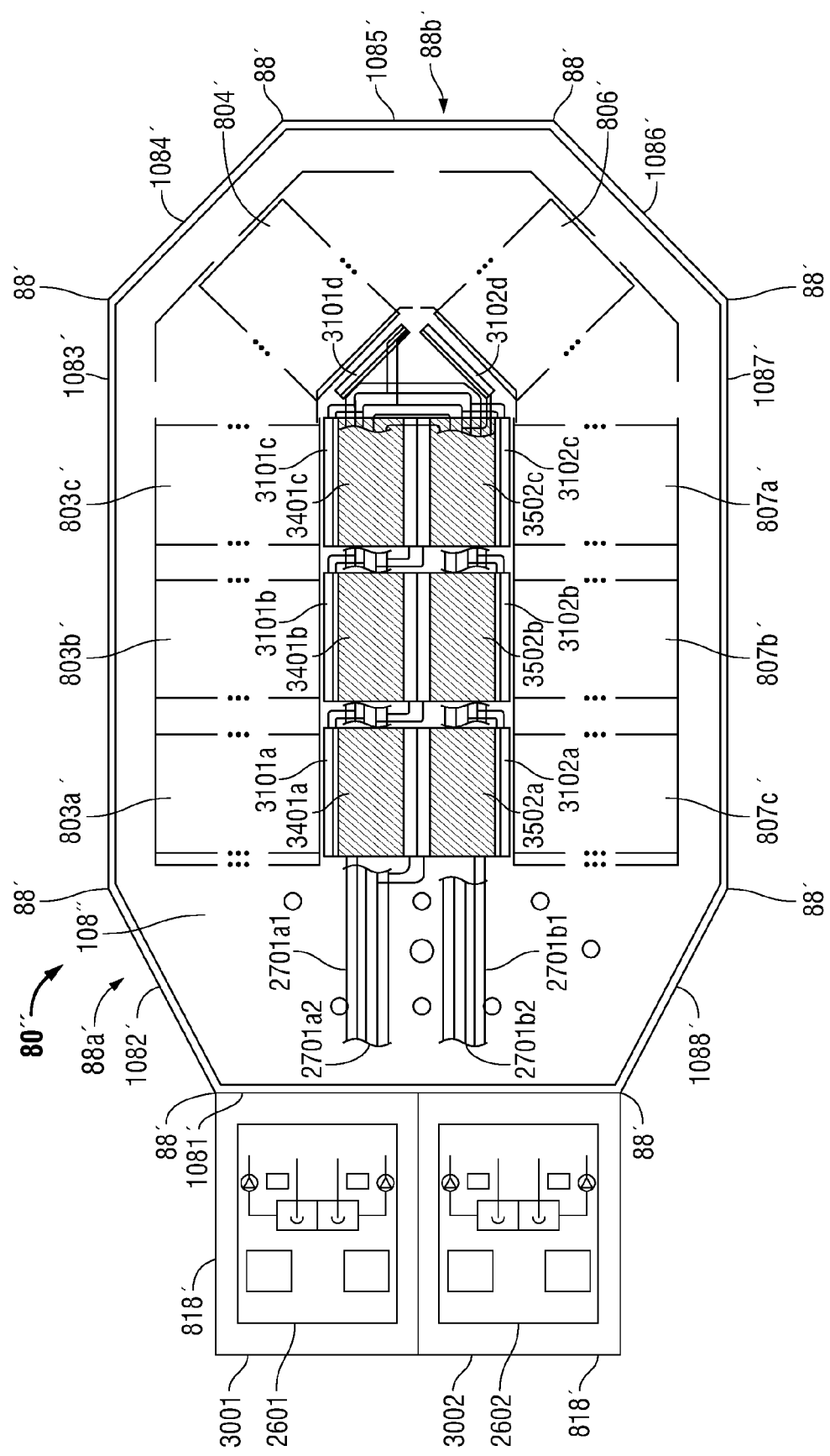
FIG. 10 is an upper plan view of the modular data pod of FIG. 9 that includes the separate cooling circuit that forms an "A-Frame" heat exchanger assembly according to one embodiment of the present disclosure.
Figure 11:
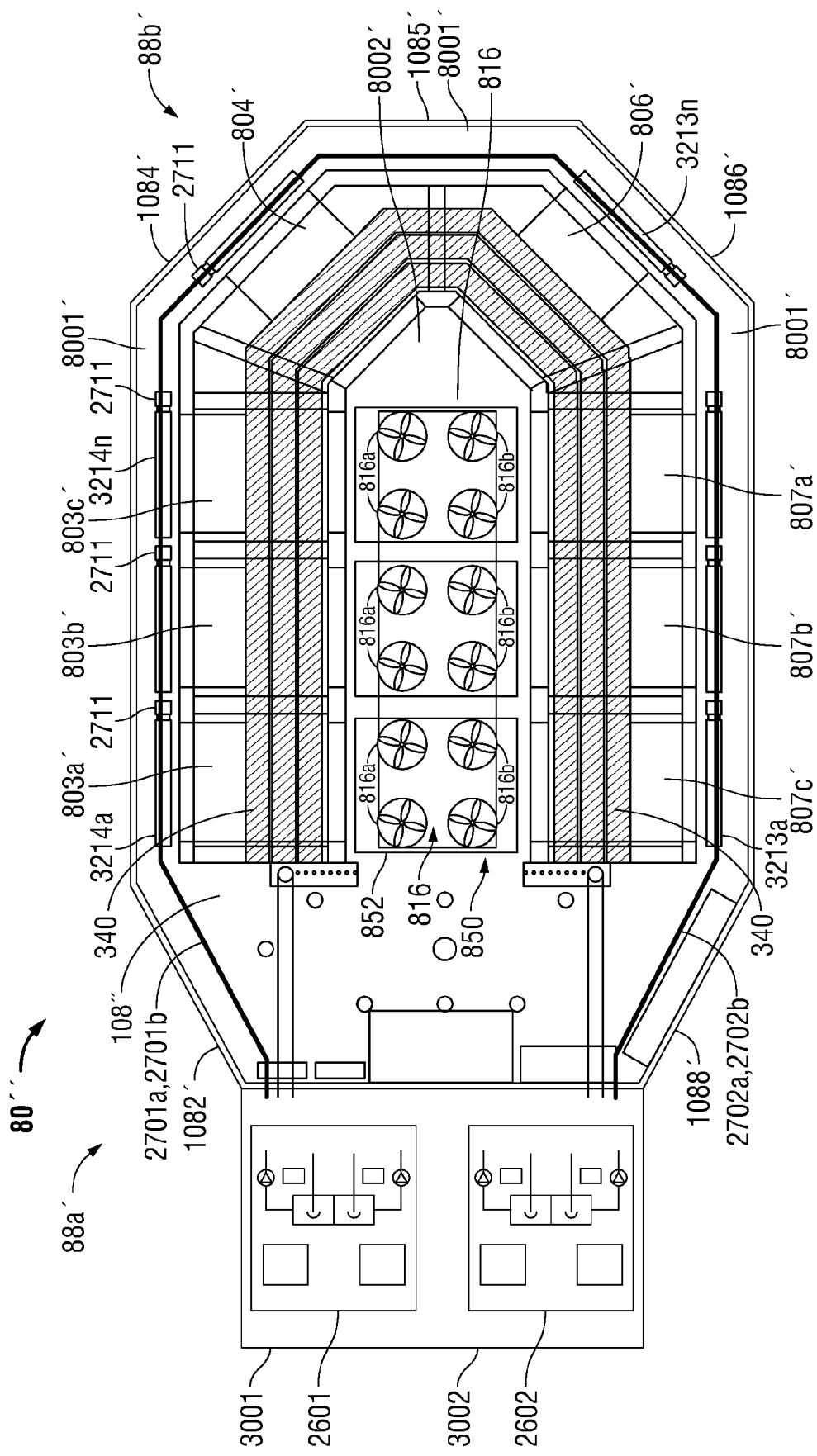
FIG. 11 is a lower plan view of the modular data center pod assembly of FIG. 10 illustrating forced-flow cooling devices that force air vertically through a sump below the central aisle of the modular data center pod assembly.

FIGS. 9-11 illustrate a modular data pod 80" which is similar to the generic modular data pod 10 of FIG. 3 with a few differences. As compared to the generic modular data pod 10 described above with respect to FIG. 3, the modular data pod 80" as illustrated in FIG. 9 includes an additional "A-Frame" cooling circuit 2601. In one embodiment, the "A-Frame" cooling circuit 2601 contains a coolant supplied from a first cooling cycle skid 3001 as discussed below with respect to FIGS. 12 and 13. The "A-Frame" cooling circuit 2601 has an "A-Frame" heat exchanger assembly 3400, which is formed partially of cooling coils 3401a-c and 3502a-c, illustrated in FIG. 10, in conjunction with an air circulator support structure 816 illustrated in FIG. 9.

With reference to FIG. 9, the air circulator support structure 816 includes air circulators 816a, 816b, and 816c that are configured and disposed in a manner to induce air circulation in the following direction. Cold air in the cold aisle 8002' flows downwardly from the top of each server rack 803a' or 807c' to the bottom of the server rack. After the air passes through a server, e.g., 813a' on a server rack, e.g. 803a', the air passes across a heat exchanger 3214a, and then enters a hot aisle 8001' located between the server rack, e.g. 803a', and an external wall member 1083'. Subsequently, the air circulates upwardly into a third volume 8003' to complete one circulation cycle. The air then recirculates through the "A-Frame" heat exchanger assembly 3400 in the same order described above.

The modular data pod 80" is supported on a support structure 8000' which includes fluid supply paths 2701a and 2702a which is part of the first fluid circuit 2071 and fluid return paths 2702a and 2702b which is part of the second fluid circuit 2702 as explained below with respect to FIGS. 12 and 13.

The modular data pod 80" also includes cable trays 340 that are exemplarily mounted above the server racks, e.g., 803a' and 807c'. In one embodiment, the modular data pod 80" includes a dedicated electrical power supply, e.g. one or more batteries 832 located at a lower end 811' of the data pod enclosure 108".

As seen in FIG. 9, the external wall members 1083' and 1087' define an aperture 812' at an upper end 811 of the enclosure 108". A data pod covering member 812 is configured and disposed in a manner to substantially cover the aperture 812'.

FIG. 10 is an upper plan view of the modular data center pod 80". The modular data pod 80" is almost identical to the modular data center pod 80' of FIG. 2G, except that the modular data center pod 80" includes a lesser amount of server racks along each external wall member 1081'-1088'. For instance, the elongated external wall member 1083' includes server racks 803a'-c', and the second end 88b' includes two server racks 804' and 806'. The server racks may be arranged in a "U"-shape as illustrated in FIG. 10, or other shapes.

Modular data pod 80" also includes first heat exchangers 3101a-d mounted above server racks 803a', 803b', 803c', and 804', respectively. Modular data pod 80" also includes second heat exchangers 3102a-d mounted above server racks 807c', 807b', 807a', and 806', respectively.

FIG. 11 is a lower plan view of the modular data center pod 80" illustrating air circulators 816a and 816b disposed below central aisle 850 of the modular data center pod 80" and configured to force air flow vertically upwards through a sump 852. The cable trays 340 exhibit a generally "U-shaped" configuration above the server racks 803a'-c', 804', 806', and 807a'-c'.

Figure 12:
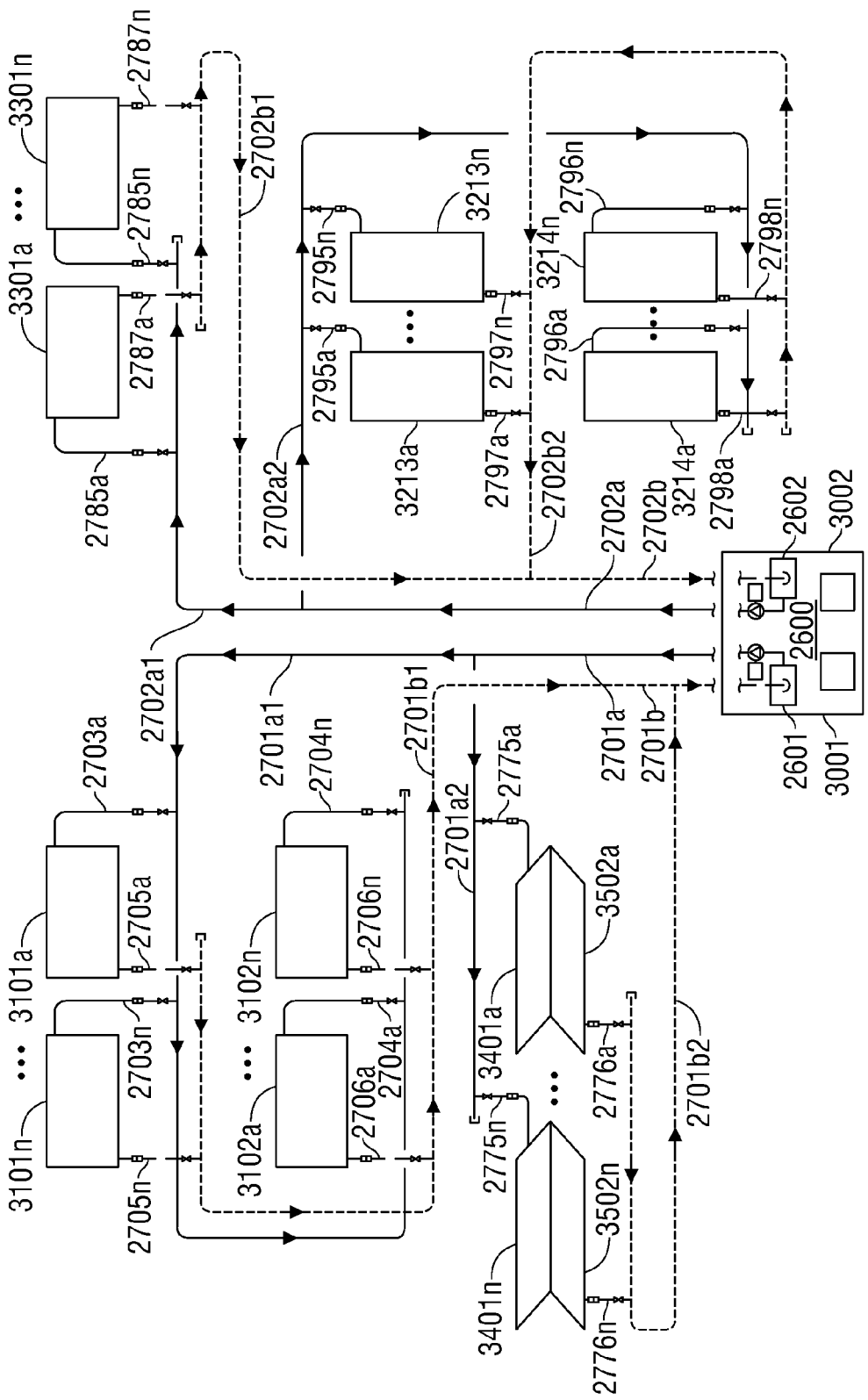
FIG. 12 is a schematic flow diagram of a cooling system for a data center assembly including a close-coupled cooling system according to embodiments of the present disclosure.
Figure 13:
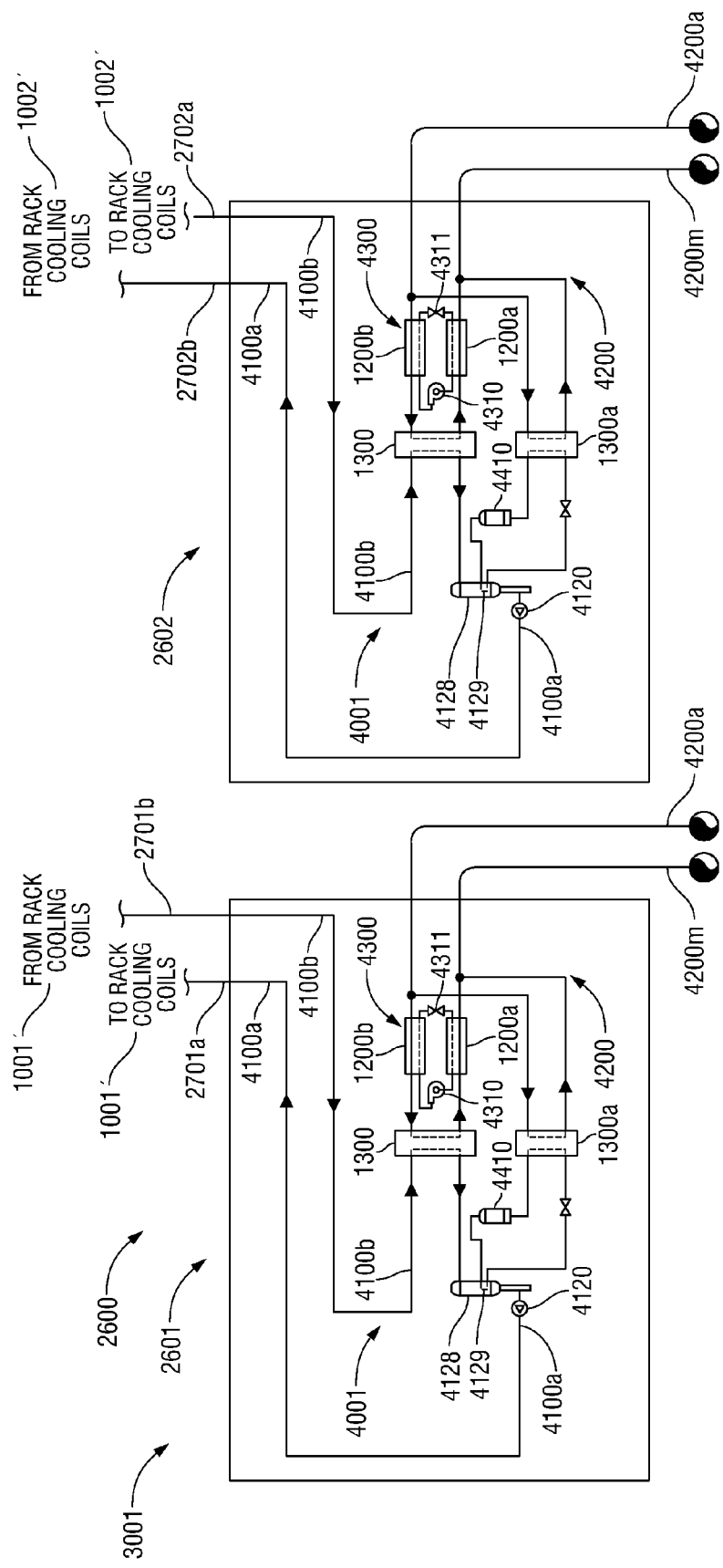
FIG. 13 is a schematic flow diagram of a close-coupled cooling system that can include the cooling system of FIG. 12 according to embodiments of the present disclosure.

In one embodiment, as illustrated in FIGS. 12-13, the modular data center pod 80" may include two "A-Frame" cooling circuits 2601, 2602. For clarity, odd-numbered reference numerals refer to components included in the first cooling circuit 2601 and even-numbered reference numerals refer to components included in the second cooling circuit 2602. Installation and operation of the cooling circuits 2601 and 2602 need not take place concurrently.

The two cooling circuits 2601, 2602 receive coolants supplied from a first cooling cycle skid 3001 and a second cooling cycle skid 3002, respectively.

As shown in FIG. 13, each cooling circuit 2601, 2602 includes a first fluid circuit 2701, 2702, respectively. The first fluid circuits 2701 and 2702 are evaporator circuits that utilize R134a or a similar refrigerant and, in one embodiment, are in thermal fluidic communication with the various heat exchangers of the data center assembly 10 or 10'.

Returning to FIG. 12, each of the first fluid circuits 2701, 2702 includes a fluid supply path 2701a, 2702a and a fluid return path 2701b, 2702b, both of which are in fluid communication with heat exchangers, e.g. 3101a-n, by carrying fluid or refrigerant to and from the heat exchangers. The heat exchangers, e.g., 3101a-n, are placed in close proximity to IT servers or IT racks in the IT data center for providing close-coupled cooling at the point of load.

The first fluid supply path 2701a includes a first branch path 2702a1, which carries coolant or cooling fluid to the first heat exchangers 3101a-n via sub branches 2703a-n and to the second heat exchangers 3102a-n via sub branches 2704a-n. The first fluid return path 2701b carries coolant from the first heat exchangers 3101a-n via sub branches 2705a-n back to the first cooling circuit 2601, and carries coolant from the second heat exchangers 3102a-n via sub branches 2706a-n.

In one embodiment, the first fluid supply path 2701a includes a second branch path 2702a2 that supplies coolant to fourth heat exchangers 3401a-n via sub branches 2775a-n, and then to fifth heat exchangers 3502a-n. The coolant exits the fifth heat exchangers 3502a-n via sub branches 2776a-n to the first fluid return path 2701b via a branch path 2701b2. The coolant removes heat from the fourth and fifth heat exchangers and is converted to a heated fluid as a result.

It is envisioned that the second fluid paths 2702a-b have similar structures and functionalities as that of the first fluid paths 2701a-b to cool heat exchangers 3301a-n, 3213a-n, and 3214a-n.

As the coolant leaves each heat exchanger, the coolant absorbs heat from the heat exchanger and becomes heated fluid, which is then delivered to the inlet of the main condenser 1300 illustrated in FIG. 13 for cooling.

As shown in FIG. 13, the first cooling circuit 2601 includes a cooling system similar to the cooling system 10 of FIG. 6. The first fluid supply path 2701a and the first fluid return path 2701b of the first cooling circuit 2601 are respectively coupled to the first supply path 4100a and the first return path 4100b of the first circuit 100 of the cooling system. In operation, the first fluid return path 2701b carries the heated fluid to the first return path 4100b, which delivers the heated fluid to the main condenser 1300 where the heated fluid is cooled and condensed. For purposes of cooling the heated fluid, the main condenser 1300 may be assisted by the second circuit 4200 and the third circuit 4300.

After the fluid exits from the main condenser 1300, the fluid flows to the refrigerant liquid receiver 4128 where the liquid level and temperature of the fluid is measured. If the liquid level is low or if the temperature is high, the sub cooler compressor 4410 and the sub cooler condenser 1300a are activated to increase the liquid level and/or reduce the temperature of the fluid. After the fluid exits from the refrigerant liquid receiver 4128, the fluid flows to the liquid refrigerant pump 4120, which pumps the fluid, now the coolant, to the fluid supply path 4100a, which then delivers the coolant to the first fluid supply path 2701a. The coolant would then be reused to cool the heat exchangers, e.g., heat exchangers 3101a-n.

Having now received the benefit of the description of cooling system 4000 described above with respect to FIG. 12, those skilled in the art will recognize that cooling systems 4001 and 4002 are simplified versions of cooling system 4000.

For extremely high density applications (e.g., greater than 25 kW per rack), a dual-coil (in series) circuit can be utilized. The secondary coil (e.g., a micro channel coil) receives the coldest refrigerant liquid first. This coil may receive inlet air temperatures less than the inlet temperature to the primary coil (immediately adjacent to the IT racks) (e.g., approximately 6.2° C. less than the inlet temperature to the primary coil). The liquid and partial vapor leaving the micro channel then enters a simple serpentine single row evaporator coil. This serpentine coil is closest to the IT rack. Therefore the serpentine coil receives the hottest air (e.g., approximately 46.6° C.). The remaining liquid can be boiled off in serpentine coil thereby utilizing the full heat rejection benefits of latent heat of vaporization principles. There are no thermal expansion valves or other pressure metering devices ahead of the coils. Such a dual coil circuit is described in international application no. PCT/US2011/043893, which was filed on Jul. 13, 2011, and published as WO 2012/009460 A2 on Jan. 19, 2012, the entire contents of which are hereby incorporated herein by reference.

Figure 14:
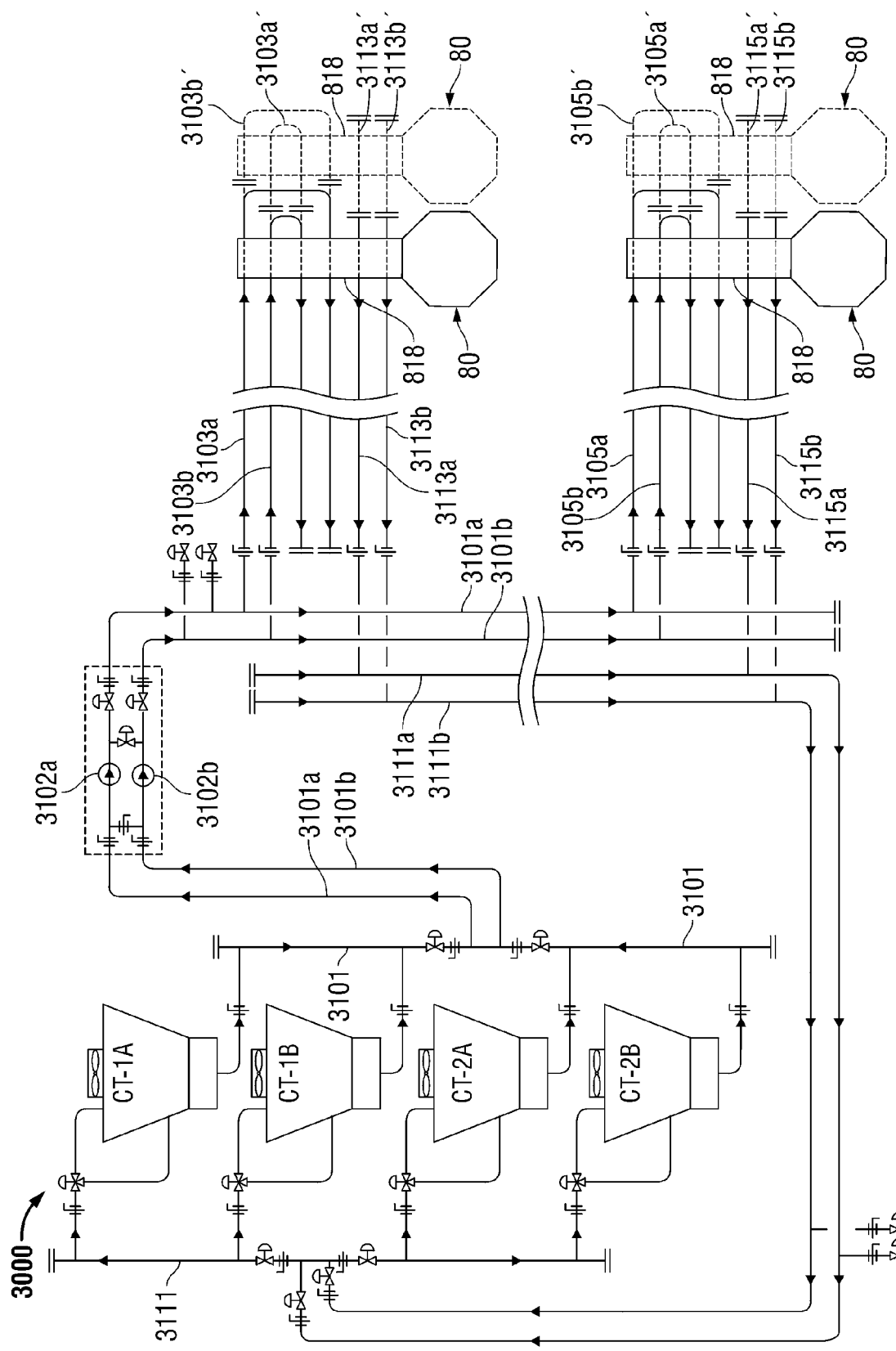
FIG. 14 is a schematic diagram of a water-cooled cooling system showing water flow according to embodiments of the present disclosure.

FIG. 14 is a schematic diagram of a water-cooled cooling system 3000 for a modular data pod, e.g., modular data pods 10, 50, 60, 70, 80, 90, 100, and 80' of FIGS. 2A-2G and 3-13. In this embodiment, cooling towers CT-1A, CT-1B, CT-2A, and CT-2B provide the heat rejection to the environment for the cooling system 3000. In other embodiments, however, other heat transferring equipment can be used, such as other fluid coolers and dry coolers. The cooling system also includes dual redundant pipe mains and equipment (pumps and cooling towers).

More particularly, cooled water from cooling towers CT-1A, CT-1B, CT-2A, and CT-2B discharges into a common cooling water supply header 3101. Fully redundant or alternatively half-capacity pumps 3102a and 3102 are in fluidic communication with the cooling towers CT-1A, CT-1B, CT-2A, and CT-2B via the supply header 3101 and separate cooling water supply header branch lines 3101a and 3101b such that pump 3102a draws suction via branch line 3101a and pump 3102b draws suction via branch line 3101b.

The cooling system 3000 includes a reverse-return pipe circuit on the main pipes and the branch pipes, which connect the modular data pods to the main pipes. More particularly, in one embodiment of the present disclosure, a first modular data pod cooling water supply branch line 3103a is in fluid communication with cooling water supply header branch line 3101a to supply cooling water to one or more modular data pods 80. Similarly, a second modular data pod cooling water supply branch line 3103b is in fluid communication with cooling water supply header branch line 3101b to supply cooling water to one or more modular data pods 80.

Cooling water is supplied to one or more modular data pods 80 via a section of the first and second cooling water supply branch lines 3103a and 3103b, respectively, that pass through the auxiliary enclosure 818 of modular data pod 80.

The first and second modular data pod cooling water supply branch lines 3103a and 3103b, respectively, are configured and disposed in a "U-shaped" configuration to provide reverse return capability to the cooling water system 3000.

The cooling water that has passed through the auxiliary enclosure 818 and has been heated by the equipment in the one or more modular data pods 80 is returned to the cooling towers CT-1A, CT-1B, CT-2A, and CT-2B via a section of first and second modular data pod cooling return branch lines 3113a and 3113b, respectively. The first and second modular data pod cooling return branch lines 3113a and 3113b, respectively, are in fluidic communication with a common cooling tower water return header 3111 and the cooling towers CT-1A, CT-1B, CT-2A, and CT-2B via separate cooling water return header branch lines 3111a and 3111b, respectively.

Similarly, cooling water is supplied to one or more modular data pods 80 via a section of first and second modular data pod cooling water supply branch lines 3105a and 3105b, respectively, that pass through the auxiliary enclosure 818 of another modular data pod 80.

The first and second modular data pod cooling water supply branch lines 3105a and 3105b, respectively, are also configured and disposed in a "U-shaped" configuration to provide reverse return capability to the cooling water system 3000.

Again, the cooling water that has passed through the auxiliary enclosure 818 and has been heated by the equipment in the one or more modular data pods 80 is returned to the cooling towers CT-1A, CT-1B, CT-2A, and CT-2B via a section of the first and second modular data pod cooling return branch lines 3115a and 3115b, respectively. The first and second modular data pod cooling return branch lines 3115a and 3115b, respectively, are also in fluidic communication with the common cooling tower water return header 3111 and the cooling towers CT-1A, CT-1B, CT-2A, and CT-2B via the separate cooling water return header branch lines 3111a and 3111b, respectively.

In one embodiment, as the need for additional modular data pods increases, first and second modular data pod cooling water supply branch lines 3103a and 3103b, respectively, that pass through the auxiliary enclosure 818 of modular data pod 80, can be extended as first and second modular data pod cooling water supply branch lines 3103a' and 3103b', respectively, to allow for the addition of one or more additional modular data pods 80.

The first and second modular data pod cooling water supply branch line extensions 3103a' and 3103b', respectively, are configured and disposed in a "U-shaped" configuration to provide reverse return capability to the cooling water system 3000.

Similarly, the first and second modular data pod cooling return branch lines 3113a and 3113b, respectively, can also be extended as first and second modular data return cooling water branch line extensions 3113a' and 3113b', respectively, to allow for the addition of one or more additional modular data pods 80.

Those skilled in the art will recognize that first and second modular data pod cooling water supply branch lines 3105a and 3105b, respectively, and first and second modular data pod cooling water return branch lines 3115a and 3115b, respectively, can also be extended in a similar manner as first and second modular data pod cooling water supply branch line extensions 3105a' and 3105b' and first and second modular data pod cooling water return branch line extensions 3115a' and 3115b', respectively, to allow for the addition of one or more modular data pods 80.

The first and second modular data pod cooling water supply branch lines 3105a and 3105b, respectively, can also be configured and disposed in a "U-shaped" configuration to provide reverse return capability to the cooling water system 3000.

As can be appreciated from the foregoing description with respect to the reverse return capability, the total path length of the pipe circuit that connects a modular data pod to the cooling towers is the same for each modular data pod. This reverse-return feature allows modular data pods to be added to or subtracted from the cooling system without requiring a system shut down of adjacent pods on the circuit or affecting the operation of adjacent modular data pods. Indeed, this feature enables a data site the flexibility of adding and subtracting modular data pods at will without affecting the overall operation of the cooling system.

The reverse-return feature coupled with the modular capabilities of the modular data pod design according to embodiments of the present disclosure allows for the addition, removal, and restacking of modular data pods with relative ease. Thus, a modular data pod can be installed in a "just in time" manner. Also, the modular data pods require less upfront infrastructure work and thus lower costs than a typical data center having phased loading over time.

Figure 15:
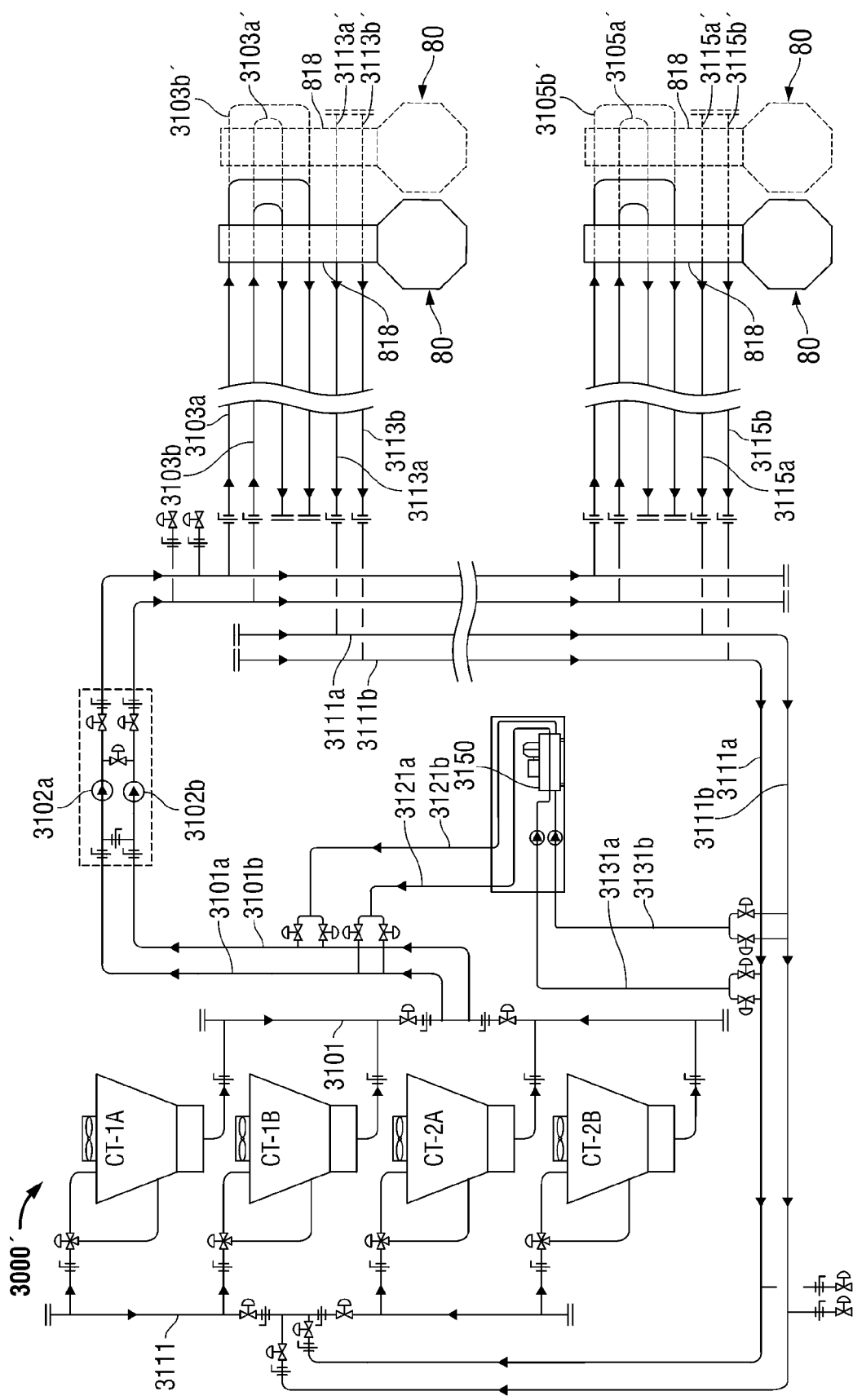
FIG. 15 is a schematic diagram of a cooling system for low wet-bulb environments where high wet-bulb conditions may occasionally occur that includes a modular chiller according to embodiments of the present disclosure.

FIG. 15 is a schematic diagram of a cooling system 3000' for low wet-bulb environments where high wet-bulb conditions may occasionally occur. Cooling system 3000' is identical to cooling system 3000 described above with respect to FIG. 14 except that cooling system 3000 further includes a modular chiller 3150 The cooling system 3000' includes the one or more cooling towers CT-1A, CT-1B, CT-2A, or CT-2B or other fluid cooler that are effective for low wet-bulb conditions and modular chiller 3150 that is effective for high wet-bulb conditions.

More particularly, modular chiller 3150 provides a bypass around the one or more cooling towers CT-1A, CT-1B, CT-2A, and CT-2B since the modular chiller 3150 is in fluidic communication with separate first and second cooling water return header branch lines 3111a and 3111b, respectively, via first and second modular chiller suction lines 3131a and 3131b, respectively, and with separate first and second cooling water supply header branch lines 3101a and 3101b, respectively, via first and second modular chiller discharge lines 3121a and 3121b, respectively.

Under high wet-bulb conditions, the modular chiller 3150 is placed into operation to provide supplemental, external, mechanical-assist cooling to one or more of the modular data pods 80 by injecting cooler water into first and second cooling water supply header branch lines 3101a and 3101b, respectively.

Cooling system 3000' could be coupled to a modular data pod hive so that the cooling system could operate with little or no need for a separate chiller to cool the water or other cooling fluid.

Figure 16:
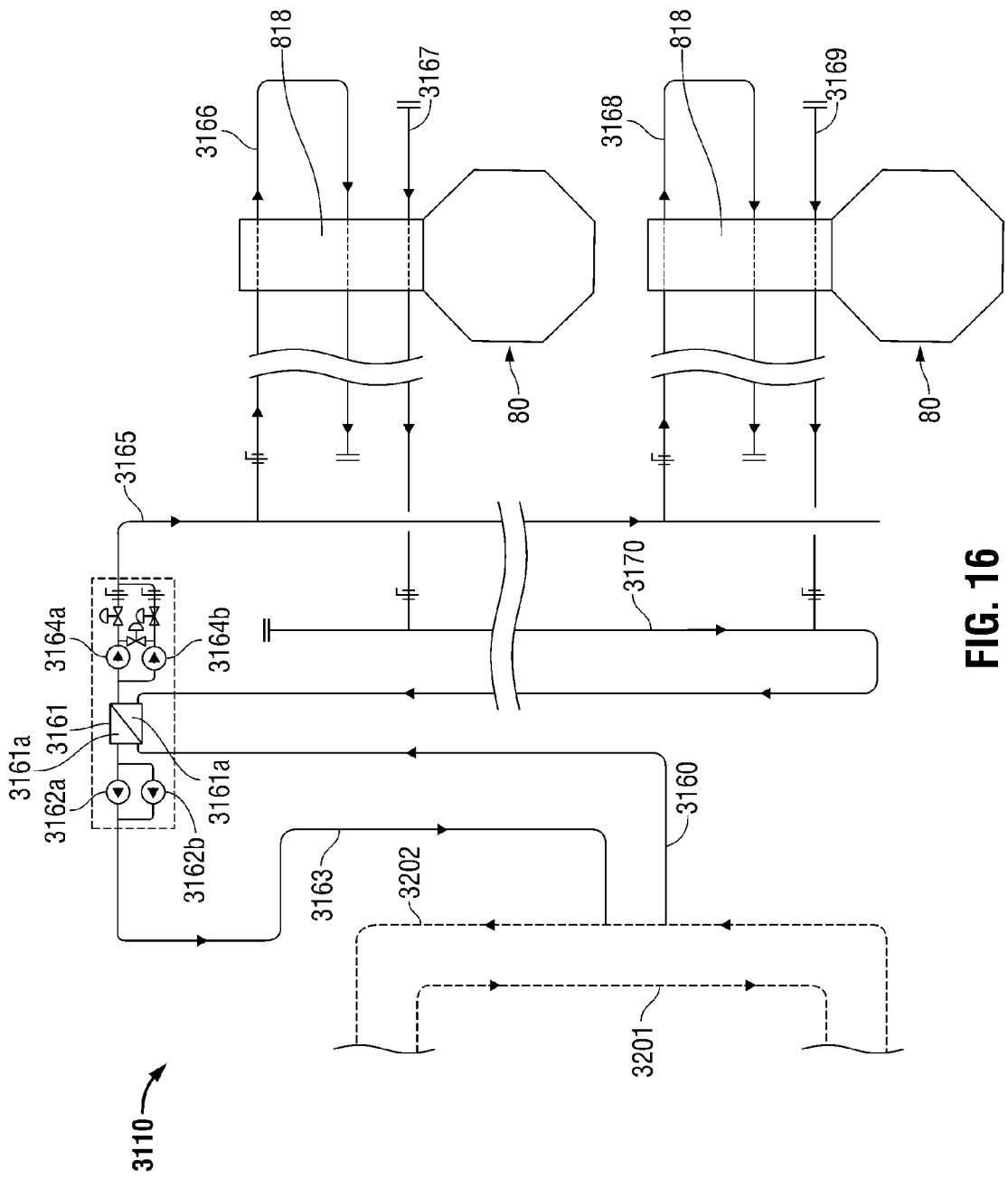
FIG. 16 is a schematic diagram of a portion of a water-cooled cooling system that includes an existing water cooling system showing water flow according to embodiments of the present disclosure.

FIG. 16 is a schematic diagram of a portion of a water-cooled cooling system 3110 that includes an existing water-cooled cooling system to which modular data pods, e.g., modular data pods 80, are coupled. The modular data pods 80 may be designed to be fed from all kinds of water-cooled and refrigerant-cooled cooling systems. The modular data pod structures 80 may be designed to operate on new or existing condenser water, glycol, geothermal, waste water, or refrigerant cooling systems.

As shown in FIG. 16, the piping from the modular data pods 80 is coupled to an existing chilled water circuit. In particular, the existing chiller water circuit includes a supply header 3201 and a return header 3202. The piping from the data pods may be coupled to the "warmer" or "spent side" of the chilled water circuit on the chilled water return because the modular data pods use cooling air temperatures that are higher than typical comfort cooling systems. More particularly, water-cooled cooling system 3110 includes a heat exchanger 3161 having a chilled water side 3161a and a modular data pod side 3161b. The chilled water side 3161a is in fluidic communication with existing chilled water return header 3202 via heat exchanger 3161 chilled water supply line 3160.

The "spent side" water from the chilled water return header 3202 flows through the inlet of chilled water side 3161a of the heat exchanger 3161 via one or more chilled water circulation pumps, e.g., pumps 3162A and 3162B. The outlet of chilled water side 3161a of the heat exchanger 3161, in which the water is now at an elevated temperature as compared to the water at the inlet of the chilled water side 3161a of the heat exchanger 3161, is also in fluidic communication with the chilled water return header 3202 via the pumps 3162A and 3162B and heat exchanger 3161 chilled water return line 3163.

The modular data pod side 3161b is in fluidic communication with one or more modular data pods 80 via a modular data pod chilled water supply header 3165. The modular data pod chilled water supply header 3165 is in fluidic communication with the modular data pod side 3161b of the heat exchanger 3161 via one or more modular data supply chilled water supply pumps, e.g., pumps 3164A and 3164B, such that water flows from the outlet of the modular data supply side 3161b of the heat exchanger 3161 to the modular data pod chilled water supply header 3165. One or more modular data pods 80 are in fluidic communication with a section of modular data pod chilled water supply header branch line 3166 which passes through the auxiliary enclosure 818 of modular data pod 80.

The cooling water that has passed through the auxiliary enclosure 818 and has been heated by the equipment in the one or more modular data pods 80 is returned to the existing chilled water return header 3202 via a section of modular data pod cooling return branch line 3167. The modular data pod cooling return branch line 3167 is in fluidic communication the inlet to modular data pod side 3161b of heat exchanger 3161 via a common heat exchanger modular data supply side header 3170.

Similarly, cooling water is supplied to one or more modular data pods 80 via a section of modular data pod cooling water supply branch line 3168 that passes through the auxiliary enclosure 818 of another modular data pod 80.

Again, the cooling water that has passed through the auxiliary enclosure 818 and has been heated by the equipment in the one or more modular data pods 80 is returned to the inlet of the modular data pod side 3161b of heat exchanger 3161 via a section of modular data pod cooling return branch line 3169. The modular data pod cooling return branch line 3168 is also in fluidic communication with the inlet of the modular data pod side 3161b of heat exchanger 3161 via the common heat exchanger modular data supply side header 3170.

The modular data pod cooling water supply branch lines 3168 and 3168 may also be configured and disposed in a "U-shaped" configuration to provide reverse return capability to the cooling water system 3110.

The modular data pods can also be fed with chilled water that has been used for other cooling purposes and is in transit back to the cooling manufacturing equipment (i.e., the chillers). The data pods may operate at extremely high efficiency levels, and the control system can be modified to incorporate and take full advantage of system optimization strategies. These strategies not only reduce the cost of data pod energy use, but also reduce the operating costs of the existing chilled-water plant.

As can be appreciated from the foregoing, referring again to FIGS. 2A-2G, in one embodiment, the present disclosure relates to a modular data pod, e.g., modular data pod 105 in FIG. 2A, modular data pod 106 in FIG. 2B, comprising: an enclosure including wall members contiguously joined to one another along at least one edge of each wall member in the shape of a polygon and a data pod covering member; a plurality of computer racks arranged within the enclosure to form a first volume between the inner surface of the wall members and first sides of the computer racks and a second volume formed of second sides of the computer racks; a computer rack covering member configured to enclose the second volume, the computer rack covering member and the data pod covering member forming a third volume coupling the first volume to the second volume; and an air circulator configured to continuously circulate air through the first, second, and third volumes.

Figure 17:
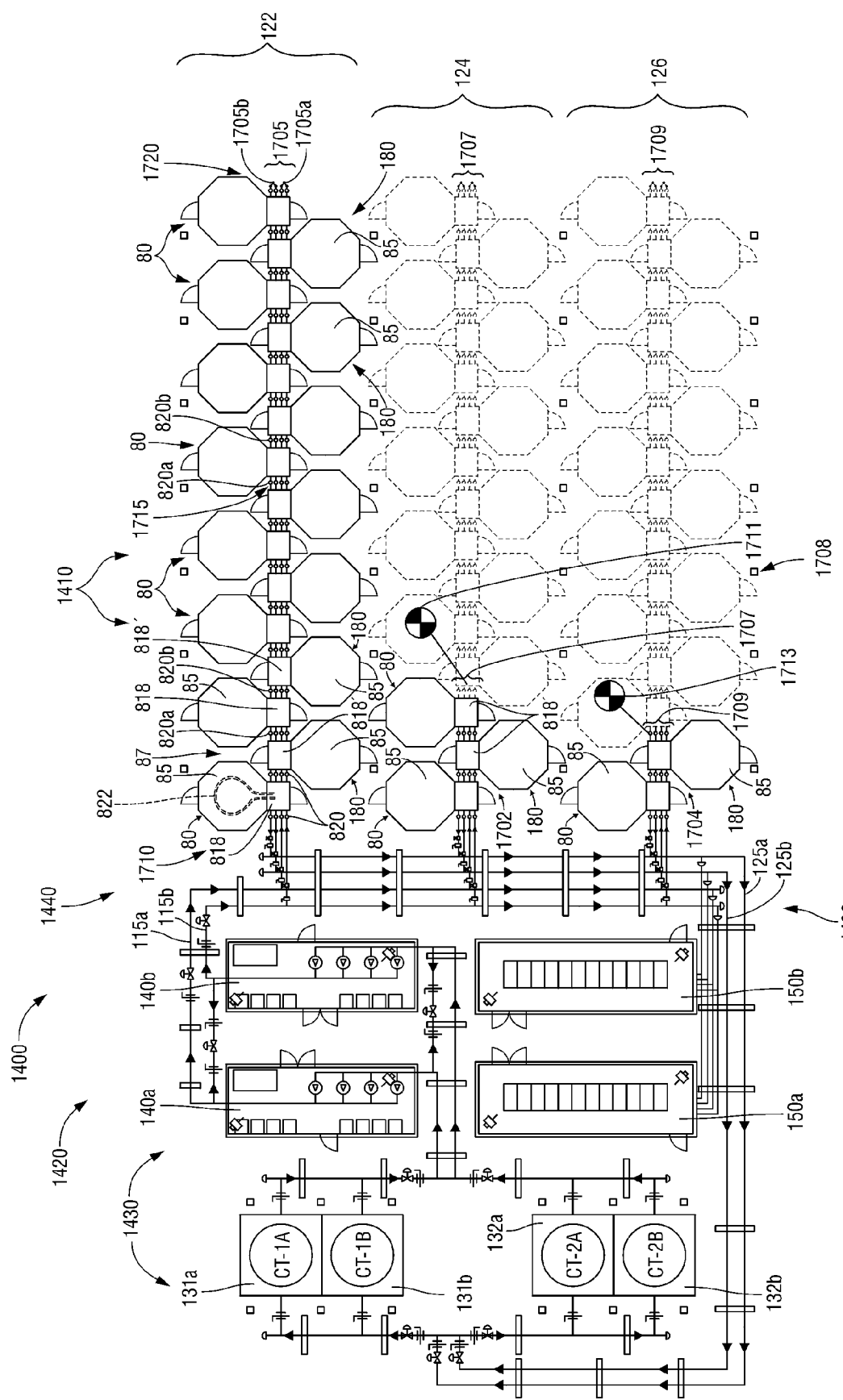
FIG. 17 is a schematic diagram of a modular data pod farm illustrating staged expansion of the data pod farm according to embodiments of the present disclosure.
Figure 17A:
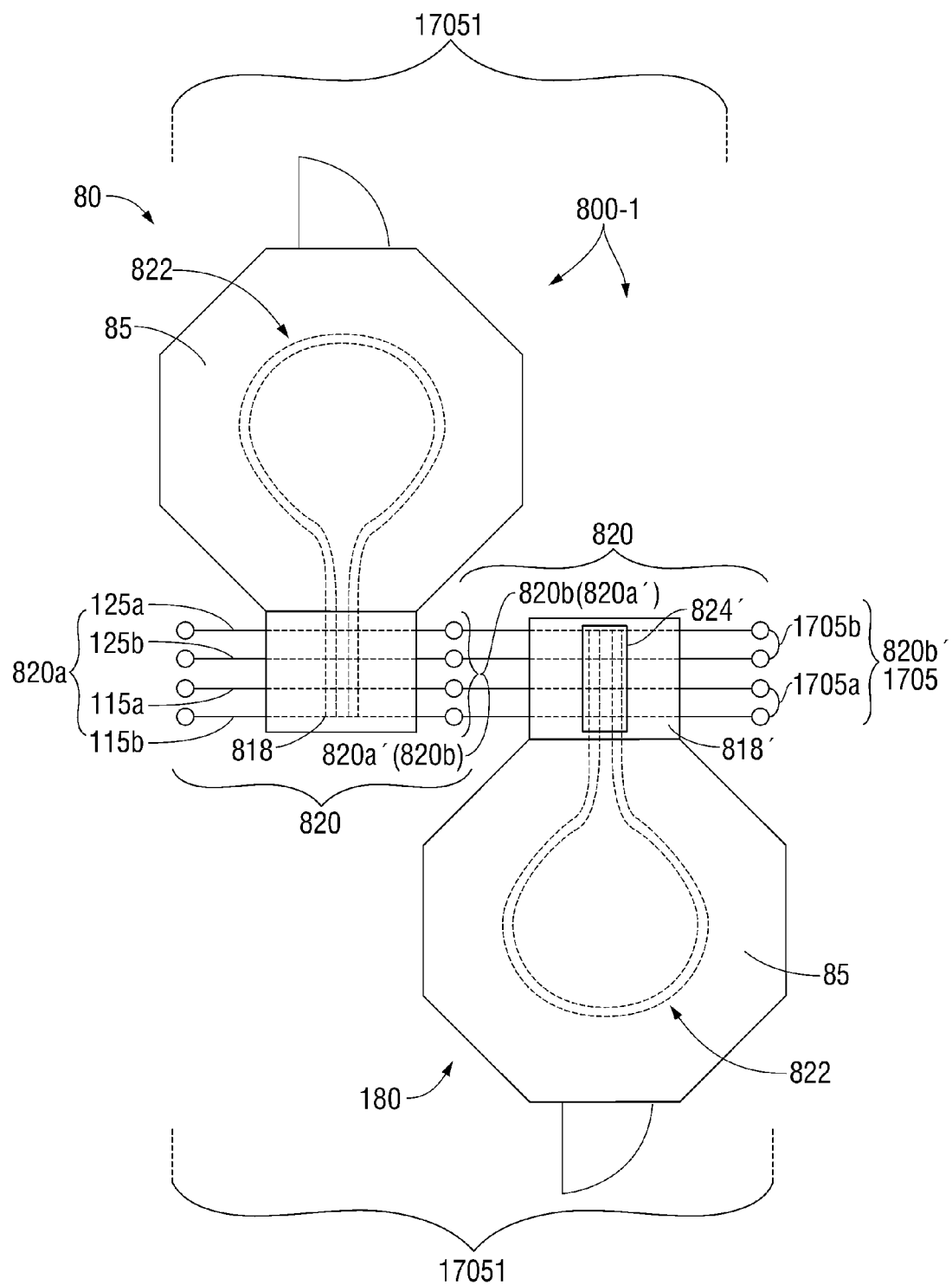
FIG. 17A is detail of the modular data pod farm of FIG. 17 illustrating connection of modular data pods into a plurality of modular data pods.

As illustrated in FIGS. 17 and 17A, the modular data pods 80 and 180 include significant adaptive, expandable, and retractable features that allow the data pods to be more easily deployed in stages. More particularly, FIG. 17 is a schematic diagram of the data pod farm or modular data center 1400 of FIG. 1 in an earlier stage of deployment of the modular data pod hive 1410 illustrating staged expansion of the data pod farm 1400. As shown, in an initial phase, a partial hive 1410 is deployed. The data pods 80 and 180 shown via solid lines are data pods that are deployed in an initial phase with the base infrastructure, which includes pumps, electrical components, and cooling towers. After this initial deployment, more data pods 80 and 180, shown via the dashed lines, and associated support system infrastructure may be added. Also, more cooling towers, pumps, and other equipment for the cooling system can be added as the load increases over time.

The physical infrastructure mains (i.e., pipe and electrical cable) are located on one side of the hive. This arrangement reduces the amount of pipe needed to support the hive. The actual branch mains (i.e., the pipe and electrical cable for a particular data pod) are included with each data pod thereby reducing the amount of support branch mains installed in the field and the cost of installing the support branch mains in the field. This also reduces costs significantly.

As shown in FIG. 17, a modular data pod 80 or 180 can be added to or removed from a data pod hive 1410 or a data pod chain 122, 124, and 126. In particular, each modular data pod 80 includes system components that allow modular data pods 80 to be added to the data pod hive 1410. Each modular data pod 80 includes an auxiliary enclosure 818 containing a fluid and electrical circuit section 820. The fluid and electrical circuit sections 820 may include segments of HVAC pipe and electrical conduits. The segments of the HVAC pipe and electrical conduits contained in each of the auxiliary enclosures 818 form a fluid and electrical link positioned internally within the auxiliary enclosures 818 between the existing, new, and future modular data pods on the modular data pod chains 122, 124, and 126.

The auxiliary enclosures 818 and their HVAC pipe and electrical conduits facilitate staged expansion of a data center without disrupting the operation of previously deployed modular data pods and corresponding cooling infrastructure. For example, an initial deployment of the modular data center or the modular data pod hive 1410 of FIG. 17 may have a central cooling fluid circuit including a central cooling device such as a first pair of cooling towers 131a and 131b, supply lines 115a and 115b, return lines 125a and 125b, and a chain of modular data pods 122. Each modular data pod in the chain of modular data pods 122 includes an auxiliary enclosure 818 that contains a shared or common fluid and electrical circuit section 820. Each modular data pod 80 in the chain of modular data pods 122 also includes a data enclosure 85 (see also FIG. 1) that contains at least a portion of an unshared fluid and electrical circuit 822 (shown schematically as dashed lines traversing internally within data enclosure 85) and representing, e.g., array 840 of vertically disposed upper cooling coils 841, 842, 843, 844, 845, 846, 847, and 848 disposed above respective server racks 801, 802, 803, 804, 805, 805, 806, 807, and 808 or overhead flat-plate coil 860 described above with respect to FIG. 4.

As illustrated in and described above with respect to FIG. 10, cable trays 340 that are exemplarily mounted above the server racks, e.g., 803a' and 807c', and, as illustrated in, and described above with respect to FIG. 9, a dedicated electrical power supply, e.g., one or more batteries 832 located at a lower end 811' of data enclosure 108" of modular data pod 80", that couples to the shared fluid and electrical circuit section 820.

Thus, the unshared fluid and electrical circuit 822 includes a cooling fluid circuit, e.g., array 840, that is configured to cool the electronics contained within the corresponding data enclosure 85. The shared fluid and electrical circuit sections 820 include first ends 820a and second ends 820b. The shared or common fluid electrical sections 820 are coupled together in series, e.g., second end 820b of a first shared fluid and electrical circuit section 820 is coupled to the first end 820a' of an adjacent second shared fluid and electrical circuit section 820, to form a fluid and electrical circuit chain 1705.

As illustrated in FIG. 17, adjacent data enclosures on the same side of the common fluid and electrical circuit chain 1705, e.g., modular data pods 80, form a pathway providing a user access to an auxiliary enclosure, e.g., auxiliary enclosure 818'.

In conjunction with FIG. 17, FIG. 17A is a detail of an exemplary embodiment of a plurality 800-1 of modular data pods 80 and 180 whose fluid and electrical circuit sections 820 have first and second ends 820a, 820a' and 820b, 820b', respectively, and are coupled together in series to form a first fluid and electrical circuit 17051 having first and second ends 820*a* and 820*b*', respectively. Modular data pod 180 has a data enclosure 85 having a configuration that is generally identical to the configuration of the data enclosure 85 of modular data pod 80. However, since modular data pod 180 is coupled to the first fluid and electrical circuit section 17051 in an alternating configuration with respect to modular data pod 80, the connections to supply lines 115*a* and 115*b* and to return lines 125*a* and 125*b* of fluid and electrical circuit sections 820 of auxiliary enclosure 818' included with modular data pod 180 are in reverse order, as represented by block 824', with respect to the connections to supply lines 115*a* and 115*b* and to return lines 125*a* and 125*b* of fluid and electrical circuit sections 820 of auxiliary enclosure 818 included with modular data pod 80.

The first shared fluid and electrical circuit 17051 is coupled at a first end 1710 to the fluid supply lines 115*a* and 115*b* and the fluid return lines 125*a* and 125*b* of the central cooling fluid circuit 1430. The fluid supply lines 115*a* and 115*b* and fluid return lines 125*a* and 125*b* may be temporarily coupled at second end 1720 of the shared fluid and electrical circuit chain 1705 via a U-bend or 180° elbow 1750*a* and 1750*b*, respectively, until such time that additional modular data pod capacity is required, as explained below. For simplicity, unless otherwise noted, reference in the description below to modular data pod 80 and auxiliary enclosure 818 is assumed to also apply to modular data pod 80' and auxiliary enclosure 818'.

The shared or common fluid and electrical circuit chain 1705 includes at least one supply line 115*a* and at least one return line 125*a*. The supply and return lines 115*a* and 125*a* may be arranged in a reverse return configuration. For example, each of the shared or common fluid and electrical circuit sections 820 contained within a corresponding auxiliary enclosure 818 may include four supply line segments and two return line segments. (For example, refer to the discussion of Detail 7A in FIG. 7, which illustrates that supply header 2151*a* can be physically installed with a loop or pipe bend 2151'*a* to provide a longer total length as compared to the alternate supply header 2152*a* for the purposes of providing reverse return capability and that, similarly, return header 2151*b* can be physically installed with a loop or pipe bend 2151*b*' to provide a longer total length as compared to the alternate return header 2152*b* for the purposes of providing reverse return capability).

The shared fluid and electrical circuit sections 820 may be contained entirely internally within the auxiliary enclosure 818, as shown in FIG. 7, or portions may extend partially externally beyond the enclosure 818 as shown by the shared fluid and electrical circuit section 820 at location 1715 in FIG. 17. The pipe chases (not explicitly shown) within the auxiliary enclosures 818 of each modular data pod 80 include dual reverse-return pipe circuit segments to provide redundancy in case one of the pipe circuits fails. These circuits continue the reverse return capabilities of the cooling system as each new modular data pod is deployed on a modular data pod chain. This feature enables the addition or removal of modular data pods without shutdowns or costly water system balancing problems. In other embodiments, the modular data pods include direct feed mains (versus reverse-return mains) or single, non-redundant mains (e.g., the common cooling fluid circuit includes a single supply line and a single return line). These modular data pods can be used on Tier 1 type facilities where self balancing, reliability, and redundancy issues are less critical.

The pair of cooling towers is fluidly coupled to the central cooling fluid circuit and is configured to support at least a portion of the cooling requirements of the first chain of modular data pods. In particular, the pair of cooling towers is configured to support all of the cooling requirements of the chain of modular data pods under favorable environmental conditions, e.g., a favorable ambient wet-bulb temperature.

As described above, each modular data pod includes a data enclosure and an auxiliary enclosure 818. As shown in FIG. 17, the shared fluid and electrical circuit sections of the auxiliary enclosure are coupled together in series to form a linear path. The data enclosures are coupled to corresponding auxiliary enclosures on alternating sides of this linear path. The data enclosure can be shaped and sized so that adjacent data enclosures on the same side of the linear path form a pathway that allows a person to access the auxiliary enclosures. The data enclosures can take the shape of a polygon, such as a hexagon or an octagon. This arrangement of modular data pods provides a data center with a very small footprint as compared to traditional data centers. To further increase the data capacity per square foot, the modular data pods may be stacked on top of each other.

After the initial deployment, the modular data center may need additional data capacity. Thus, in a second stage, a second chain of modular data pods and a third chain of modular data pods may be coupled to the central cooling fluid circuit in a manner similar to the initial deployment of the modular data center 1400. If the first pair of cooling towers CT-1A and CT-1B do not have sufficient capacity to handle the cooling requirements of the additional chains of modular data pods 80, then a second central cooling device, such as a second pair of cooling towers CT-2A and CT-2B, may be fluidly coupled to the central cooling fluid circuit in the second stage. In future deployment stages, additional modular data pods may be appended to the first and second chains 80. In this manner, the modular data center is seamlessly expanded over time. Also, as shown in FIG. 17, the central cooling fluid circuit includes supply and return lines in a reverse-return configuration.

Figure 17B:
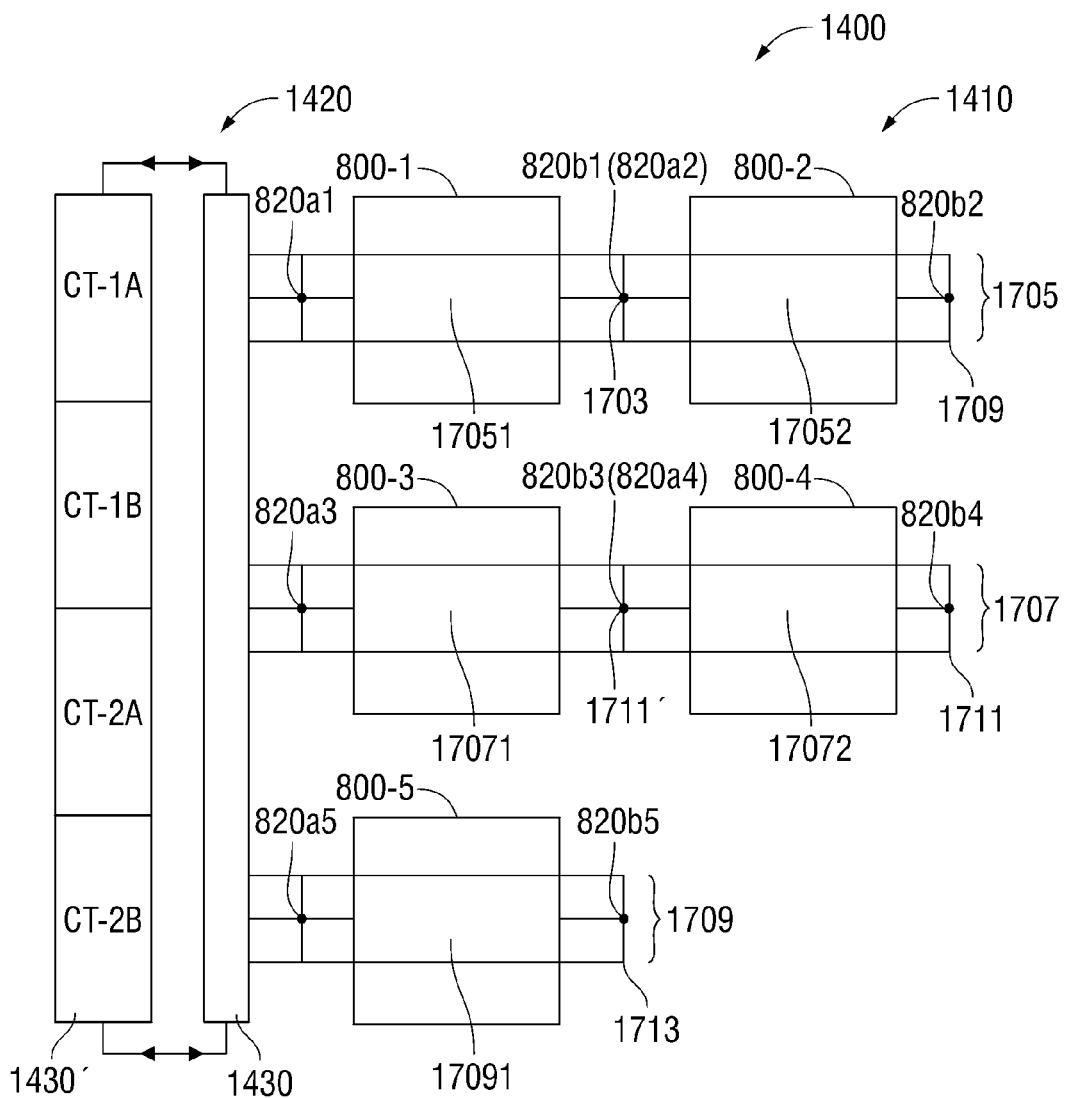
FIG. 17B is a simplified block diagram of the modular data farm of FIG. 17 and of several pluralities of the plurality of modular data pods of FIG. 17A illustrating staged expansion of the data pod farm according to embodiments of the present disclosure.

To facilitate the description of the staged expansion of the modular data farm 1400, FIG. 17B is a simplified block diagram of the modular data farm 1400 of FIG. 1 and FIG. 17 and of several pluralities of the plurality 800-1 of modular data pods 80 and 180 of FIG. 17A illustrating the staged expansion of the data pod farm 1400 and of the data pod hive 1410 according to embodiments of the present disclosure. More particularly, the blocks designated 800-2, 800-3, 800-4, and 800-5 represent pluralities of modular data pods 80 and 180 of FIG. 17A that are generally identical to the first plurality 800-1 of modular data pods 80 and 180 of FIG. 17A. The block designated 17052 represents a fluid and electrical circuit 17052 included by second plurality 800-2 of modular data pods 80 and 180. The block designated 17071 represents a fluid and electrical circuit 17071 included by third plurality 800-3 of modular data pods 80 and 180. The block designated 17072 represents a fluid and electrical circuit 17072 included by a fourth plurality 800-4 of modular data pods 80 and 180. Similarly, the block designated 17091 represents a fluid and electrical circuit 17091 included by a fifth plurality 800-5 of modular data pods 80 and 180.

The blocks designated 1430 and 1430' are simplified representations of the central cooling system 1420 that includes a central cooling fluid circuit 1430 and a block diagram representation 1430' of the cooling towers CT-1A, CT-1B, CT-2A, CT-2B that are included in the central cooling system 1420.

Referring again to FIG. 17A, in the initial stage of deployment of the data pod hive 1410, the fluid and electrical circuit sections 820 of the first plurality 800-1 of modular data pods 80 and 180 are coupled together in series to form first fluid and electrical circuit 17051 having a first end 820a and a second end 820b'.

Returning to FIG. 17B, the first end 820a of first fluid and electrical circuit 17051 is now designated as the first end 820a1 and the second end 820b' is now designated as 820b1. The first end 820a1 is coupled to the central fluid and electrical circuit 1430. Central cooling device 1430', as represented for example by one or more of cooling towers CT-1A, CT-1B, CT-2A, or CT-2B, is coupled to the central cooling circuit 1430 thereby coupling the first fluid and electrical circuit 17051 to the central cooling device 1430'.

In the same manner described above with respect to FIG. 17A regarding the first plurality 800-1 of modular data pods 80 and 180, the fluid and electrical circuit sections 820 of the second plurality 800-2 of modular data pods 80 and 180 are coupled together in series to form a second fluid and electrical circuit 17052 having a first end 820a2 and a second end 820b2.

Returning to FIG. 17B, the first end 820a of the second fluid and electrical circuit 17052 is now designated as the first end 820a2 and the second end 820b' is now designated as 820b2. The first end 820a2 of second fluid and electrical circuit 17052 is now coupled to the second end 820b1 of the first fluid and electrical circuit 17051 thereby coupling the second fluid and electrical circuit 17052 to the central cooling device 1430' and forming a shared fluid and electrical circuit chain 1705.

In the same manner described above with respect to FIG. 17A regarding the first plurality 800-1 of modular data pods 80 and 180, the fluid and electrical circuit sections 820 of the third plurality 800-3 of modular data pods 80 and 180 are coupled together in series to form a third fluid and electrical circuit 17071 having a first end 820a and a second end 820b'.

Returning to FIG. 17B, the first end 820a of third fluid and electrical circuit 17071 is now designated as a first end 820a3 and the second end 820b' is now designated as 820b3. The first end 820a3 is coupled to the central fluid and electrical circuit 1430 thereby coupling the third fluid and electrical circuit 17071 to the central cooling device 1430'.

Again, in the same manner described above with respect to FIG. 17A regarding the first plurality 800-1 of modular data pods 80 and 180, the fluid and electrical circuit sections 820 of the fourth plurality 800-4 of modular data pods 80 and 180 are coupled together in series to form a fourth fluid and electrical circuit 17072 having a first end 820a and a second end 820b'.

Returning to FIG. 17B, the first end 820a of a fourth fluid and electrical circuit 17072 is now designated as a first end 820a4 and the second end 820b' is now designated as 820b4. The first end 820a4 of the fourth fluid and electrical circuit 17072 is now coupled to the second end 820b3 of the third fluid and electrical circuit 17071 thereby coupling the fourth fluid and electrical circuit 17072 to the central cooling device 1430' and forming a shared fluid and electrical circuit chain 1707. As illustrated in FIGS. 17 and 17B, the fluid and electrical circuit chain 1707 may have an interim termination point 1711.

Upon increase in the demand for additional modular data pod capability, the shared fluid and electrical circuit chain 1707 may be extended by installation of additional pluralities of modular data pods as shown by the dashed lines in FIG. 17.

Similarly, in the manner described above with respect to FIG. 17A regarding the first plurality 800-1 of modular data pods 80 and 180, the fluid and electrical circuit sections 820 of the fifth plurality 800-5 of modular data pods 80 and 180 are coupled together in series to form a fifth fluid and electrical circuit 17091 having a first end 820a and a second end 820b'.

Returning to FIG. 17B, the first end 820a of fifth fluid and electrical circuit 17091 is now designated as first end 820a5 and the second end 820b' is now designated as 820b5. The first end 820a5 is coupled to the central fluid and electrical circuit 1430 thereby coupling the fifth fluid and electrical circuit 17091 to the central cooling device 1430' and forming fluid and electrical circuit chain 1709. In a similar manner as described above with respect to fluid and electrical circuit chain 1707, as illustrated in FIGS. 17 and 17B, the fluid and electrical circuit chain 1709 may have an interim termination point 1713. Upon increase in the demand for additional modular data pod capability, the fluid and electrical circuit chain 1709 may be extended by installation of additional pluralities of modular data pods as shown by the dashed lines in FIG. 17.

Those skilled in the art will recognize that, alternatively, the third plurality 800-3 of modular data pods 80 and 180 and the third fluid and electrical circuit 17071 may be installed as the second plurality of modular data pods 80 and 180 coupled to the central fluid and electrical circuit 1430 thereby coupling the now second fluid and electrical circuit 17071 to the central cooling device 1430' and forming a fluid and electrical circuit chain 1707 with an interim termination point 1711' similar to the interim termination point 1711. The first fluid and electrical circuit 17051 now has an interim termination point 1703.

Similarly, the fifth plurality 800-5 of modular data pods 80 and 180 and fifth fluid and electrical circuit 17091 may then be installed as the third plurality of modular data pods 80 and 180 coupled to the central fluid and electrical circuit 1430 thereby coupling the third fluid and electrical circuit 17091 to the central cooling device 1430' and forming fluid and electrical circuit chain 1709 with interim termination point 1713.

Figure 18:
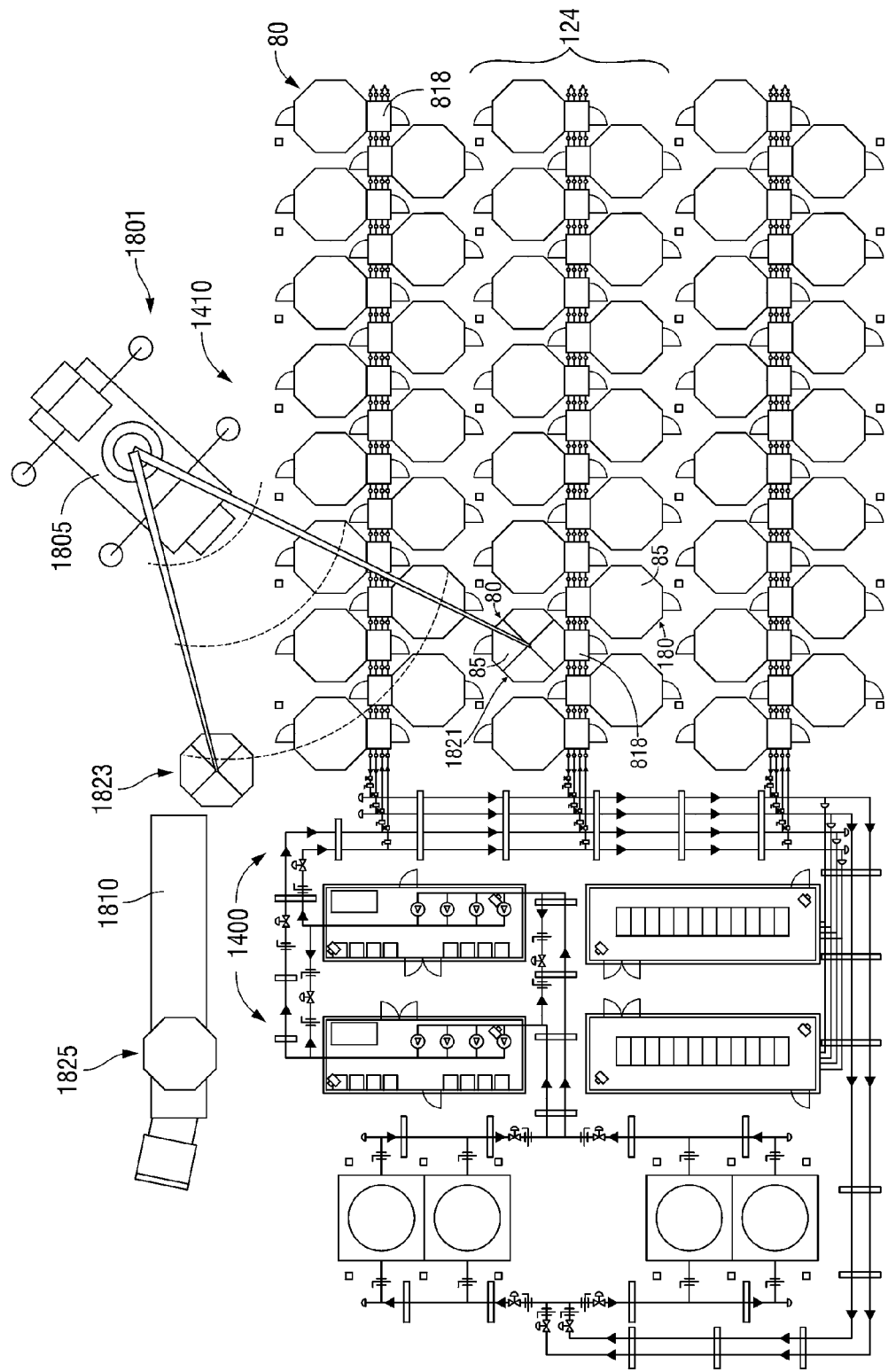
FIG. 18 is a schematic diagram of a modular data pod farm illustrating a transport system for modular data pods according to embodiments of the present disclosure.

FIG. 18 is a schematic diagram and plan view of the data pod farm or modular data center 1400 and modular data pod hive 1410 of FIG. 1 illustrating a transport system 1801 for the modular data pods 80 and 180 according to some embodiments of the present disclosure.

As shown in FIG. 18, the data enclosures 85 of the modular data pods 80 and 180 may be designed to be removed from modular data pod chain 124 using a crane 1805 and placed on a drop-bed tractor trailer 1810 for transport to another location. The crane 1805 is illustrated moving the data enclosure 85 of the modular data pod 85 from an initial position 1821 within the modular data pod chain 124 to an intermediate position 1823 above the drop-bed tractor trailer 1810 to a final position 1825 on the drop-bed tractor trailer 1810 in preparation for transport away from the data pod farm or modular data center 1400. The size of the data enclosures 85 of the modular data pods 80 and 180 may be scaled down to fit on smaller trucks and railroad flat beds. This scaled-down design decreases the total output power that the modular data pods can handle. In indoor or outdoor environments or applications, the transport system may include overhead gantries, cranes, and rails. If sufficient overhead room for rigging is not available, the width of the corridors between chains of data pods can be increased. This allows fork lifts or other grade-level rigging apparatus to access the corridors so that the data pods can be easily removed or deployed.

Figure 19:
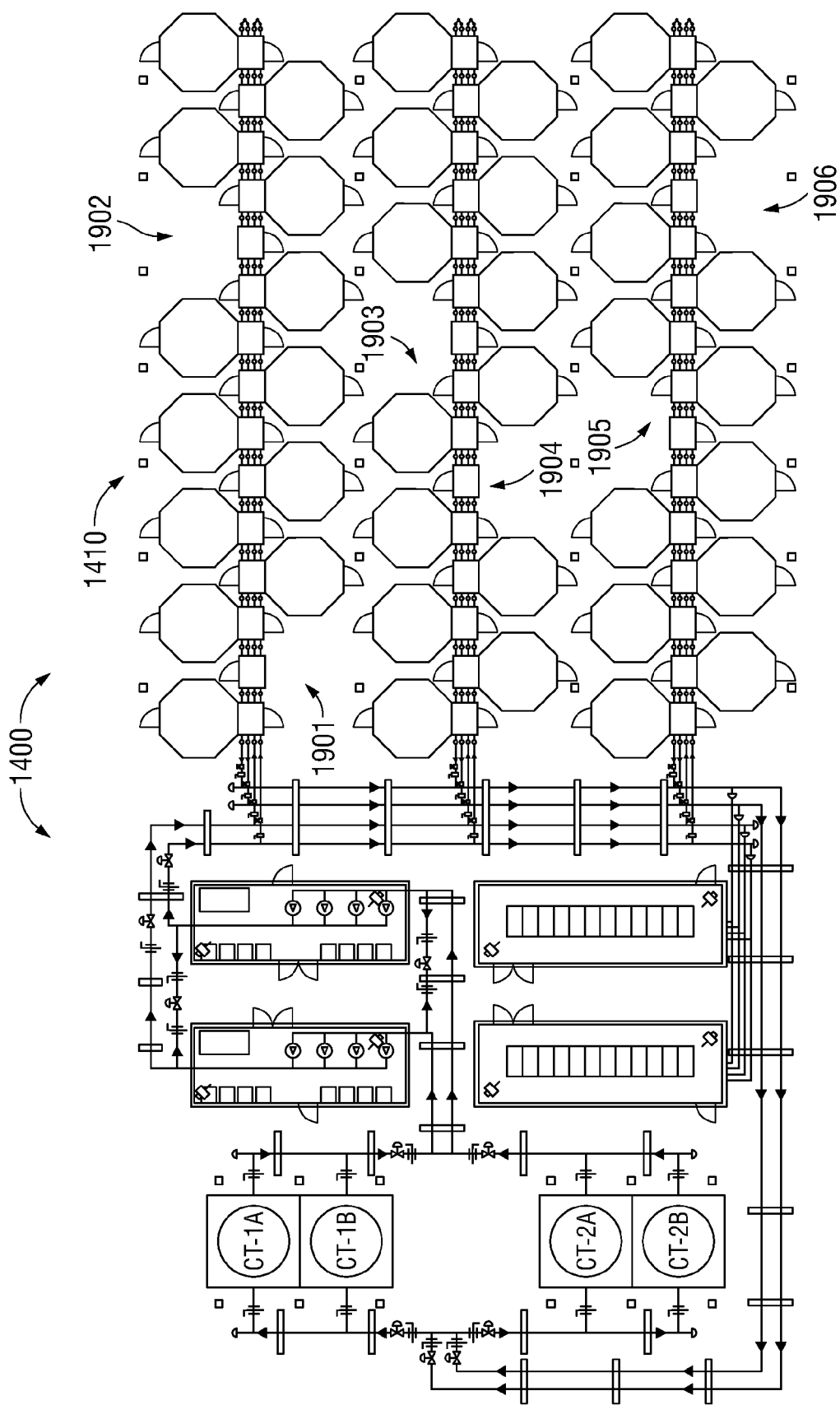
FIG. 19 is a schematic diagram of a modular data pod farm illustrating the removal of data pods according to embodiments of the present disclosure.

FIG. 19 illustrates the data pod farm or modular data center 1400 and modular data pod hive 1410 of FIG. 1 in which certain data pods 80 or 180 have been removed from the hive

1410 at positions 1901, 1902, 1903, 1904, 1905, and 1906, and transported off site so that the removed data pods 80 or 180 can be restacked with new computer systems or servers. The auxiliary enclosure and the fluid and electrical circuit sections, including pipe and electrical chase chambers, remain in place to enable the data pod envelop or enclosure to be removed, while leaving the pipe and electrical system infrastructure intact to support the adjacent data pods that remain in operation. Thus, this design of the modular data pod hive allows modular data pods to be added, removed, modified, and retrofitted without affecting the operation of the remaining data pods.

This design saves time and money because data pods can be removed to a separate area either onsite or offsite where the data pods are restacked with new computer systems or otherwise repaired. The restacked data pods may then be redeployed in the same or different data pod farm. This design especially saves time and money in cases where the data pod is deployed in a remote area because there is no need to send a technician and equipment to the remote area to restack or otherwise repair the data pod. The data pod can simply be transported to a separate area where the data pod can be restacked or repaired.

Figure 20:
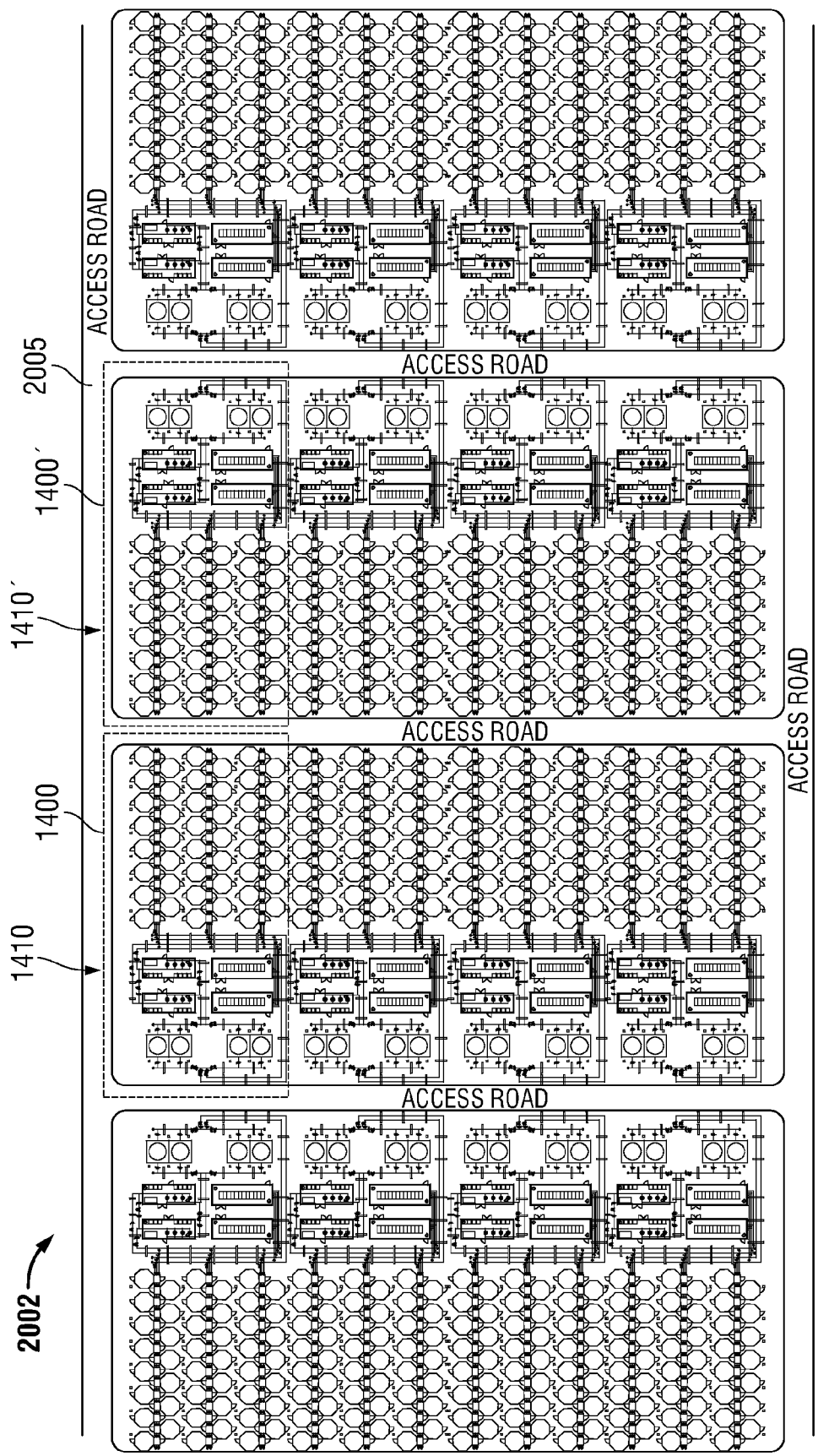
FIG. 20 is a schematic diagram of a modular data pod farm according to embodiments of the present disclosure.
Figure 21A:
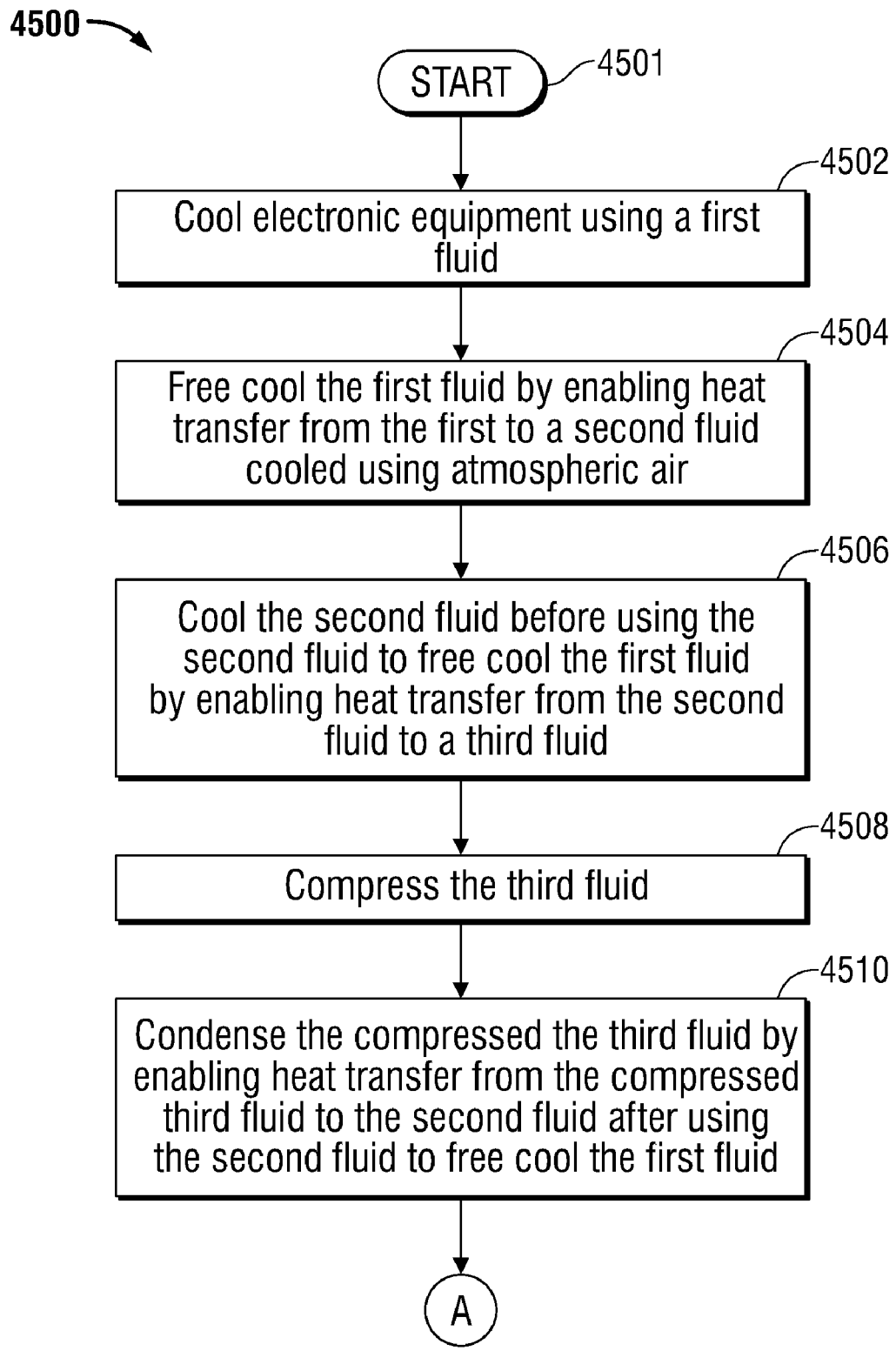
FIGS. 21A-21C are flow diagrams of a method of cooling electronic equipment according to embodiments of the present disclosure.
Figure 21B:
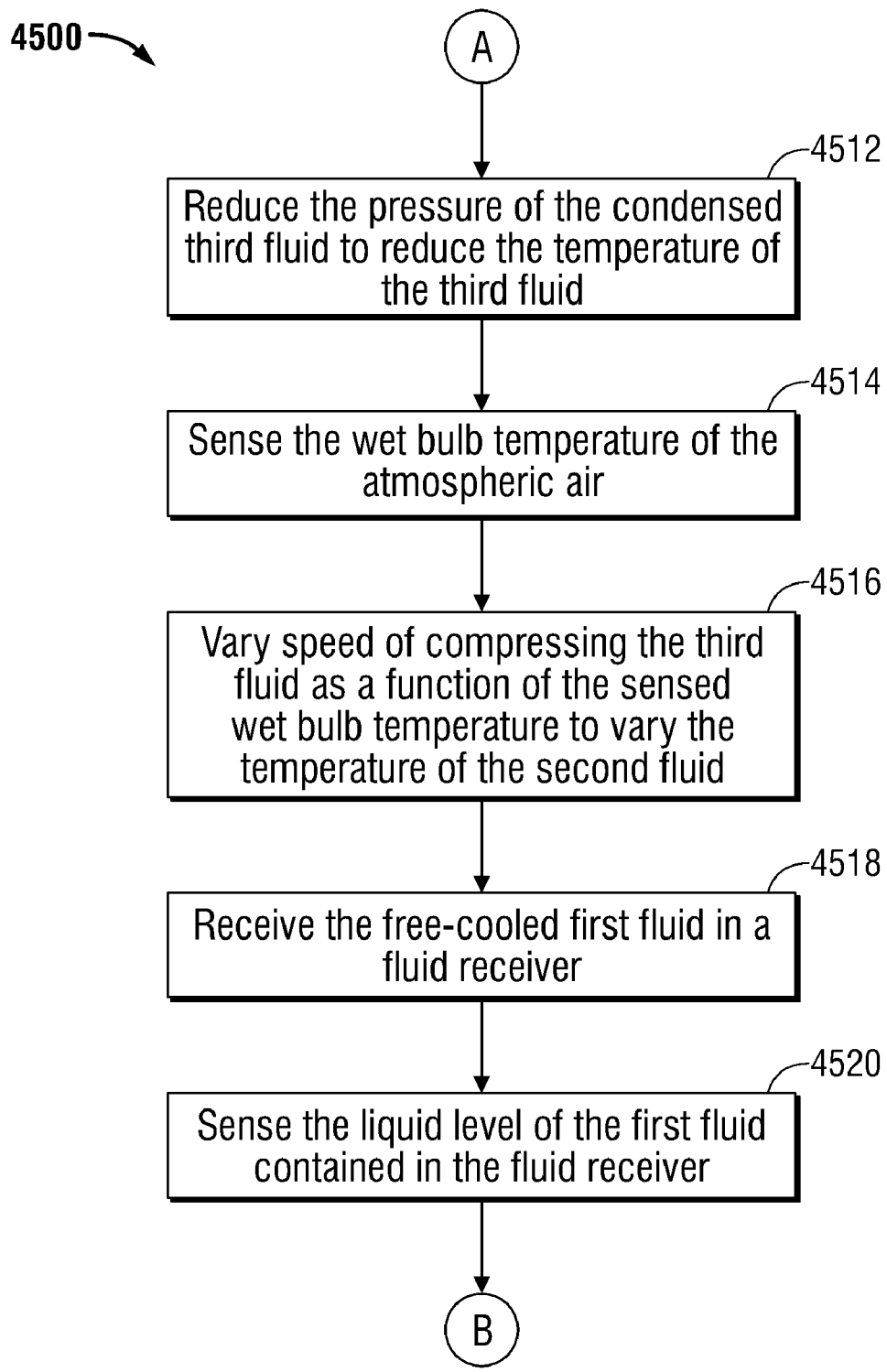
Figure 21C:
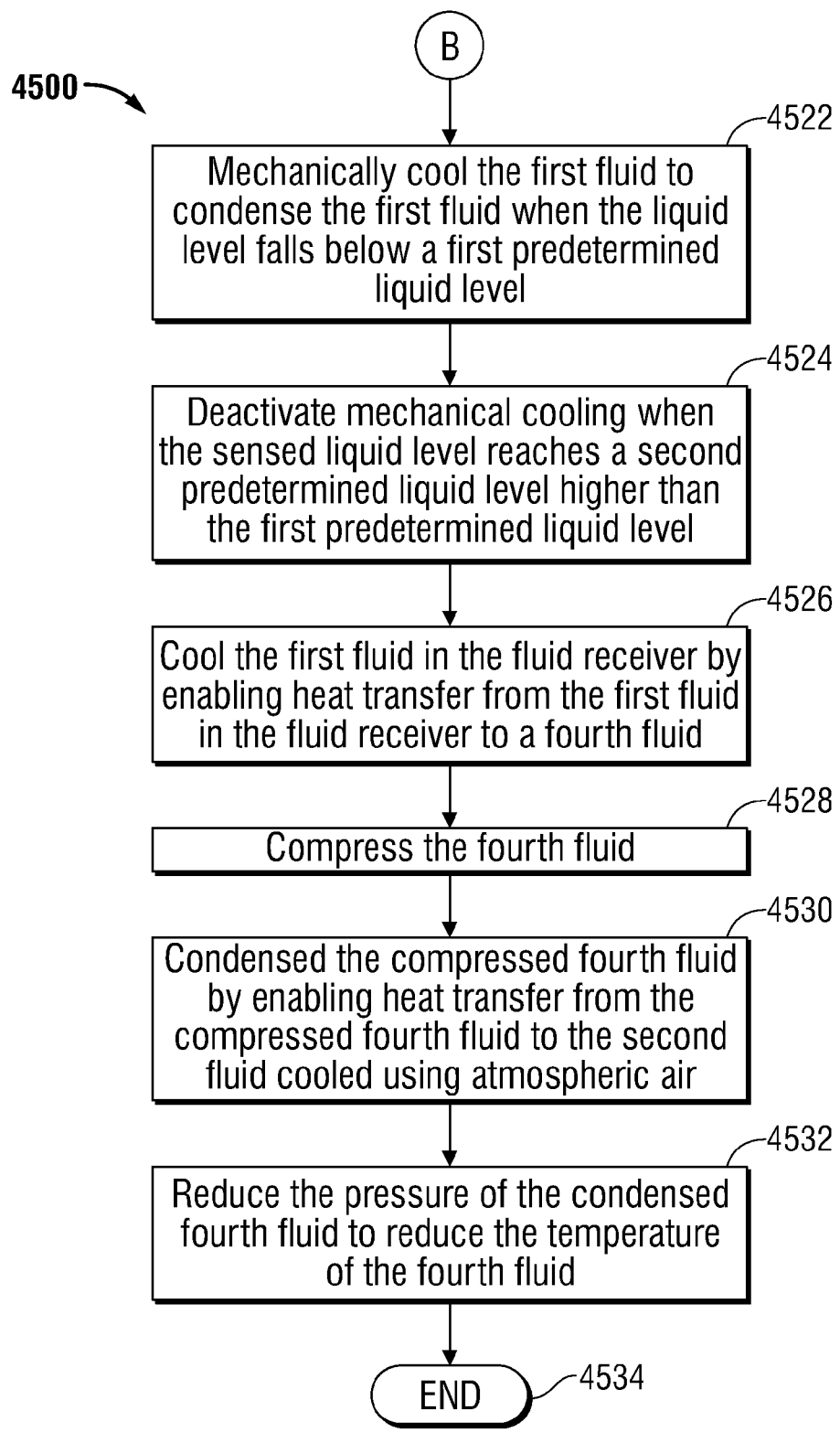

FIG. 20 is a schematic diagram and plan view of a large-scale data pod farm 2002. As shown, adjacent data pod farms or modular data centers 1400 and 1400' and respective data pod hives 1410 and 1410' can be positioned in mirror-image patterns. The mirror-image placement of hives allows for integration among hives. The hives can be deployed in stages or phases over time. Each new hive can be connected to the mirror-image hive adjacent to it in any direction. This community of hives allows for redundancy capabilities within the hive community structure.

As shown, the large-scale data pod farm includes access roads 2005 that can be used to serve adjacent hives. As shown in FIG. 20, a mobile crane and/or a tractor trailer or other transport vehicle may gain access to modular data pods 80 in the modular data pod farm via access roads 2005 that surround multiple modular data pod farms 1400 and 1400'.

The overall design of the data pod farm incorporates efficient use of data pod shapes and hive patterns to make it possible to deploy a large data pod farm in three to four times less space than a typical data center. This modular approach is far more efficient in its use of over all space versus other containerized modular designs. The data pods themselves can be much more tightly packed than a typical modular rectangular or square-shaped data pod, such as the data pods in the form of a shipping container. The data pods according to embodiments of the present disclosure can be fed from a modular pump house and electrical buildings, which are also incorporated into a small footprint.

In conjunction with the foregoing discussion of FIGS. 1-20, FIGS. 21A and 21B illustrate one embodiment of a method 4500 of cooling electronic equipment, e.g., servers 5511*a* . . . 511*n* and 533*a* . . . 533*n* illustrated in and described with respect to FIG. 3, using a first fluid, e.g., a liquid refrigerant R134a or similar refrigerant. The method starts at step 4501. In step 4502, the first fluid is free cooled by enabling heat transfer from the first fluid to a second fluid, e.g., that has been cooled using atmospheric air, as described with respect to FIG. 6, and mechanically cooling the second fluid to the extent that free cooling the first fluid is insufficient to cool the first fluid. The mechanical cooling of the second fluid is a function of the temperature of the second fluid.

In step 4506, the second fluid is cooled before using the second fluid to free cool the first fluid by enabling heat transfer from the second fluid to a third fluid. In step 4508, the third fluid is compressed via sub cooler compressor 4310 in the third circuit 4300 of FIG. 6. In step 4510, the compressed third fluid is condensed by enabling heat transfer from the compressed third fluid to the second fluid via the trim condenser 1200*b* after using the second fluid to free cool the first fluid. More particularly, the compressed third fluid is condensed by trim condenser 1200*b*.

In step 4512, the pressure of the condensed third fluid is reduced, e.g., via thermal expansion valve 4311, to reduce the temperature of the third fluid. In step 4514, the wet-bulb temperature of the atmospheric air is sensed. In step 4516, the speed of compressing the third fluid, e.g., via sub cooler compressor 4310, is varied as a function of the sensed wet-bulb temperature to vary the temperature of the second fluid.

In step 4518, the free-cooled first fluid is received in a fluid receiver, e.g., fluid receiver 4128. In step 4520, the liquid level of the first fluid contained in the fluid receiver 4128 is sensed, e.g., via liquid level controller 4127.

In step 4522, the first fluid is mechanically cooled to condense the first fluid when the sensed liquid level in the fluid receiver 4128 falls below a first predetermined level. The mechanical cooling of the first fluid may be performed by fluid circuit 4400 via sub cooler compressor 4410 causing a fourth fluid to flow through sub cooler coil 4129 of the refrigerant liquid receiver 4128 into subcooling condenser 1300*a*. In step 4524, the mechanical cooling is deactivated, e.g., by terminating operation of the sub cooler compressor 4410, when the sensed liquid level in liquid receiver 4128 reaches a second predetermined liquid level that is higher than the first predetermined liquid level.

In step 4526, the first fluid in the fluid receiver 4128 is cooled by enabling heat transfer from the first fluid in the fluid receiver 4128 to a fourth fluid. In step 4528, the fourth fluid is compressed, e.g., via sub cooler compressor 4410. In step 4530, the compressed fourth fluid is compressed by enabling heat transfer from the compressed fourth fluid to the second fluid that has been cooled using atmospheric air. In step 4532, the pressure of the condensed fourth fluid is reduced, e.g., via the fourth fluid exiting the sub cooler condenser 1300*a* to a thermal expansion valve 4420, which expands the fourth fluid back to the sub cooler coil 4129 to reduce the temperature of the fourth fluid.

The first fluid, the third fluid, and the fourth fluid may contain a refrigerant such as R134A and the second fluid contains water, e.g., condenser water, chilled water, or a glycol solution.

The method 4500 may also include sensing the temperature of the free-cooled first fluid in first cooling circuit 4100 and regulating the flow rate of the second fluid in second cooling circuit 4200 as a function of the temperature of the free-cooled first fluid, e.g., via the temperature sensor 4126 detecting the temperature of the first fluid when it exits from the main condenser 1300. The readings of the temperature sensor 4126 reflect the temperature of the main condenser 1300. The method 4500 ends at step 4534.

Figure 22A:
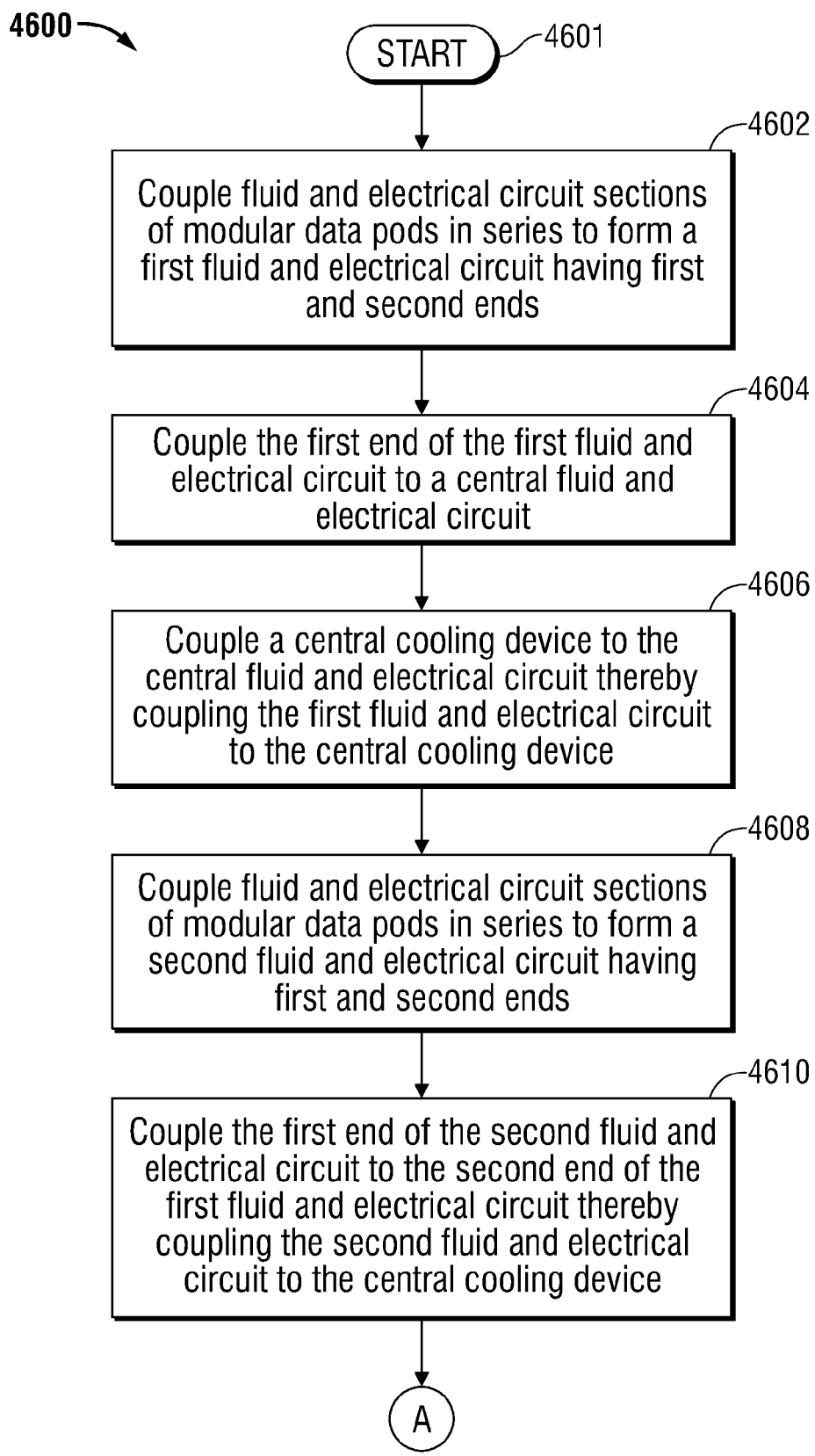
FIGS. 22A-22C are flow diagrams of a method of deploying modular data pods of a modular data center according to embodiments of the present disclosure.
Figure 22B:
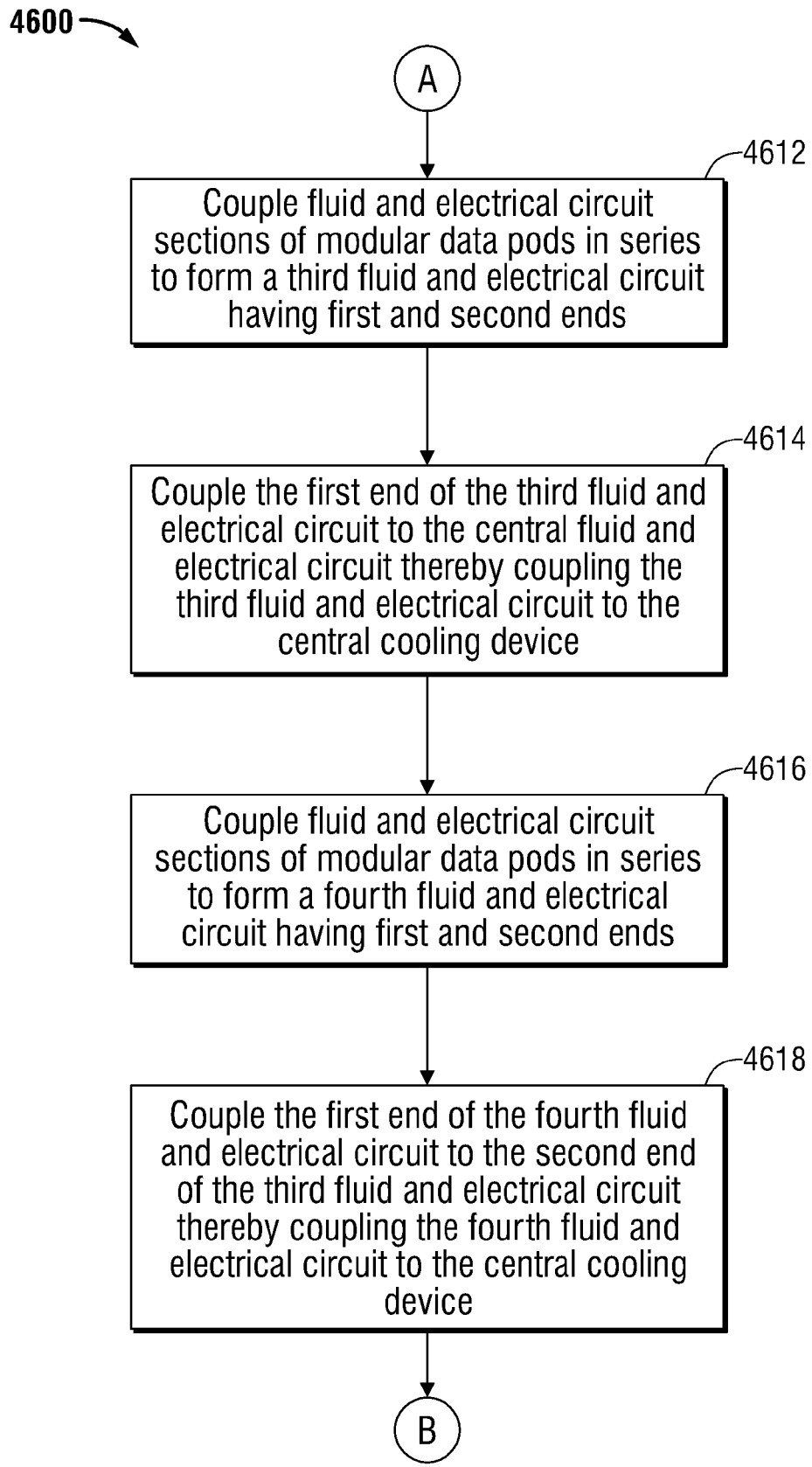
Figure 22C:
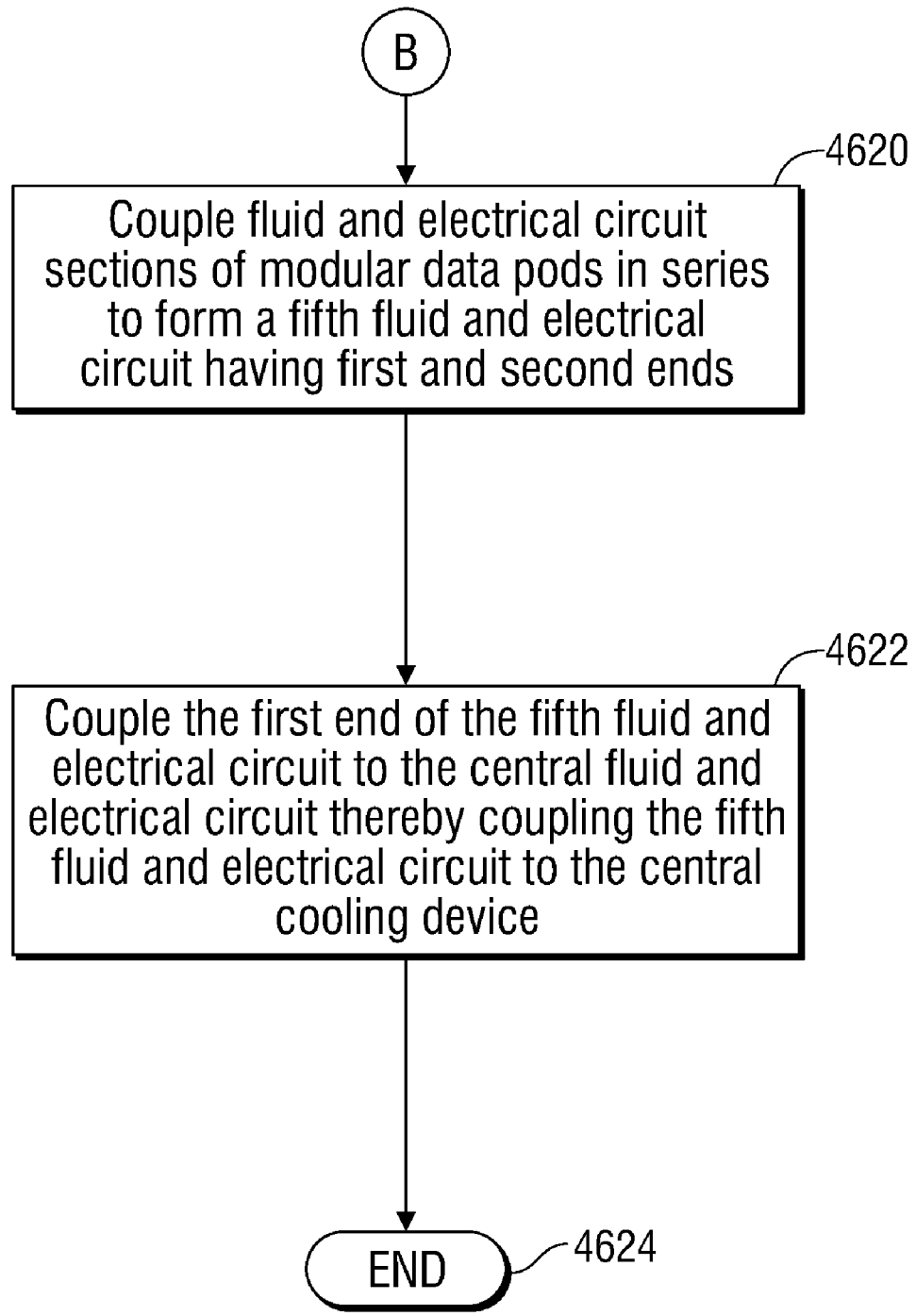

FIGS. 22A-22C illustrate a method 4600 of deploying modular data pods to form a data center according to one embodiment of the present disclosure. More particularly, in conjunction with FIGS. 1, 17, 17A, and 17B, method 4600 starts at step 4601. In step 4602, a first plurality 800-1 of fluid and electrical circuit sections 820 of a respective plurality of modular data pods, e.g. modular data pods 80 and 180, are coupled in series to form a first fluid and electrical circuit 17051 having a first end 820*a*1 and a second end 820*b*1. In step 4604, the first end 820*a*1 of the first fluid and electrical circuit 17051 is coupled to central fluid and electrical circuit 1430. In step 4606, a central cooling device, e.g., cooling towers CT-1A, CT-1B, CT-2A, or CT-2B, is coupled to central fluid and electrical circuit 1430 thereby coupling the first fluid and electrical circuit 17051 to the central cooling device, e.g., cooling towers CT-1A, CT-1B, CT-2A, or CT-2B, where the cooling device is configured to satisfy at least a portion of the cooling requirements of the plurality of modular data pods 80 and 180.

The first fluid and electrical circuit 17051 includes at least one fluid supply line and at least one fluid return line, e.g., fluid supply headers 2151*a*, 2152*a* and 2151*b*, 2152*b*, respectively, as shown for example in FIG. 7. As previously described with respect to FIG. 7, the fluid supply headers 2151*a*, 2152*a* and fluid return headers may be configured in a reverse-return configuration.

Referring again to FIGS. 22A-22B, in step 4608 a second plurality 800-2 of fluid and electrical circuit sections 820 of a respective plurality of modular data pods, e.g. modular data pods 80 and 180, are coupled in series to form a second fluid and electrical circuit 17052 having a first end 820*a*2 and a second end 820*b*2.

In step 4610 of FIG. 22A, the first end 820*a*2 of the second fluid and electrical circuit 17052 is coupled to the first end 820*b*1 of the first fluid and electrical circuit 17051 thereby coupling the second fluid and electrical circuit 17052 to the central cooling device, e.g., cooling towers CT-1A, CT-1B, CT-2A, or CT-2B.

In step 4612, a third plurality 800-3 of fluid and electrical circuit sections 820 of a respective plurality of modular data pods, e.g. modular data pods 80 and 180, are coupled in series to form a third fluid and electrical circuit 17071 having a first end 820*a*3 and a second end 820*b*3.

In step 4614, the first end 820*a*3 of the third fluid and electrical circuit 17071 is coupled to the central fluid and electrical circuit 1430 thereby coupling the third fluid and electrical circuit 17071 to the central cooling device, e.g., cooling towers CT-1A, CT-1B, CT-2A, or CT-2B, where the cooling device is configured to satisfy at least a portion of the cooling requirements of the plurality of modular data pods 80 and 180.

In step 4616, a fourth plurality 800-4 of fluid and electrical circuit sections 820 of a respective plurality of modular data pods, e.g. modular data pods 80 and 180, are coupled in series to form a fourth fluid and electrical circuit 17072 having a first end 820*a*4 and a second end 820*b*4.

In step 4618, the first end 820*a*4 of the fourth fluid and electrical circuit 17072 is coupled to the second end 820*b*3 of the third fluid and electrical circuit 17071 thereby coupling the fourth fluid and electrical circuit 17072 to the central cooling device, e.g., cooling towers CT-1A, CT-1B, CT-2A, or CT-2B, where the cooling device is configured to satisfy at least a portion of the cooling requirements of the plurality of modular data pods 80 and 180.

In step 4620, a fifth plurality 800-5 of fluid and electrical circuit sections 820 of a respective plurality of modular data pods, e.g., modular data pods 80 and 180, are coupled in series to form a fifth fluid and electrical circuit 17091 having a first end 820*a*5 and a second end 820*b*5.

In step 4622, the first end 820*a*5 of the fifth fluid and electrical circuit 17091 is coupled to central fluid and electrical circuit 1430 thereby coupling the fifth fluid and electrical circuit 17091 to the central cooling device, e.g., cooling towers CT-1A, CT-1B, CT-2A, or CT-2B, where the cooling device is configured to satisfy at least a portion of the cooling requirements of the plurality of modular data pods 80 and 180.

The central cooling device is a first central cooling device, e.g. cooling tower CT-1A, CT-1B, CT-2A, CT-2B, as illustrated in FIGS. 14, 15, and 17. If one of the cooling towers CT-1A, CT-1B, CT-2A, CT-2B cannot satisfy at least a portion of the cooling requirements of the second plurality of modular data pods 80, the method 4600 includes coupling a second central cooling device CT-1A, CT-1B, CT-2A, CT-2B to the central fluid and electrical circuit.

Each modular data pod of the plurality of modular data pods 80 includes a data enclosure, e.g. data enclosure 108 of modular data pod 80 in FIG. 2D, and an auxiliary enclosure, e.g., auxiliary enclosure 818 in FIG. 2D, containing a respective shared fluid and electrical circuit section 820. The shared fluid and electrical circuit sections 820 are coupled together to define fluid and electrical circuit chains 1705, 1707, or 1709 forming a linear path, e.g., chains 122, 124, 126 in FIG. 17. The method 4600 further includes coupling the data enclosures 85 to the auxiliary enclosures 818 on alternating sides of the shared fluid and electrical circuit 1705, 1707, or 1709, as illustrated in FIG. 17. The method ends at step 4624.

Figure 22D:
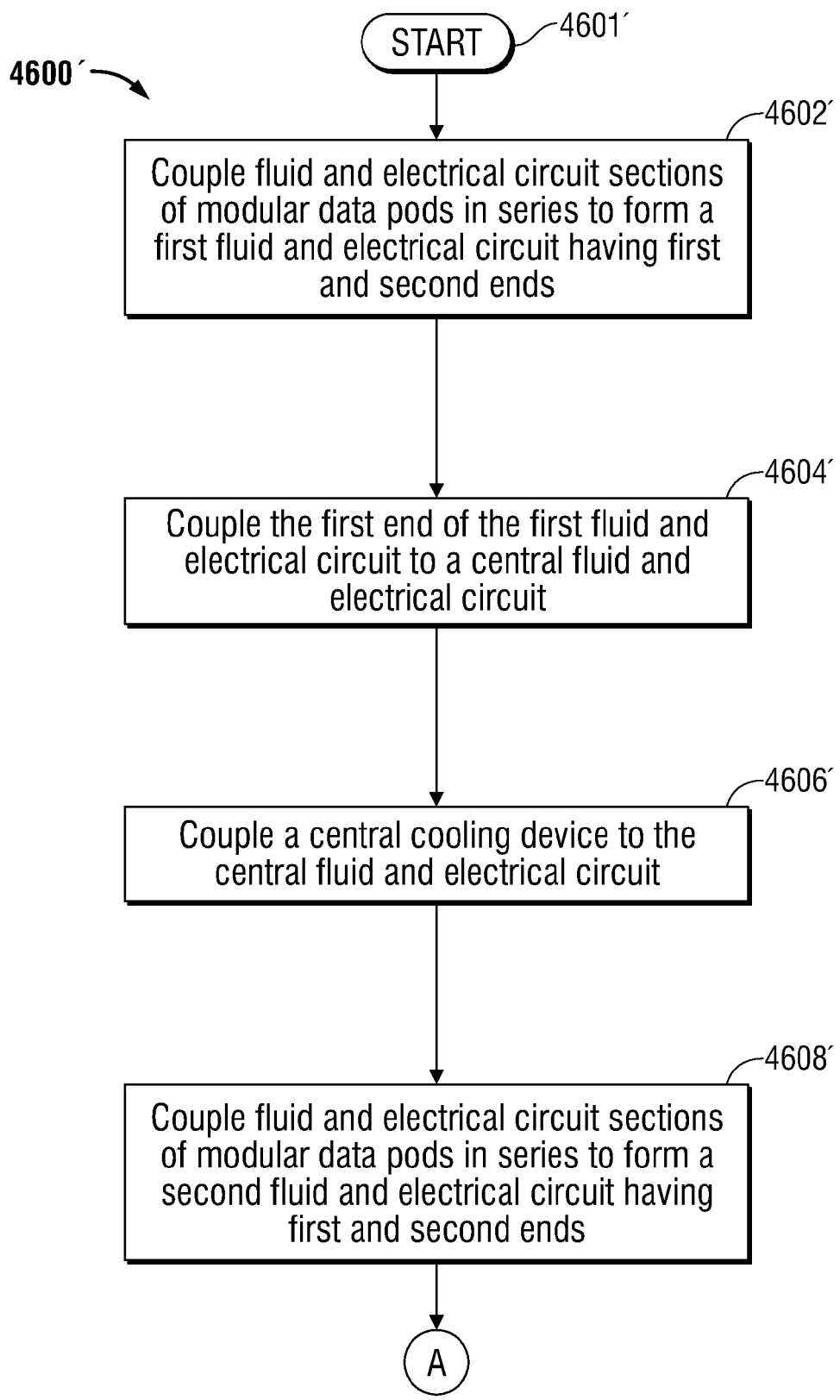
FIGS. 22D-22E are flow diagrams of an alternative to the method of deploying modular data pods of a modular data center of FIGS. 22A-22B according to embodiments of the present disclosure.
Figure 22E:
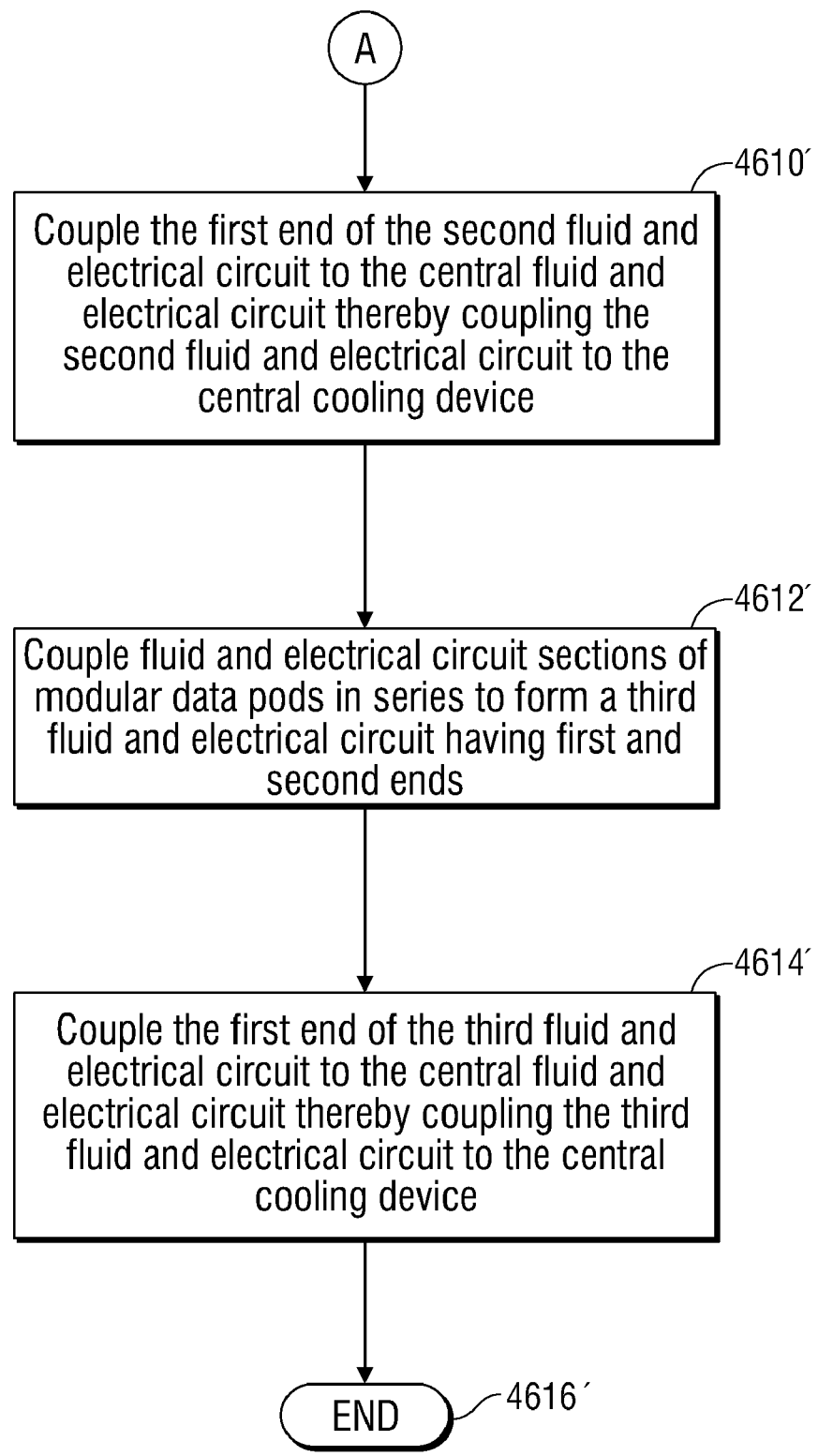

FIGS. 22D-22E illustrate an alternate embodiment of the method 4600 of deploying modular data pods to form a data center according to one embodiment of the present disclosure. More particularly, in conjunction with FIGS. 1, 17, 17A, and 17B, method 4600' starts at step 4601'. In step 4602', a first plurality 800-1 of fluid and electrical circuit sections 820 of a respective plurality of modular data pods, e.g., modular data pods 80 and 180, are coupled in series to form a first fluid and electrical circuit 17051 having a first end 820*a*1 and a second end 820*b*1. In step 4604', the first end 820*a*1 of the first fluid and electrical circuit 17051 is coupled to a central fluid and electrical circuit 1430. In step 4606', a central cooling device, e.g., cooling towers CT-1A, CT-1B, CT-2A, or CT-2B, is coupled to the central fluid and electrical circuit 1430 thereby coupling the first fluid and electrical circuit 17051 to the central cooling device, e.g., cooling towers CT-1A, CT-1B, CT-2A, or CT-2B, where the cooling device is configured to satisfy at least a portion of the cooling requirements of the plurality of modular data pods 80 and 180.

The first fluid and electrical circuit 17051 includes at least one fluid supply line and at least one fluid return line, e.g., fluid supply headers 2151*a*, 2152*a* and 2151*b*, 2152*b*, respectively, as shown for example in FIG. 7. As previously described with respect to FIG. 7, the fluid supply headers 2151*a*, 2152*a* and fluid return headers may be configured in a reverse-return configuration.

In step 4608', a second plurality 800-3 of fluid and electrical circuit sections 820 of a respective plurality of modular data pods, e.g., modular data pods 80 and 180, are coupled in series to form a second fluid and electrical circuit 17071 having a first end 820*a*3 and a second end 820*b*3.

In step 4610', the first end 820*a*3 of the second fluid and electrical circuit 17071 is coupled to the central fluid and electrical circuit 1430 thereby coupling the second fluid and electrical circuit 17071 to the central cooling device, e.g., cooling towers CT-1A, CT-1B, CT-2A, or CT-2B, where the cooling device is configured to satisfy at least a portion of the cooling requirements of the plurality of modular data pods 80 and 180.

In step 4612', a third plurality 800-5 of fluid and electrical circuit sections 820 of a respective plurality of modular data pods, e.g., modular data pods 80 and 180, are coupled in series to form a third fluid and electrical circuit 17091 having a first end 820*a*5 and a second end 820*b*5.

In step 4614', the first end 820*a*5 of the third fluid and electrical circuit 17091 is coupled to the central fluid and electrical circuit 1430 thereby coupling the third fluid and electrical circuit 17091 to the central cooling device, e.g., cooling towers CT-1A, CT-1B, CT-2A, or CT-2B, where the cooling device is configured to satisfy at least a portion of the cooling requirements of the plurality of modular data pods 80 and 180. Finally, the method 4600' ends in step 4616'.

The modular data pods of the present disclosure may be designed to use higher cooling temperatures than standard comfort cooling temperatures (e.g., above 75° F. at the inlet to the pod). The pods can use cold water (e.g., deionized water), refrigerant, a hybrid of cold water and refrigerant, or cold air to maintain the cooling temperature at a higher level than typical comfort cooling temperatures. The temperature of the cooling air (or other cooling fluid) may be maintained safely above the dew point temperature within the modular data pod envelop to protect against condensation.

The modular data pods may include one or more humidifiers and an associated controller to maintain the humidity of the air internal to the modular data pod at a desired level. The one or more humidifiers may be housed in an adjacent pump chamber so as to separate the water management system (e.g., leak control) from the other systems associated with the modular data pod. The pods may also control the humidity of the internal air using a combination of humidifiers or other methods that use water or steam.

A data center including multiple modular data pods can be deployed with less base infrastructure than a typical stick-built data center. This saves upfront costs for sites that are not intended to have a high data load in early deployment phases. The systems are scalable and require far less infrastructure for the initial deployment.

Most of the components on the electrical, mechanical, and IT infrastructure systems can be integrated into prefabricated support structures, which significantly reduce the amount of time and money it takes to deploy a data pod system in the field.

The designs of the cooling systems and the modular data pods provide the flexibility to adjust to the tier-specific needs of an intended data center project. Large deployment systems such as warehouse hives and farm hives are designed to have expandable features that allow the system to expand in tier capability should it become necessary to do so over time. The methodology to increase the system tier capability over time is referred to as shared hives. The basic system design includes valve components and emergency control strategies that enable the system to be fed from cooling sources in adjacent hives. This hive interlocking feature enables modular data pods to be fed from supplemental cooling sources if necessary.

The cooling process (cycle) provided by cooling system 10 enables close tolerances in approach temperatures between atmospheric conditions (wet-bulb temperature) and the entering air temperatures to IT rack cooling. The cycle is designed to utilize environmental conditions (low wet-bulb temperatures) to fully handle rack cooling load when environmental conditions permit. It also includes a back up system of subcooling processes that enable the system to handle the cooling loads in spite of spikes in wet-bulb temperatures. This is accomplished by optimizing to the specific heat characteristics of the cooling media (R134a) or other refrigerants.

The indirect cooling cycle provided by the cooling system 10 is capable of maintaining IT rack inlet temperature utilizing a sub-cooler system that can be sized to less than about 15% of what would normally be required for either DX or chiller capacity.

The modular data pod is designed to be added to or removed from a data pod hive or a data pod chain. In particular, each modular data pod is designed to include system components that allow the modular data pod to be added to the hive. The HVAC pipe and electrical conduits described above are included in each modular data pod to form a link between existing, new, and future modular data pods on the modular data pod chain.

The pipe chase of each modular data pod includes dual reverse-return pipe circuits. These circuits are intended to continue the reverse return capabilities of the system as each new modular data pod is deployed on a modular data pod chain. This feature enables the addition or removal of pods without shutdowns or costly water system balancing problems. Alternatively, the modular pods may include direct feed mains (versus reverse-return mains) or single, non-redundant mains. These pods can be used on Tier 1 type facilities where self balancing, reliability, and redundancy issues are less critical.

Each fluid or pipe circuit is fitted with valves and appurtenances needed to deploy the pipe circuit, fill the pipe circuit with site-specific operating fluid, and commission the pipe circuit. The system may incorporate a strict process that allows the reverse-return circuits to be continued or extended. The process includes filling, venting (burping), and hydrostatically testing the circuit before the modular data pod is introduced to the system of modular data pods. This process duplicates the hydrostatic or pneumatic fitness testing that is done in the factory to ensure that the pipe circuit is not compromised in transit or during deployment. This allows a modular data pod to be added seamlessly to a data pod system without affecting the operation of adjacent modular data pods, or causing costly unintended shutdowns.

The end unit on each pod chain includes a bypass tee arrangement on each of the two reverse-return circuits. This enables future expansion of pods to the data pod chain without shutting down the previous data pods on a data pod chain.

Each data pod chain in a data pod hive is designed to include integral but fully-detachable dual pipe, electrical, and IT system infrastructure located, for example, in the lower section of the modular data pod. This mechanical/electrical chase section is designed to be isolated from the main data pod envelop. The rear section or auxiliary enclosure is detachable from the main pod assembly to enable the data envelop or enclosure to be removed. The modular data pod may be periodically removed to an off-site location to restack the computer servers or to maintain or upgrade the mechanical, electrical, or control systems of the modular data pod. The pipes and conduits may include attachment mechanisms (e.g., flange or break-away bolts or wiring harness plugs) to facilitate easy detachment and re-attachment of the pipes and conduits to the modular data pod assembly. The pipe and conduit chase may include walls, membranes, and sealants to provide a water-tight seal between the chase and the modular data pod envelop.

When modular data pods 80 are installed in outdoor environments, the pipe circuits of each modular data pod 80 may include heat tracing, insulation, and insulation protection. Each modular data pod may have its own heat tracing panel that is fully integrated with the BMS, which may provide alarm and status information.

Each pod may include leak containment pans below each coil bank. The pans may include leak detectors that are linked to the BMS. The BMS may trigger an alarm or otherwise notify an operator when a leak or other abnormal condition (e.g., high humidity within the modular data center envelop) is detected.

Each pod may be fitted with leak detection sensors that can be deployed at strategic points within the modular data center envelop, the pump, the heat exchanger chamber, and the detachable pipe/electrical chamber. The leak detection system may be fully integrated with the BMS, which can provide alarm and status information.

The modular data pods are designed to handle high density server equipment, such as fully redundant 40 kW server racks. The modular data pod design is scalable to accommodate increased power output per cubic foot of server equipment as a result of advances in server technology. Scaling the modular data pod design may require refitting the heat exchanger and pumping equipment and the power distribution to the server racks. The extent of any modifications made to scale the modular data pod design may depend on the amount of increase in power output.

The modular data pod cooling mains may be steel pipe, Polyvinyl chloride (PVC) pipe, stainless steel pipe, copper pipe, fiberglass pipe, reinforced concrete pipe (RCP), or other types of pipe. The type, gauge, strength, and thickness of the pipe depend on the requirements of a particular data pod system.

The modular data pods may be either mass produced or individually custom made to meet given specifications.

The modular approach, which involves building and deploying modular data pods and modular pumping and electrical equipment, is a cost-effective way to build data centers. For example, the modular approach significantly reduces field labor costs and risks because field labor is only needed to install and deploy the modular data pods and the modular pumping and electrical equipment.

Energy costs can be reduced by installing modular data pods according to the present disclosure in a warehouse or similar facility. This is because the space within each modular data pod envelop is the only space within the warehouse that requires conditioning. The warehouse space outside each modular data pod requires minimum ventilation. This is significant because the modular data pods are designed to save space by their small physical foot print. Thus, the warehouse or similar facility can be smaller.

A typical data center requires a minimum foot print to treat the air in the hot and cold aisles defined by server rack assemblies that are spread out across a data center floor. For example, a 10,000 square foot data center may house approximately 200-220 server racks. Each rack may have the ability to generate on average between 6 and 12 kW. Some racks can generate higher outputs, e.g., 16-24 kW. In contrast, the modular data pod according to some embodiments of the present disclosure can attain high enough levels of heat rejection to cool eight server racks consuming over 40 kW in a relatively small physical footprint.

The tight circular configuration of server racks in embodiments of the modular data pod results in reduced energy costs because less energy is needed to cool the relatively small air space within the modular data pod. Also, because of the tight configuration of server racks and aisle containment, the modular data pod needs less fan horse power for airflow pattern control.

The modular data pods can be fed from modular pumping pods that get fluid from cooling towers, fluid coolers, chillers, geothermal systems, or existing building or plant water systems.

The geometric shape of the modular data pod container in conjunction with the circular configuration of the server racks provides efficient use of space and creates natural hot aisle/cold aisle containment and natural "chimney effect" for hot air pattern control.

An additional benefit of the all inclusive modular design allows for a greater amount of security and compartmentalization for deployment in "cooperative"-type data warehouses and suites. The modular box creates segregation from other IT server racks within the cooperative. The boxes can be locked and easily monitored for security purposes.

The tight, circular configuration of server racks within the modular data pod facilitates much tighter groupings of interrelated servers and IT equipment, e.g., parent/child, master/slave, and redundant servers. This tight configuration allows for shorter fiber and cable runs between IT interdependent components.

The tight packing of the actual modular data pods into a hive allows for shorter cabling and fiber run lengths than would be needed in a normal data floor build out. The hive structure can be purposefully patterned to allow interdependent IT systems to be efficiently grouped in deployment. These interdependent groupings may reduce cabling and fiber lengths. These reductions not only reduce labor and material costs, but also reduce operating costs because of shorter data cable runs.

The modular data pods may include real-time data monitoring servers capable of producing real-time monitoring of critical IT loading, IT status, cooling, and power system performance. The modular data pods may also include external touch pad system status and monitoring display panels.

The modular data pods can also be scaled down in physical sizes for low rack density applications. Smaller applications can utilize pentagon, hexagon, or other polygonal shapes that are more beneficial in smaller modular data pods.

Embodiments of the modular data pod design, either taken individually or in a system, provides a cost benefit over typical data centers that are stick built. The cost of a partial or full-system deployment of modular data pods may be at least 30% less than stick-built or site-built data centers.

The deployment of modular data pods needs far less on-site man hours for construction. This significantly reduces the overall schedule for a data center project, especially data center projects in remote locations.

The pipe, IT fiber conduits, and electrical chase containment area is fully detachable from the main data pod assembly. The chase can be fitted with leak detection and leak control measures that isolate the water systems transport lines from the actual IT data pod envelop. There is no "mixed space" use of data areas and cooling water. The modular data pods may include either refrigerant loops or deionized water applications. No external cooling water (other than deionized non-conductive water if water application is used) enters the actual data pod envelop.

The modular data pods can be coupled to cooling systems that use innovative control strategies to attain high efficiencies. The cooling system can use innovative control strategies that allow it to operate at extremely high efficiencies for data center power use standards. The system may use control strategies that allow it to operate at 1.1 PUE levels for areas or zones that have beneficial wet-bulb conditions.

For environments that experience unfavorable wet-bulb conditions, the cooling systems can include a chiller to assist the water-cooled cooling system when the wet-bulb conditions deteriorate to the point where the system load can no longer be handled by atmospheric conditions.

The data pods may be fed electrical power via home-run conduits, cable-bus duct, or standard-bus duct, at either low or medium voltage. The electrical infrastructure may be built into each pod and have the ability to be expandable and adaptable if it or an adjacent pod is added to or removed from a pod chain.

Each modular data pod may include its own uninterruptible power supply (UPS) or the ability to connect to a UPS main system, e.g., for large deployment applications. The pods may be fed with dual redundant UPSs, such as the rotary style or the static type UPSs. The pods may also be configured to receive transformers and chargers. The transformers, UPS, one or more batteries, and distribution panels may be housed in compartments external to the actual data pod envelop.

As described above, the base of the pod can be fitted with one or more back-up batteries for emergency power. The pods can also be fitted with an interior ring-type electrical bus carrier similar to a plug in an electric bus. Each pod can have a charger capable of recharging the one or more batteries. The one or more back-up batteries may be charged via alternative or green energy feeds. The interstitial space between racks may be used to incorporate the power and data patch plug points for each computer rack.

The pod electrical connectors between the main bus feed and the modular data pod envelop may be removable and allow the pods to be disconnected from the main bus feed to allow removal and redeployment of pod envelops. Each modular data pod may incorporate DC diode decoupling capabilities.

The pods will have the ability to be illuminated on the exterior with color-coded light (e.g., a LED or fiber optic light). The color and intensity of the light may depend on the type and density of the operating load.

The pod electrical systems can be adaptable depending on the specific tier requirements for a given data center project, e.g., Tiers 1-4.

The battery circuiting can be modified to include adjacent pod battery backup capabilities should it be required for a specific project.

The pods may feature custom removable computer racks. The computer racks may be designed to be adaptable so as to be capable of handling both small and large server support loading. The computer racks will also have features to allow the servers to be tilted to provide a hot air pattern at the back of the computer rack (e.g., server rack) that is an upward flow pattern. The computer racks may handle servers that have rear and side-blow airflow patterns.

The modular data pods may include water and British Thermal Unit (BTU) meters for operating, monitoring, and controlling the cooling system. The modular data pods may include a control system and all of the necessary control panels and components to control, monitor, and optimize the modular data pod and associated systems.

The modular data pods may be capable of tying into the smart grid system and use cloud computing technology for load shedding and redirection of processing information to alternative pods and off-site data collection sites.

The modular data pods can be sealed or unsealed. Sealed pods may include or be coupled to equipment that creates a vacuum within the pod or changes the composition of the air within the pod (e.g., removal of oxygen) to increase heat transfer and suppress fire.

While several embodiments of the disclosure have been shown in the drawings and/or described in the specification, it is not intended that the disclosure be limited to these embodiments. It is intended that the disclosure be as broad in scope as the art will allow and that the specification be read likewise. Therefore, the above description should not be construed as limiting, but merely as exemplifications of particular embodiments. Those skilled in the art will envision other modifications within the scope and spirit of the claims set forth below.

What is claimed is:

1. A modular data center, comprising:
   a first cooling circuit including a primary cooling device;
   a plurality of modular data pods, each modular data pod comprising:
     a plurality of servers;
     a heat exchange member coupled to the first cooling circuit; and
     a second cooling circuit coupled to the heat exchange member and configured to cool the plurality of servers, the second cooling circuit including a secondary cooling device configured to cool fluid flowing through the second cooling circuit.

2. The modular data center according to claim 1, wherein each modular data pod further comprises primary cooling coils in thermal communication with the plurality of servers.

3. The modular data center according to claim 1, wherein the secondary cooling device is a mechanical cooling device configured to operate when the wet bulb temperature of the atmosphere associated with the modular data center exceeds a predetermined wet bulb temperature.

4. The modular data center according to claim 3, wherein the mechanical cooling device includes a compression device configured to compress fluid flowing through the second cooling circuit.

5. The modular data center according to claim 1, wherein the fluid flowing through the first cooling circuit is a glycol solution or water and wherein the fluid flowing through the second cooling circuit is a refrigerant.

6. The modular data center according to claim 1, wherein each modular data pod further comprises:
   a second heat exchange member coupled to the first cooling circuit; and
   a third cooling circuit coupled to the second heat exchange member and configured to cool the plurality of servers, the third cooling circuit including a second secondary cooling device configured to cool fluid flowing through the third cooling circuit.

7. The modular data center according to claim 6, wherein each modular data pod further comprises secondary cooling coils in thermal communication with the plurality of computer racks.

8. The modular data center according to claim 1, wherein the primary cooling device is a free cooling device.

9. The modular data center according to claim 8, wherein the free cooling device includes a fluid cooler or a cooling tower.

10. The modular data center according to claim 1, further comprising a third cooling circuit coupled to the second cooling circuit, the third cooling circuit including a cooling fluid source and an expansion tank.

11. The modular data center according to claim 1, wherein the heat exchange member is a condenser.

12. The modular data center according to claim 1, wherein the first cooling circuit includes two supply lines and two return lines in a reverse-return configuration.

13. A cooling system for a modular data center, comprising:
   a first cooling circuit including a primary cooling device;
   a plurality of modular data pods, each modular data pod comprising:
     an enclosure including a plurality of server racks;
     a heat exchange member coupled to the first cooling circuit; and
     a second cooling circuit coupled to the heat exchange member and configured to cool the enclosure, the second cooling circuit including a secondary cooling device configured to cool fluid flowing through the second cooling circuit.

14. The cooling system according to claim 13, wherein the secondary cooling device is configured to cool a portion of a heat load within the enclosure that the primary cooling device cannot cool.

15. The cooling system according to claim 13, wherein the secondary cooling device is configured to cool the portion of the heat load within the enclosure as a function of the atmospheric conditions.

16. The cooling system according to claim 13, wherein the first and second cooling circuits are independent cooling circuits.

17. A modular data center, comprising:
a central cooling system;
a plurality of modular data pods, each modular data pod comprising:
a plurality of servers;
a heat exchange assembly coupled to the central cooling system, the heat exchange assembly configured to cool the plurality of servers; and
a distributed cooling system coupled to the heat exchange assembly.

18. The modular data center according to claim 17, wherein the central cooling system is a free-cooling system and the distributed cooling system is a mechanical cooling system.

19. The modular data center according to claim 18, wherein the distributed cooling system is configured to cool a portion of a heat load of the modular data pod that exceeds the cooling capacity of the free-cooling system.

20. The modular data center according to claim 17, wherein the heat exchange assembly includes a heat exchange member and a cooling circuit in thermal communication with the heat exchange member, the cooling circuit further in thermal communication with the plurality of servers.

* * * * *